United States Patent
Zheng

(10) Patent No.: US 9,577,198 B1
(45) Date of Patent: Feb. 21, 2017

(54) 2,6-BIS(DIARYLAMINOPHENYL)BENZENE AND DERIVATIVES THEREOF AS HOLE-TRANSPORT COMPOUNDS IN ORGANIC LIGHT-EMITTING DEVICES

(71) Applicant: Nitto Denko Corporation, Osaka (JP)

(72) Inventor: Shijun Zheng, San Diego, CA (US)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/449,442

(22) Filed: Aug. 1, 2014

Related U.S. Application Data

(60) Provisional application No. 61/861,135, filed on Aug. 1, 2013.

(51) Int. Cl.
  *H01L 51/00* (2006.01)
  *C07C 211/00* (2006.01)
  *H01L 51/50* (2006.01)

(52) U.S. Cl.
  CPC ......... *H01L 51/0058* (2013.01); *H01L 51/006* (2013.01); *H01L 51/0059* (2013.01); *H01L 51/5056* (2013.01)

(58) Field of Classification Search
  None
  See application file for complete search history.

(56) References Cited

U.S. PATENT DOCUMENTS 7,629,060 B2   12/2009   Oshiyama et al.

FOREIGN PATENT DOCUMENTS

| JP | 05117211 | * | 5/1993 | ........... C07C 211/54 |
| JP | 05117211 A | | 5/1993 | |
| JP | 05117213 | | 5/1993 | |
| JP | 2003048868 | | 2/2003 | |
| WO | WO-2006120859 | * | 11/2006 | ........... C07C 211/54 |

OTHER PUBLICATIONS

Moorthy, Jarugu Narasimha et al, Nondoped Pure-Blue OLEDs Based on Amorphous Phenylenevinylene-Functionalized Twisted Bimesitylenes, Journal of Organic Chemistry (2010), 75(8), 2599-2609.

Moorthy, Jarugu Narasimha et al, Blue Light-Emitting and Hole-transporting Amorphous Molecular Materials Based on Diarylaminobiphenyl-Functionalized Bimesitylenes, Chemical Communications (Cambridge, United Kingdom) (2008), (18), 2146-2148.

* cited by examiner

*Primary Examiner* — Clinton Brooks
(74) *Attorney, Agent, or Firm* — K&L Gates LLP; Brent A. Johnson; Louis C. Cullman

(57) ABSTRACT

Compounds according to Formulas 1-33 may be useful in electronic devices such as light-emitting devices. For example, they may be used as hole-transport materials.

24 Claims, 1 Drawing Sheet

| CATHODE 35 |
|:---:|
| ELECTRON-TRANSPORT 30 |
| EMISSIVE 20 |
| HOLE-TRANSPORT 15 |
| ANODE 5 |

# 2,6-BIS(DIARYLAMINOPHENYL)BENZENE AND DERIVATIVES THEREOF AS HOLE-TRANSPORT COMPOUNDS IN ORGANIC LIGHT-EMITTING DEVICES

BACKGROUND

Organic light-emitting devices (OLEDs) have been widely developed for flat panel display, and solid state lighting (SSL) applications. Hole-transport materials may be useful to improve the properties of OLEDs such as device efficiency. Given potential commercial importance of these devices, improved materials such as hole-transport materials is desirable.

SUMMARY

Some embodiments relate to materials for organic light-emitting devices, such as novel compounds for use as hole-transport materials.

Some embodiments include a compound represented by Formula 1:

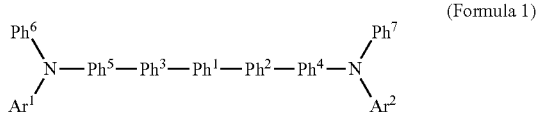

(Formula 1)

wherein $Ph^1$ is optionally substituted m-phenylene; $Ph^2$ and $Ph^1$ are independently optionally substituted p-phenylene; $Ph^4$ and $Ph^5$ are independently a bond or optionally substituted p-phenylene; $Ph^6$ and $Ph^7$ are independently optionally substituted phenyl or optionally substituted biphenyl; and $Ar^1$ and $Ar^2$ are independently optionally substituted phenyl, optionally substituted biphenyl, or optionally substituted naphthalenyl.

Some embodiments include a compound represented by Formula 2:

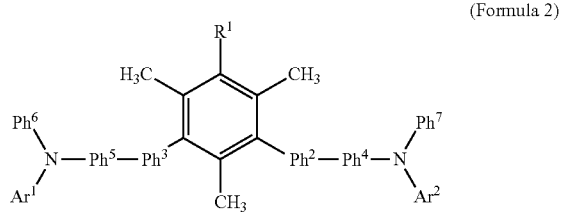

(Formula 2)

wherein $R^1$ may be H or any substituent; $Ph^2$ and $Ph^1$ may independently be p-phenylene optionally substituted with 1, 2, or 3 substituents; $Ph^4$ and $Ph^5$ may independently be a bond or p-phenylene optionally substituted with 1, 2, or 3 substituents; $Ph^6$ and $Ph^7$ may independently be phenyl optionally substituted with 1, 2, 3, or 4 substituents, or biphenyl optionally substituted with 1, 2, 3, 4, 5, or 6 substituents; and $Ar^1$ and $Ar^2$ may independently be phenyl optionally substituted with 1, 2, 3, or 4 substituents, biphenyl optionally substituted with 1, 2, 3, 4, 5, or 6 substituents, or naphthalenyl optionally substituted with 1, 2, 3, 4, or 5 substituents; wherein the substituents of p-phenylene, phenyl, biphenyl, or naphthalenyl may be independently selected from $C_{1-6}$ alkyl and $C_{1-6}$ alkoxy. In some embodiments $R^1$ may be H, $C_{1-6}$ alkyl, or $C_{1-6}$ alkoxy.

Some embodiments include a light-emitting device comprising any compound of any of Formulas 1-33.

These and other embodiments are described in greater detail herein.

BRIEF DESCRIPTION OF THE DRAWINGS

FIG. 1 is a schematic drawing of some embodiments of an OLED device comprising a compound of any of Formulas 1-33.

DETAILED DESCRIPTION

Some hole-transport materials in OLED devices may have problems with low triplet energy, a high charge injection barrier and low stability. A new series of hole-transport materials has been developed. Any compounds of any of Formulas 1-33 may be examples of these materials. These new materials may have high hole-transport mobilities, high triplet energies, low charge injection barriers, and high stabilities.

Unless otherwise indicated, when a compound or chemical structural feature such as aryl is referred to as being "optionally substituted," it includes a feature that has no substituents (i.e. be unsubstituted), or a feature that is "substituted," meaning that the feature has one or more substituents. The term "substituent" has the ordinary meaning known to one of ordinary skill in the art. In some embodiments, the substituent may be an ordinary organic moiety known in the art, which may have a molecular weight (e.g. the sum of the atomic masses of the atoms of the substituent) of 15 g/mol to 50 g/mol, 15 g/mol to 100 g/mol, 15 g/mol to 150 g/mol, 15 g/mol to 200 g/mol, 15 g/mol to 300 g/mol, or 15 g/mol to 500 g/mol. In some embodiments, the substituent comprises: 0-30, 0-20, 0-10, or 0-5 carbon atoms; and 0-30, 0-20, 0-10, or 0-5 heteroatoms independently selected from: N, O, S, Si, F, Cl, Br, or I; provided that the substituent comprises at least one atom selected from: C, N, O, S, Si, F, Cl, Br, or I. Examples of substituents include, but are not limited to, alkyl, alkenyl, alkynyl, heteroalkyl, heteroalkenyl, heteroalkynyl, aryl, heteroaryl, hydroxy, alkoxy, aryloxy, acyl, acyloxy, alkylcarboxylate, thiol, alkylthio, cyano, halo, thiocarbonyl, O-carbamyl, N-carbamyl, O-thiocarbamyl, N-thiocarbamyl, C-amido, N-amido, S-sulfonamido, N-sulfonamido, isocyanato, thiocyanato, isothiocyanato, nitro, silyl, sulfenyl, sulfinyl, sulfonyl, haloalkyl, haloalkoxyl, trihalomethanesulfonyl, trihalomethanesulfonamido, amino, etc.

The term "aryl" refers to the broadest meaning generally understood in the art, and may include an aromatic ring or aromatic ring system such as phenyl, naphthyl, etc. The term "heteroaryl" also has the meaning understood by a person of ordinary skill in the art, and in some embodiments, may refer to an "aryl" which has one or more heteroatoms in the ring or ring system. Examples of "heteroaryl" may include, but are not limited to, pyridinyl, furyl, thienyl, oxazolyl, thiazolyl, imidazolyl, indolyl, quinolinyl, benzofuranyl, benzothienyl, benzooxazolyl, benzothiazolyl, benzoimidazolyl, etc.

In some embodiments, the phenyl may have 0, 1, 2, 3, or 4 substituents independently selected from: R', —OR', —COR', —CO$_2$R', —OCOR', —NR'COR", CONR'R", —NR'R", F; Cl; Br; I; nitro; CN, etc., wherein R' and R" are independently H, optionally substituted phenyl, or $C_{1-6}$ alkyl, such as methyl, ethyl, propyl isomers, cyclopropyl, butyl isomers, cyclobutyl isomers (such as cyclobutyl, methylcyclopropyl, etc.), pentyl isomers, cyclopentyl isomers, hexyl isomers, cyclohexyl isomers, etc.

For convenience, the term "molecular weight" is used with respect to a moiety or part of a molecule to indicate the sum of the atomic masses of the atoms in the moiety or part of a molecule, even though it may not be a complete molecule.

The structures associated with some of the chemical names referred to herein are depicted below. These structures may be unsubstituted, as shown below, or a substituent may independently be in any position normally occupied by a hydrogen atom when the structure is unsubstituted. Unless a point of attachment is indicated by —|, attachment may occur at any position normally occupied by a hydrogen atom.

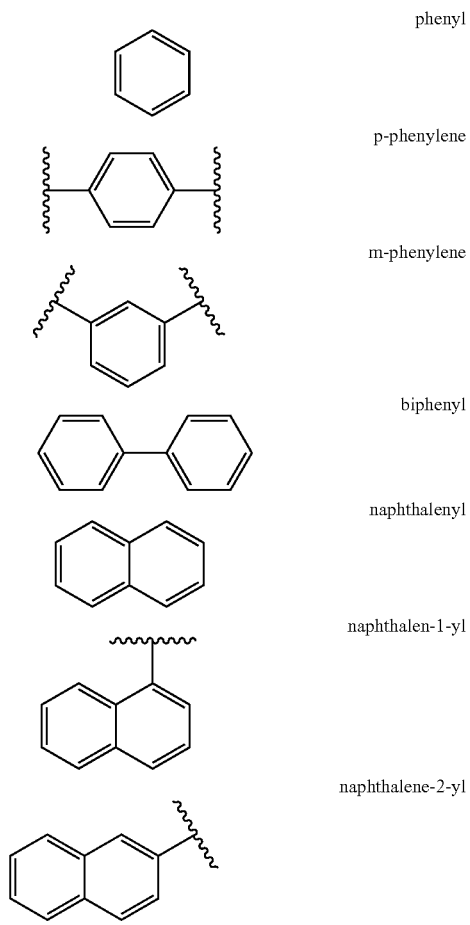

phenyl p-phenylene m-phenylene biphenyl naphthalenyl naphthalen-1-yl naphthalene-2-yl As used herein the term "alkyl" has the broadest meaning generally understood in the art, and may include a moiety composed of carbon and hydrogen containing no double or triple bonds. Alkyl may be linear alkyl, branched alkyl, cycloalkyl, or a combination thereof, and in some embodiments, may contain from one to thirty-five carbon atoms. In some embodiments, alkyl may include $C_{1-10}$ linear alkyl, such as methyl (—$CH_3$), ethyl (—$CH_2CH_3$), n-propyl (—$CH_2CH_2CH_3$), n-butyl (—$CH_2CH_2CH_2CH_3$), n-pentyl (—$CH_2CH_2CH_2CH_2CH_3$), n-hexyl (—$CH_2CH_2CH_2CH_2CH_2CH_3$), etc.; $C_{3-10}$ branched alkyl, such as $C_3H_7$ (e.g. iso-propyl), $C_4H_9$ (e.g. branched butyl isomers), $C_5H_{11}$ (e.g. branched pentyl isomers), $C_6H_{13}$ (e.g. branched hexyl isomers), $C_7H_{15}$ (e.g. branched heptyl isomers), etc.; $C_{3-10}$ cycloalkyl, such as $C_3H_5$ (e.g. cyclopropyl), $C_4H_7$ (e.g. cyclobutyl isomers such as cyclobutyl, methylcyclopropyl, etc.), $C_5H_9$ (e.g. cyclopentyl isomers such as cyclopentyl, methylcyclobutyl, dimethylcyclopropyl, etc.) $C_6H_{11}$ (e.g. cyclohexyl isomers), $C_7H_{13}$ (e.g. cycloheptyl isomers), etc.; and the like.

As used herein, the term "alkoxy" includes —O-alkyl, such as —$OCH_3$, —$OC_2H_5$, —$OC_3H_7$ (e.g. propoxy isomers such as isopropoxy, n-propoxy, etc.), —$OC_4H_9$ (e.g. butyoxy isomers), —$OC_5H_{11}$ (e.g. pentoxy isomers), —$OC_6H_{13}$ (e.g. hexoxy isomers), —$OC_7H_{15}$ (e.g. heptoxy isomers), etc.

With respect to any relevant formula or structural depiction herein, $Ph^1$ may be optionally substituted m-phenylene. If the m-phenylene is substituted, it may have 1, 2, 3, or 4 substituents. Any substituent may be included on the m-phenylene. In some embodiments, some or all of the substituents on the m-phenylene may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$OC_2CH_3$, —$O_2CC_2H_5$, —$OC_2C_2H_5$, —$O_2C$-phenyl, —$OC_2$-phenyl, etc.; a $C_{1-10}$ ketone such as —$COCH_3$, —$COC_2H_5$, —$COC_3H_7$, —$CO$-phenyl, etc.; or a $C_{1-10}$ amine such as $NH_2$, $NH(CH_3)$, $N(CH_3)_2$, $N(CH_3)C_2H_5$, etc. In some embodiments, $Ph^1$ may be unsubstituted, or may have 1, 2, or 3 substituents independently selected from $C_{1-6}$ alkyl and $C_{1-6}$ alkoxy.

In some embodiments, $Ph^1$ may be:

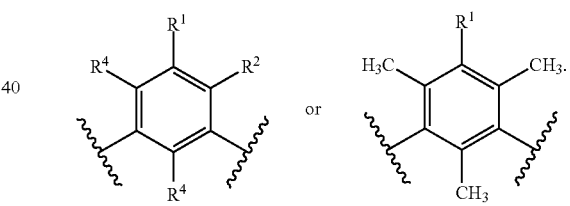

Some embodiments include a compound of Formula 2 (shown above) or Formula 3:

Formula 3

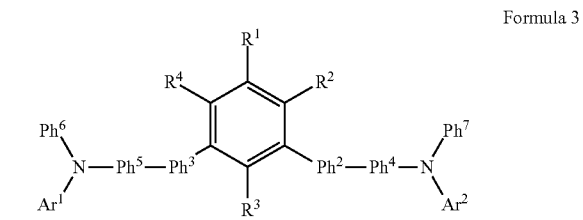

With respect to any relevant formula or structural depiction herein, $R^1$, $R^2$, $R^3$, and $R^4$ ("$R^{1-4}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{1-4}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, —C≡CH, OH, F, Cl, Br, I, CN, $NO_2$, $CO_2H$, $NH_2$, etc. Alternatively, any of $R^{1-4}$ may independently be a substituent having no alkyl portion, such as F, Cl, Br, I, $NO_2$, CN, $NH_2$, OH, COH, COH, $CO_2H$, $CH=CH_2$, C≡CH, etc. Some non-limiting examples of any of $R^{1-4}$ may independently include $R^A$, F, Cl, CN, $OR^A$, $CF_3$, $NO_2$, $NR^A R^B$, $COR^A$, $CO_2 R^A$, $OCOR^A$, etc. In some embodiments, any of $R^{1-4}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{1-4}$ may be H.

Each $R^A$ may independently be H, or $C_{1-12}$ alkyl, including: linear or branched alkyl having a formula $C_a H_{a+1}$, or cycloalkyl having a formula $C_a H_{a-1}$, wherein a is 1, 2, 3, 4, 5, 6, 7, 8, 9, 10, 11, or 12, such as linear or branched alkyl of a formula: $CH_3$, $C_2H_5$, $C_3H_7$, $C_4H_9$, $C_5H_{11}$, $C_6H_{13}$, $C_7H_{15}$, $C_8H_{17}$, $C_9H_{19}$, $C_{10}H_{21}$, etc., or cycloalkyl of a formula: $C_3H_5$, $C_4H_7$, $C_5H_9$, $C_6H_{11}$, $C_7H_{13}$, $C_8H_{15}$, $C_9H_{17}$, $C_{10}H_{19}$, etc.

Each $R^B$ may independently be H, or $C_{1-12}$ alkyl, including: linear or branched alkyl having a formula $C_a H_{a+1}$, or cycloalkyl having a formula $C_a H_a$, wherein a is 1, 2, 3, 4, 5, 6, 7, 8, 9, 10, 11, or 12, such as linear or branched alkyl of a formula: $CH_3$, $C_2H_5$, $C_3H_7$, $C_4H_9$, $C_5H_{11}$, $C_6H_{13}$, $C_7H_{15}$, $C_8H_{17}$, $C_9H_{19}$, $C_{10}H_{21}$, etc., or cycloalkyl of a formula: $C_3H_5$, $C_4H_7$, $C_5H_9$, $C_6H_{11}$, $C_7H_{13}$, $C_8H_{15}$, $C_9H_{17}$, $C_{10}H_{19}$, etc.

With respect to any relevant formula or structural depiction herein, $Ph^2$ may be optionally substituted p-phenylene. If the p-phenylene is substituted, it may have 1, 2, 3, or 4 substituents. Any substituent may be included on the p-phenylene. In some embodiments, some or all of the substituents on the p-phenylene may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$OC_2CH_3$, —$O_2CC_2H_5$, —$OC_2C_2H_5$, —$O_2C$-phenyl, —$OC_2$-phenyl, etc.; a $C_{1-10}$ ketone such as —$COCH_3$, —$COC_2H_5$, —$COC_3H_7$, —CO-phenyl, etc.; or a $C_{1-10}$ amine such as $NH_2$, $NH(CH_3)$, $N(CH_3)_2$, $N(OH_3)C_2H_5$, etc. In some embodiments, $Ph^2$ may be p-phenylene optionally substituted with 1, 2, or 3 substituents independently selected from $C_{1-6}$ alkyl and $C_{1-6}$ alkoxy. In some embodiments, $Ph^2$ is unsubstituted.

In some embodiments $Ph^2$ may be:

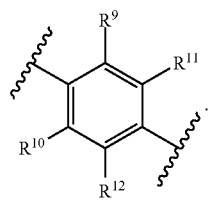

Some embodiments include a compound of Formula 4:

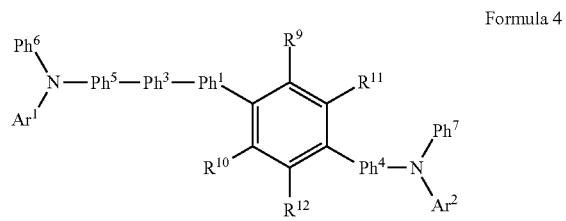

Formula 4

With respect to any relevant formula or structural depiction herein, $R^9$, $R^{10}$, $R^{11}$, and $R^{12}$ ("$R^{9-12}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{9-12}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, —C≡CH, OH, F, Cl, Br, I, CN, $NO_2$, $CO_2H$, $NH_2$, etc. Alternatively, any of $R^{9-12}$ may independently be a substituent having no alkyl portion, such as F, Cl, Br, I, $NO_2$, CN, $NH_2$, OH, COH, COH, $CO_2H$, $CH=CH_2$, C≡CH, etc. Some non-limiting examples of any of $R^{9-12}$ may independently include $R^A$, F, Cl, CN, $OR^A$, $CF_3$, $NO_2$, $NR^A R^B$, $COR^A$, $CO_2 R^A$, $OCOR^A$, etc. In some embodiments, any of $R^{9-12}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{9-12}$ may be H.

With respect to any relevant formula or structural depiction herein, $Ph^1$ may be optionally substituted p-phenylene. If the p-phenylene is substituted, it may have 1, 2, 3, or 4 substituents. Any substituent may be included on the p-phenylene. In some embodiments, some or all of the substituents on the p-phenylene may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$CO_2$-phenyl, etc.; a $C_{1-10}$ ketone such as —$COCH_3$, —$COC_2H_5$, —$COC_3H_7$, —CO-phenyl, etc.; or a $C_{1-10}$ amine such as $NH_2$, $NH(CH_3)$, $N(CH_3)_2$, $N(CH_3)C_2H_5$, etc. In some embodiments, $Ph^3$ may be p-phenylene optionally substituted with 1, 2, or 3 substituents independently selected from $C_{1-6}$ alkyl and $C_{1-6}$ alkoxy. In some embodiments, $Ph^3$ is unsubstituted.

In some embodiments, $Ph^3$ may be:

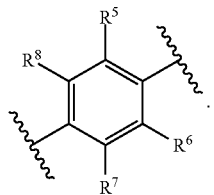

In some embodiments, $Ph^2$ and $Ph^3$ are the same.

Some embodiments include a compound of Formula 5:

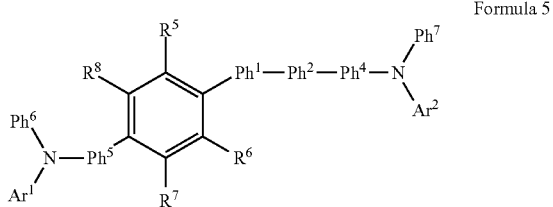

Formula 5

With respect to any relevant formula or structural depiction herein, $R^5$, $R^6$, $R^7$, and $R^8$ ("$R^{5-8}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{5-8}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, —C≡CH, OH, F, Cl, Br, I, ON, $NO_2$, $CO_2H$, $NH_2$, etc. Alternatively, any of $R^{5-8}$ may independently be a substituent having no alkyl portion, such as F, Cl, Br, I, $NO_2$, CN, $NH_2$, OH, COH, COH, $CO_2H$, $CH=CH_2$, C≡CH, etc. Some non-limiting examples of any of $R^{5-8}$ may independently include $R^A$, F, Cl, CN, $OR^A$, $CF_3$, $NO_2$, $NR^AR^B$, $COR^A$, $CO_2R^A$, $OCOR^A$, etc. In some embodiments, any of $R^{5-8}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{5-8}$ may be H.

With respect to any relevant formula or structural depiction herein, $Ph^4$ may be a bond or optionally substituted p-phenylene.

Since, $Ph^4$ may be a bond, some embodiments include compounds of Formula 6:

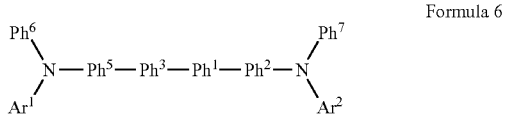

Formula 6

With respect to embodiments wherein $Ph^4$ is optionally substituted p-phenylene, if the p-phenylene is substituted, it may have 1, 2, 3, or 4 substituents. Any substituent may be included on the p-phenylene. In some embodiments, some or all of the substituents on the p-phenylene may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$CO_2$-phenyl, etc.; a $C_{1-10}$ ketone such as —$COCH_3$, —$COC_2H_5$, —$COC_3H_7$, —CO-phenyl, etc.; or a $C_{1-10}$ amine such as $NH_2$, $NH(CH_3)$, $N(CH_3)_2$, $N(CH_3)C_2H_5$, etc. In some embodiments, $Ph^4$ may be a bond or p-phenylene optionally substituted with 1, 2, or 3 substituents independently selected from $C_{1-6}$ alkyl and $C_{1-6}$ alkoxy. In some embodiments, $Ph^4$ is unsubstituted p-phenylene. In some embodiments, $Ph^4$ is a bond.

In some embodiments, $Ph^4$ may be:

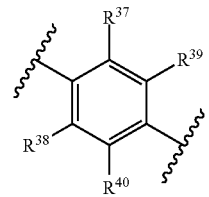

Some embodiments include a compound of Formula 7:

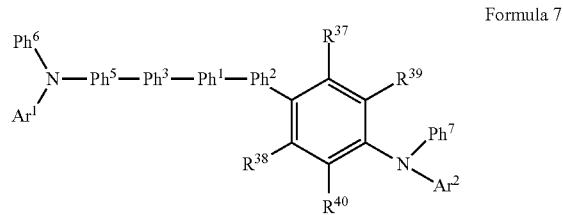

Formula 7

With respect to any relevant formula or structural depiction herein, $R^{37}$, $R^{38}$, $R^{39}$, and $R^{40}$ ("$R^{37-40}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{37-40}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, —C≡CH, OH, F, Cl, Br, I, CN, $NO_2$, $CO_2H$, $NH_2$, etc. Alternatively, any of $R^{37-40}$ may independently be a substituent having no alkyl portion, such as F, Cl, Br, I, $NO_2$, ON, $NH_2$, OH, COH, COH, $CO_2H$, $CH=CH_2$, C≡CH, etc.

Some non-limiting examples of any of $R^{37-40}$ may independently include $R^A$, F, Cl, CN, $OR^A$, $CF_3$, $NO_2$, $NR^AR^B$, $COR^A$, $CO_2R^A$, $OCOR^A$, etc. In some embodiments, any of $R^{37-40}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{37-40}$ may be H.

With respect to any relevant formula or structural depiction herein, $Ph^5$ may be a bond or optionally substituted p-phenylene.

Since $Ph^5$ may be a bond, some embodiments include compounds of Formula 8, 9, or 10:

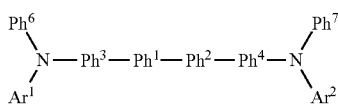

Formula 8

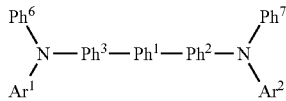

Formula 9

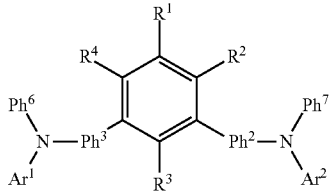

Formula 10

With respect to embodiments wherein $Ph^5$ is optionally substituted p-phenylene, if the p-phenylene is substituted, it may have 1, 2, 3, or 4 substituents. Any substituent may be included on the p-phenylene. In some embodiments, some or all of the substituents on the p-phenylene may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $O_{1-6}$ fluoroalkyl, such as $CF_3$, $CF_2H$, $C_2F_5$, etc.; a $C_{1-10}$ ester such as $-O_2CCH_3$, $-CO_2CH_3$, $-O_2CC_2H_5$, $-CO_2C_2H_5$, $-O_2C$-phenyl, $-CO_2$-phenyl, etc.; a $C_{1-10}$ ketone such as $-COCH_3$, $-COC_2H_5$, $-COC_3H_7$, $-CO$-phenyl, etc.; or a $C_{1-10}$ amine such as $NH_2$, $NH(CH_3)$, $N(CH_3)_2$, $N(CH_3)C_2H_5$, etc. In some embodiments, $Ph^5$ may be a bond or p-phenylene optionally substituted with 1, 2, or 3 substituents independently selected from $C_{1-6}$ alkyl and $C_{1-6}$ alkoxy. In some embodiments, $Ph^5$ is unsubstituted p-phenylene. In some embodiments, $Ph^5$ may be:

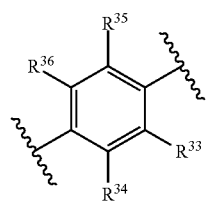

In some embodiments, $Ph^4$ and $Ph^5$ are the same.

Some embodiments include a compound of Formula 11:

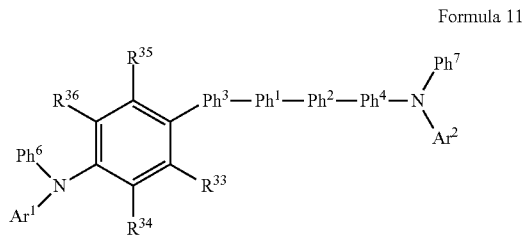

Formula 11

With respect to any relevant formula or structural depiction herein, $R^{33}$, $R^{34}$, $R^{35}$, and $R^{36}$ ("$R^{33-36}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{33-36}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, $-C\equiv CH$, OH, F, Cl, Br, I, CN, $NO_2$, $CO_2H$, $NH_2$, etc. Alternatively, any of $R^{33-36}$ may independently be a substituent having no alkyl portion, such as F, Cl, Br, I, $NO_2$, ON, $NH_2$, OH, COH, COH, $CO_2H$, $CH=CH_2$, $C\equiv CH$, etc. Some non-limiting examples of any of $R^{33-36}$ may independently include $R^A$, F, Cl, CN, $OR^A$, $CF_3$, $NO_2$, $NR^AR^B$, $COR^A$, $CO_2R^A$, $OCOR^A$, etc. In some embodiments, any of $R^{33-36}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{33-36}$ may be H.

With respect to any relevant formula or structural depiction herein, $Ph^6$ may be optionally substituted phenyl or optionally substituted biphenyl. If the phenyl is substituted, it may have 1, 2, 3, 4, or 5 substituents. If the biphenyl is substituted, it may have 1, 2, 3, 4, 5, 6, 7, 8, or 9 substituents. Any substituent may be included on the phenyl or biphenyl. In some embodiments, some or all of the substituents may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as $-O_2CCH_3$, $-CO_2CH_3$, $-O_2CC_2H_5$, $-CO_2C_2H_5$, $-O_2C$-phenyl, $-CO_2$-phenyl, etc.; a $C_{1-10}$ ketone such as $-COCH_3$, $-COC_2H_5$, $-COC_3H_7$, $-CO$-phenyl, etc.; or a $C_{1-10}$ amine such as $NH_2$, $NH(CH_3)$, $N(CH_3)_2$, $N(CH_3)C_2H_5$, etc. In some embodiments, $Ph^6$ may be phenyl optionally substituted with 1, 2, 3, or 4 substituents, or biphenyl optionally substituted with 1, 2, 3, 4, 5, or 6 substituents, wherein the substituents are independently selected from $C_{1-6}$ alkyl and $C_{1-6}$ alkoxy.

In some embodiments, Ph$^6$ may be:

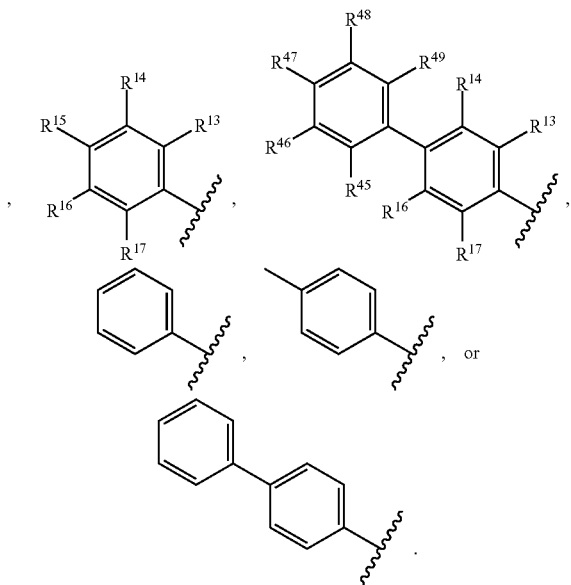

Some embodiments include a compound of Formula 12:

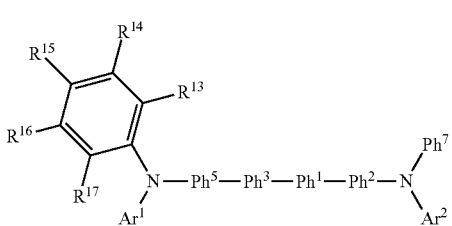

Formula 12

With respect to any relevant formula or structural depiction herein, $R^{13}$, $R^{14}$, $R^{15}$, $R^{16}$, $R^{17}$, $R^{45}$, $R^{46}$, $R^{47}$, $R^{48}$, and $R^{49}$ ("$R^{13-17}$ and $R^{45-49}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{13-17}$ and $R^{45-49}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C≡C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, —C≡CH, OH, F, Cl, Br, I, CN, $NO_2$, $CO_2H$, $NH_2$, etc. Alternatively, any of $R^{13-17}$ and $R^{45-49}$ may independently be a substituent having no alkyl portion, such as F, Cl, Br, I, $NO_2$, CN, $NH_2$, OH, COH, COH, $CO_2H$, $CH=CH_2$, C≡CH, etc. Some non-limiting examples of any of $R^{13-17}$ and $R^{45-49}$ may independently include $R^A$, F, Cl, CN, $OR^A$, $CF_3$, $NO_2$, $NR^A R^B$, $COR^A$, $CO_2R^A$, $OCOR^A$, etc. In some embodiments, any of $R^{13-17}$ and $R^{45-49}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{13-17}$ and $R^{45-49}$ may be H.

With respect to any relevant formula or structural depiction herein, Ph$^7$ may be optionally substituted phenyl or optionally substituted biphenyl. If the phenyl is substituted, it may have 1, 2, 3, 4, or 5 substituents. If the biphenyl is substituted, it may have 1, 2, 3, 4, 5, 6, 7, 8, or 9 substituents. Any substituent may be included on the phenyl or biphenyl. In some embodiments, some or all of the substituents may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$CO_2$-phenyl, etc.; a $C_{1-10}$ ketone such as —$COCH_3$, —$COC_2H_5$, —$COC_3H_7$, —CO-phenyl, etc.; or a $C_{1-10}$ amine such as $NH_2$, $NH(CH_3)$, $N(CH_3)_2$, $N(CH_3)C_2H_5$, etc. In some embodiments, Ph$^7$ may be phenyl optionally substituted with 1, 2, 3, or 4 substituents, or biphenyl optionally substituted with 1, 2, 3, 4, 5, or 6 substituents, wherein the substituents are independently selected from $C_{1-6}$ alkyl and $C_{1-6}$ alkoxy.

In some embodiments, Ph$^7$ may be:

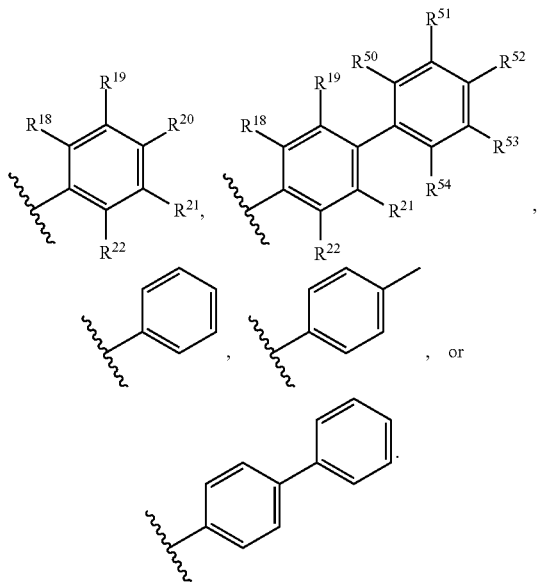

In some embodiments, Ph$^6$ and Ph$^7$ are the same.

Some embodiments include a compound of Formula 13:

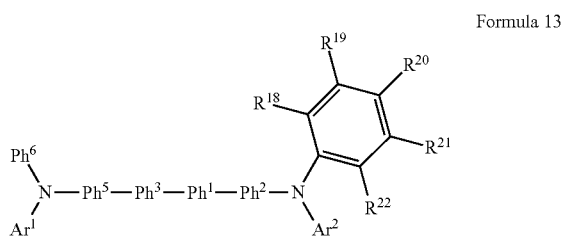

Formula 13

With respect to any relevant formula or structural depiction herein, $R^{18}$, $R^{19}$, $R^{20}$, $R^{21}$, $R^{22}$, $R^{50}$, $R^{51}$, $R^{52}$, $R^{53}$, and $R^{54}$ ("$R^{18-22}$ and $R^{50-54}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{18-22}$ and $R^{50-54}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, $CH=CH_2$, —C≡CH, OH, F, Cl, Br, I, CN, $NO_2$, $CO_2H$, $NH_2$, etc. Alternatively, any of $R^{18-22}$ and $R^{50-54}$ may independently be a substituent having no alkyl portion, such as F, Cl, Br, I, $NO_2$, CN, $NH_2$, OH, COH, COH, $CO_2H$, $CH=CH_2$, C≡CH, etc. Some non-limiting examples of any of $R^{18-22}$ and $R^{50-54}$ may independently include $R^A$, F, Cl, CN, $OR^A$, $CF_3$, $NO_2$, $NR^AR^B$, $COR^A$, $CO_2R^A$, $OCOR^A$, etc. In some embodiments, any of $R^{18-22}$ and $R^{50-54}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{18-22}$ and $R^{50-54}$ may be H.

With respect to any relevant formula or structural depiction herein, $Ar^1$ may be optionally substituted phenyl, optionally substituted biphenyl, or optionally substituted naphthalenyl, including naphthalen-1-yl and naphthalen-2-yl. If the phenyl is substituted, it may have 1, 2, 3, 4, or 5 substituents. If the biphenyl is substituted, it may have 1, 2, 3, 4, 5, 6, 7, 8, or 9 substituents. If the naphthalenyl is substituted, it may have 1, 2, 3, 4, 5, 6 or 7 substituents. Any substituent may be included on the phenyl, biphenyl, or naphthalenyl. In some embodiments, some or all of the substituents may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as $CH_3$, $C_2H_5$, $C_3H_7$, cyclic $C_3H_5$, $C_4H_9$, cyclic $C_4H_7$, $C_5H_{11}$, cyclic $C_5H_9$, $C_6H_{13}$, cyclic $C_6H_{11}$, etc.; $C_{1-10}$ alkoxy; halo, such as F, Cl, Br, I; OH; CN; $NO_2$; $C_{1-6}$ fluoroalkyl, such as $CF_3$, $CF_2H$, $C_2F_5$, etc.; a $C_{1-10}$ ester such as —$O_2CCH_3$, —$CO_2CH_3$, —$O_2CC_2H_5$, —$CO_2C_2H_5$, —$O_2C$-phenyl, —$CO_2$-phenyl, etc.; a $C_{1-10}$ ketone such as —$COCH_3$, —$COC_2H_5$, —$COC_3H_7$, —CO-phenyl, etc.; or a $C_{1-10}$ amine such as $NH_2$, $NH(CH_3)$, $N(CH_3)_2$, $N(CH_3)C_2H_5$, etc. In some embodiments, $Ar^1$ may be phenyl optionally substituted with 1, 2, 3, or 4 substituents, biphenyl optionally substituted with 1, 2, 3, 4, 5, or 6 substituents, or naphthalenyl optionally substituted with 1, 2, 3, 4, or 5 substituents, wherein the substituents are independently selected from $C_{1-6}$ alkyl and $C_{1-6}$ alkoxy.

In some embodiments, $Ar^1$ may be:

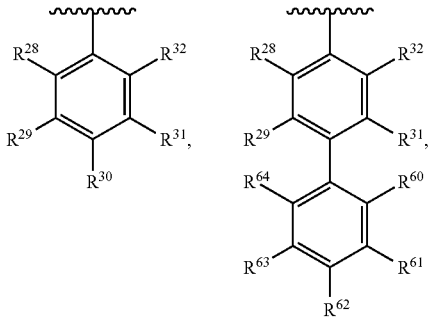

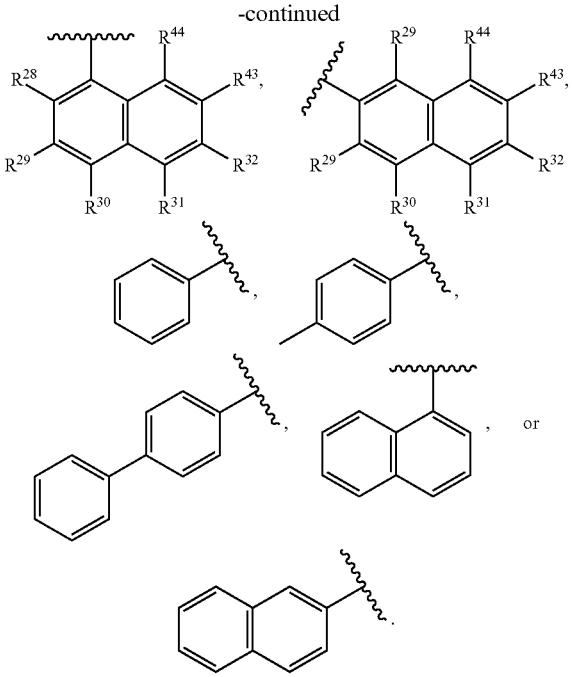

Some embodiments include a compound of Formula 14, 15, or 16:

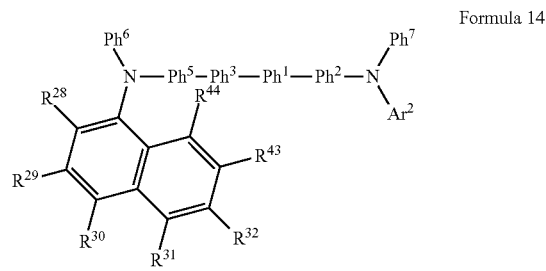

Formula 14

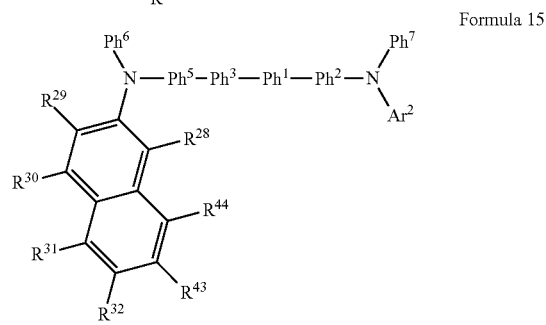

Formula 15

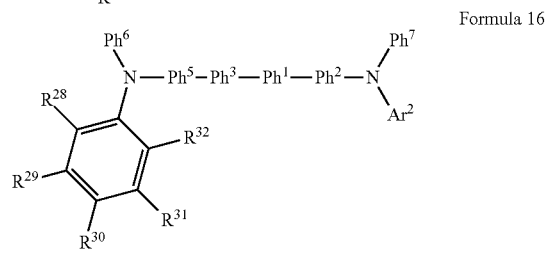

Formula 16

With respect to any relevant formula or structural depiction herein, $R^{28}$, $R^{29}$, $R^{30}$, $R^{31}$, $R^{32}$, $R^{43}$, $R^{44}$, $R^{60}$, $R^{61}$, $R^{62}$, $R^{63}$, and $R^{64}$ ("$R^{28-32}$, $R^{43-44}$ and $R^{60-64}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{28-32}$, $R^{43-44}$ and $R^{60-64}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, CO$_2$, CON, NCO$_2$, O, S, N, NH, etc. Any suitable monovalent functional group may be a substituent on an alkyl moiety, such as, CH=CH$_2$, —C≡CH, OH, F, Cl, Br, I, CN, NO$_2$, CO$_2$H, NH$_2$, etc. Alternatively, any of $R^{28-32}$, $R^{43-44}$ and $R^{60-64}$ may independently be a substituent having no alkyl portion, such as F, Cl, Br, I, NO$_2$, CN, NH$_2$, OH, COH, COH, CO$_2$H, CH=CH$_2$, C≡CH, etc. Some non-limiting examples of any of $R^{28-32}$, $R^{43-44}$ and $R^{60-64}$ may independently include $R^A$, F, Cl, CN, $OR^A$, CF$_3$, NO$_2$, $NR^AR^B$, $COR^A$, $CO_2R^A$, $OCOR^A$, etc. In some embodiments, any of $R^{28-32}$, $R^{43-44}$ and $R^{60-64}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{28-32}$, $R^{43-44}$ and $R^{60-64}$ may be H.

With respect to any relevant formula or structural depiction herein, $Ar^2$ may be optionally substituted phenyl, optionally substituted biphenyl, or optionally substituted naphthalenyl, including naphthalen-1-yl and naphthalen-2-yl. If the phenyl is substituted, it may have 1, 2, 3, 4, or 5 substituents. If the biphenyl is substituted, it may have 1, 2, 3, 4, 5, 6, 7, 8, or 9 substituents. If the naphthalenyl is substituted, it may have 1, 2, 3, 4, 5, 6 or 7 substituents. Any substituent may be included on the phenyl, biphenyl, or naphthalenyl. In some embodiments, some or all of the substituents may have: from 0 to 10 carbon atoms and from 0 to 10 heteroatoms independently selected from: O, N, S, F, Cl, Br, and I; and/or a molecular weight of 15 g/mol to 500 g/mol. For example, the substituents may be $C_{1-10}$ alkyl, such as CH$_3$, C$_2$H$_5$, C$_3$H$_7$, cyclic C$_3$H$_5$, C$_4$H$_9$, cyclic C$_4$H$_7$, C$_5$H$_{11}$, cyclic C$_5$H$_9$, C$_6$H$_{13}$, cyclic C$_6$H$_{11}$, etc.; $C_{1-10}$ alkoxy; halo, such as F, Cl, Br, I; OH; CN; NO$_2$; $C_{1-6}$ fluoroalkyl, such as CF$_3$, CF$_2$H, C$_2$F$_5$, etc.; a $C_{1-10}$ ester such as —O$_2$CCH$_3$, —CO$_2$CH$_3$, —O$_2$CC$_2$H$_5$, —CO$_2$C$_2$H$_5$, —O$_2$C-phenyl, —CO$_2$-phenyl, etc.; a $C_{1-10}$ ketone such as —COCH$_3$, —COC$_2$H$_5$, —COC$_3$H$_7$, —CO-phenyl, etc.; or a $C_{1-10}$ amine such as NH$_2$, NH(CH$_3$), N(CH$_3$)$_2$, N(CH$_3$) C$_2$H$_5$, etc. In some embodiments, $Ar^2$ may be phenyl optionally substituted with 1, 2, 3, or 4 substituents, biphenyl optionally substituted with 1, 2, 3, 4, 5, or 6 substituents, or naphthalenyl optionally substituted with 1, 2, 3, 4, or 5 substituents, wherein the substituents are independently selected from $C_{1-6}$ alkyl and $C_{1-6}$ alkoxy.

In some embodiments, $Ar^2$ may be:

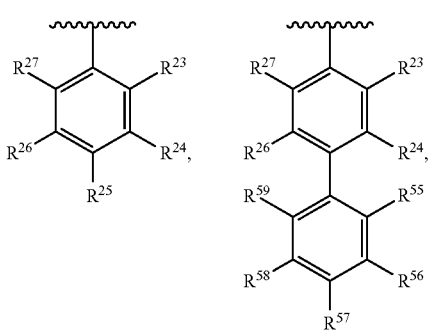

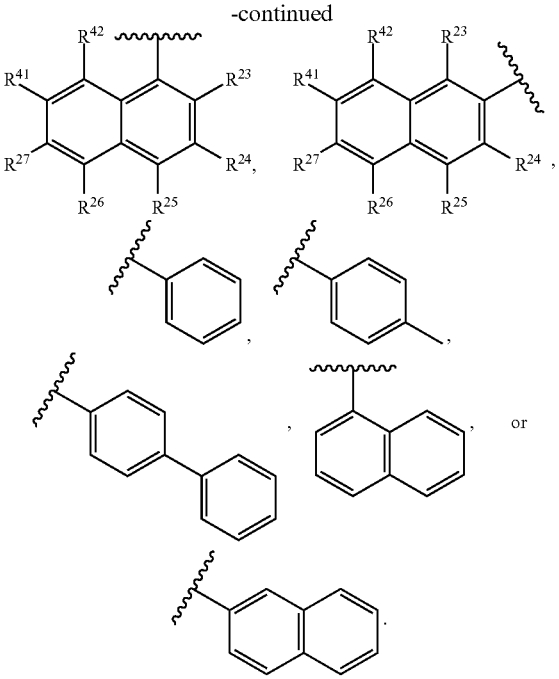

Some embodiments include a compound of Formula 17, 18, or 19.

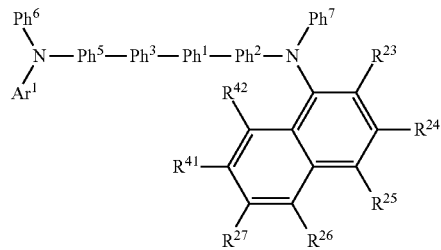

Formula 17

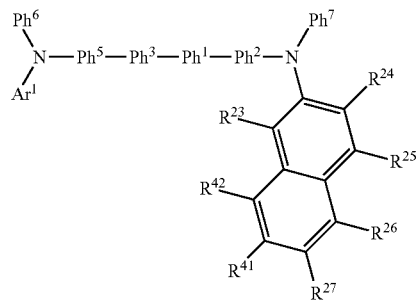

Formula 18

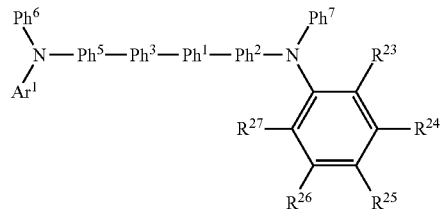

Formula 19

With respect to any relevant formula or structural depiction herein, $R^{23}$, $R^{24}$, $R^{25}$, $R^{26}$, $R^{27}$, $R^{41}$, $R^{42}$, $R^{55}$, $R^{56}$, $R^{57}$, $R^{58}$, and $R^{59}$ ("$R^{23-27}$", $R^{41-42}$ and $R^{55-59}$") may independently be H or any substituent, such as a substituent having from 0 to 6 carbon atoms and from 0 to 5 heteroatoms independently selected from: O, N, S, F, Cl, Br, and I, and/or having a molecular weight of 15 g/mol to 300 g/mol, 15 g/mol to 100 g/mol, or 15 g/mol to 50 g/mol. Any of $R^{23-27}$, $R^{41-42}$ and $R^{55-59}$ may independently comprise: an alkyl moiety optionally connected via a functional group to 1 or more additional alkyl moieties, wherein any alkyl moiety may be independently optionally substituted by 1 or more functional groups. Any suitable polyvalent functional group may connect any 2 or more alkyl moieties, such as CH=CH, C=CH, C=C, C≡C, CO, N=C, N=CH, $CO_2$, CON, $NCO_2$, O, S, N, NH, etc. Any suitable monovalent functional group may be a substituent on an alkyl moiety, such as, CH=$CH_2$, —C≡CH, OH, F, Cl, Br, I, CN, $NO_2$, $CO_2H$, $NH_2$, etc. Alternatively, any of $R^{23-27}$, $R^{41-42}$ and $R^{55-59}$ may independently be a substituent having no alkyl portion, such as F, Cl, Br, I, $NO_2$, CN, $NH_2$, OH, COH, COH, $CO_2H$, etc. Some non-limiting examples of any of $R^{23-27}$, $R^{41-42}$ and $R^{55-59}$ may independently include $R^A$, F, Cl, CN, $OR^A$, $CF_3$, $NO_2$, $NR^AR^B$, $COR^A$, $CO_2R^A$, $OCOR^A$, CH=$CH_2$, C≡CH, etc. In some embodiments, any of $R^{23-27}$, $R^{41-42}$ and $R^{55-59}$ may independently be H or $C_{1-6}$ alkyl, such as methyl, ethyl, propyl isomers, cyclopropyl, butyl isomers, cyclobutyl isomers, pentyl isomers, cyclopentyl isomers, hexyl isomers, cyclohexyl isomers, etc. In some embodiments, any of $R^{23-27}$, $R^{41-42}$ and $R^{55-59}$ may be H.

Some embodiments include a compound of any of Formulas 20-33.

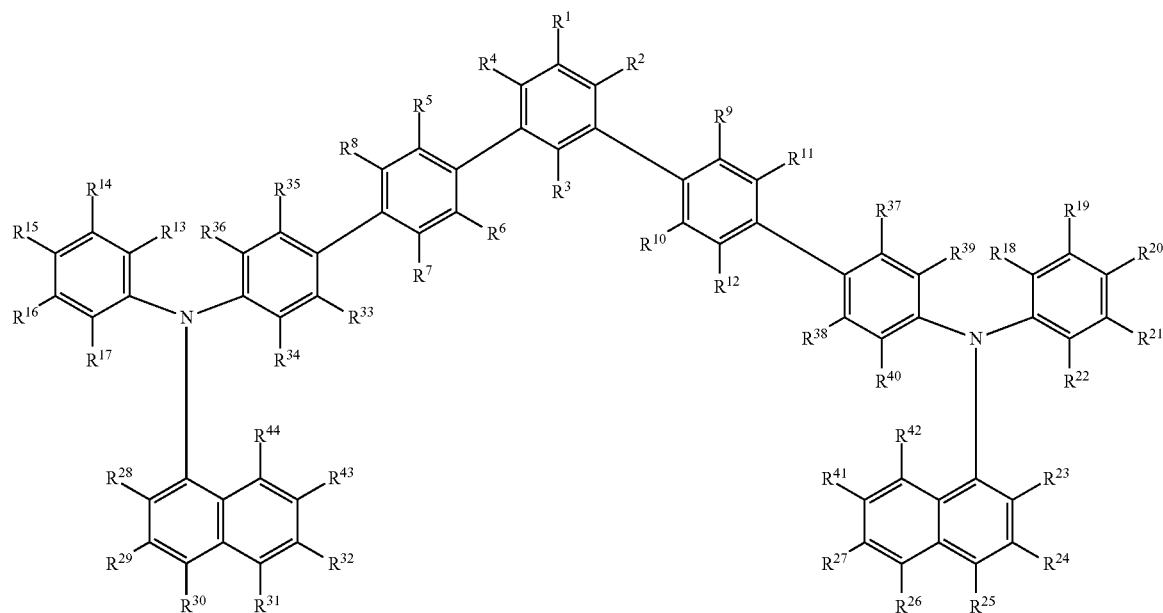

Formula 20

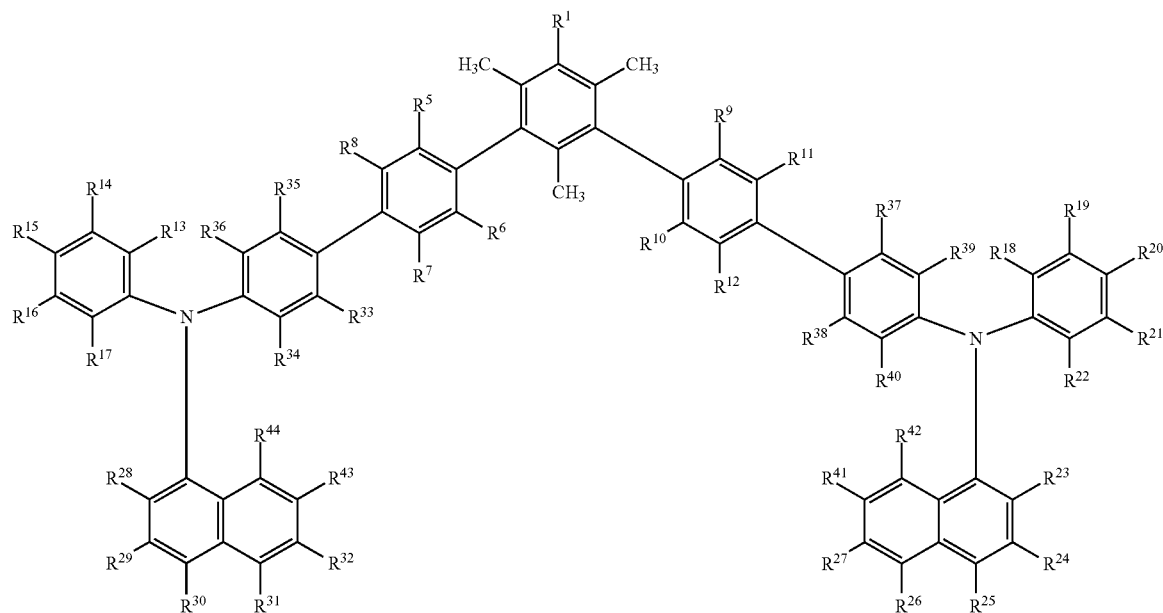

Formula 21

Formula 22
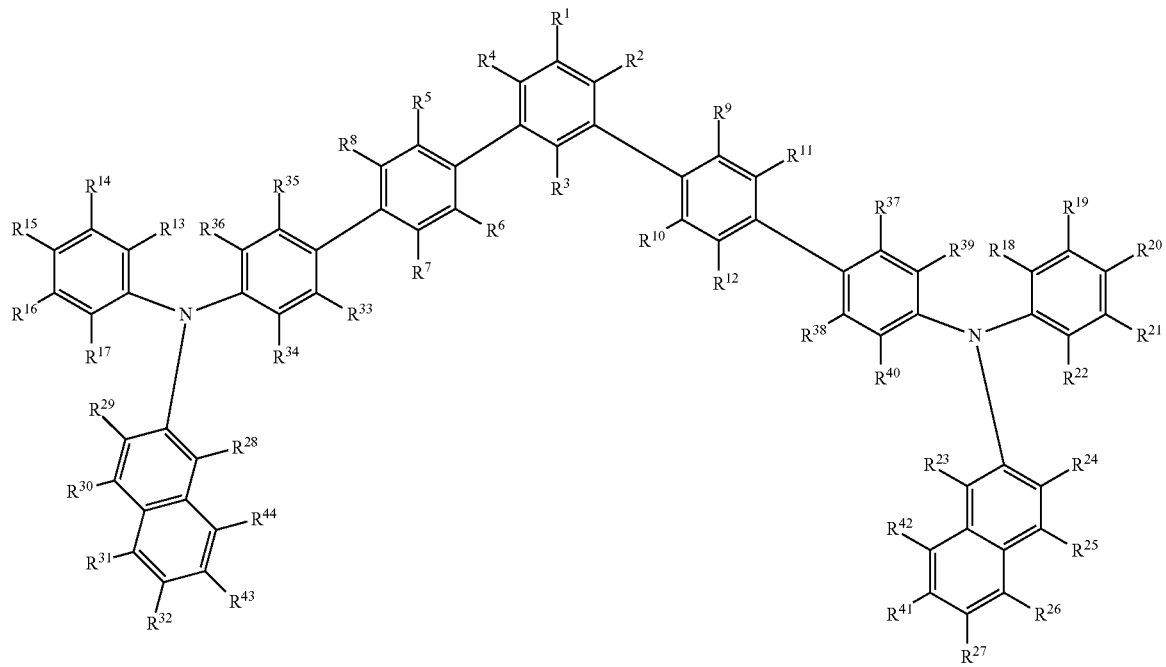
Formula 23
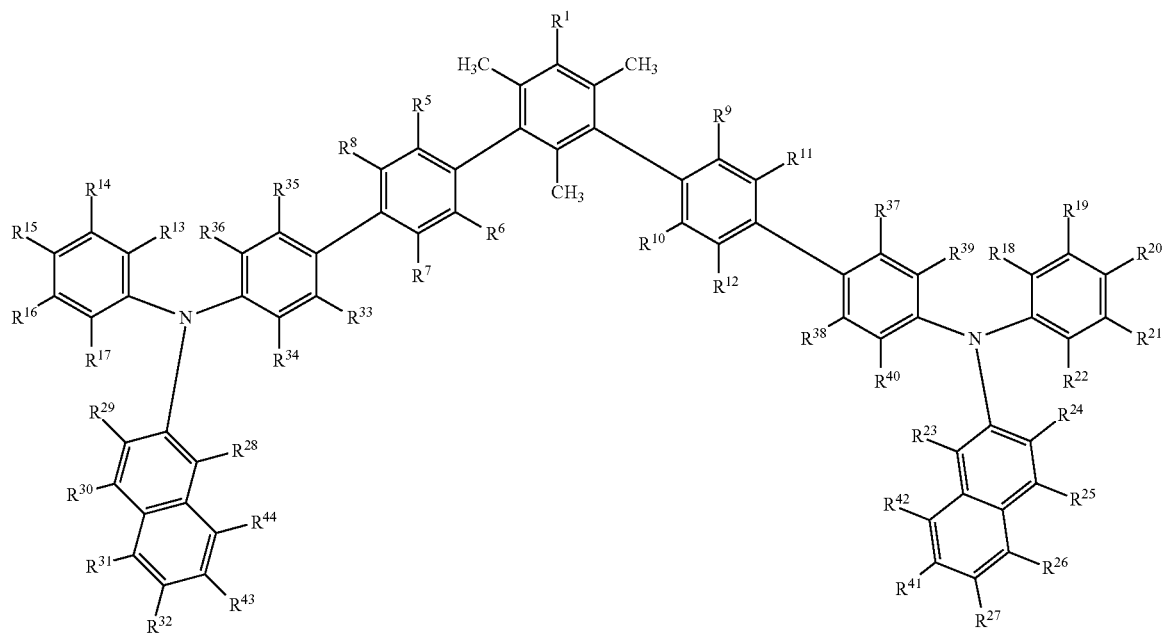

-continued
Formula 24
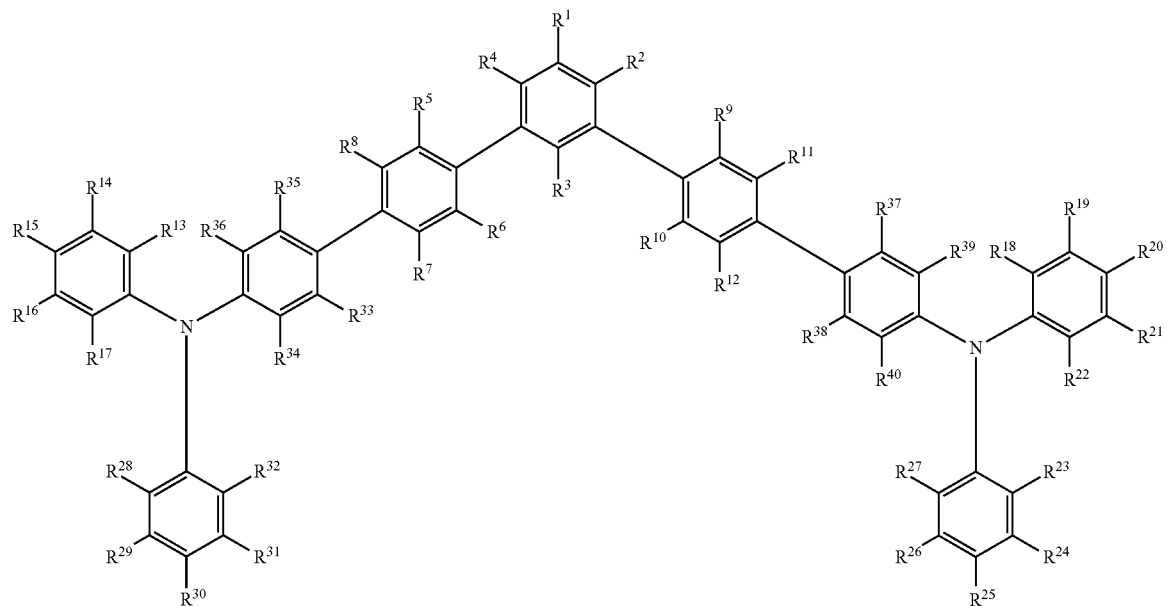
Formula 25
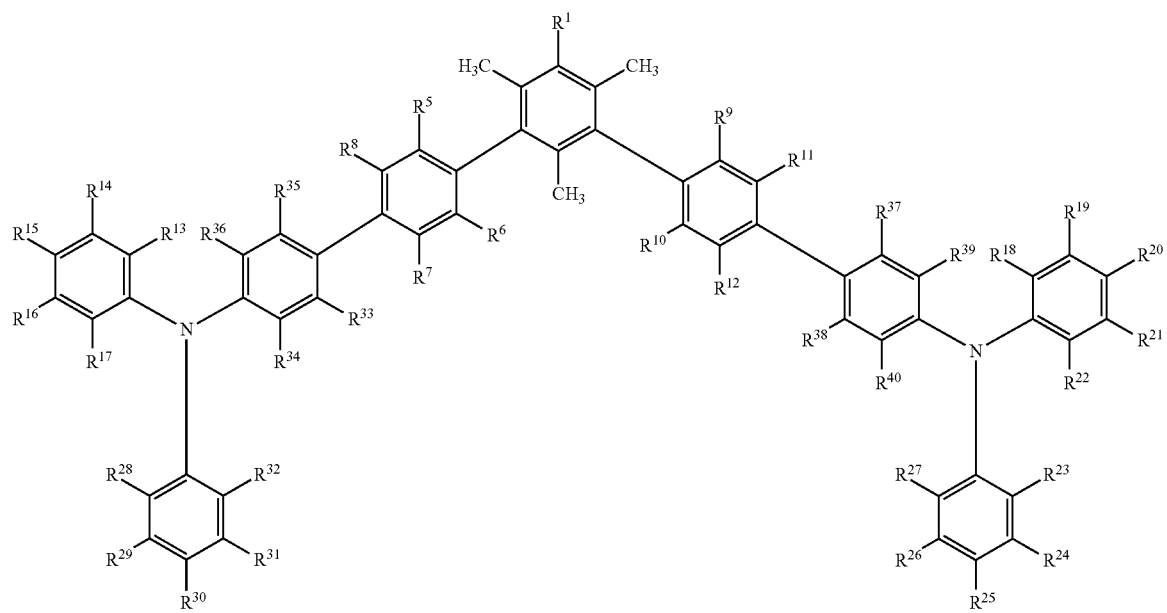

Formula 26
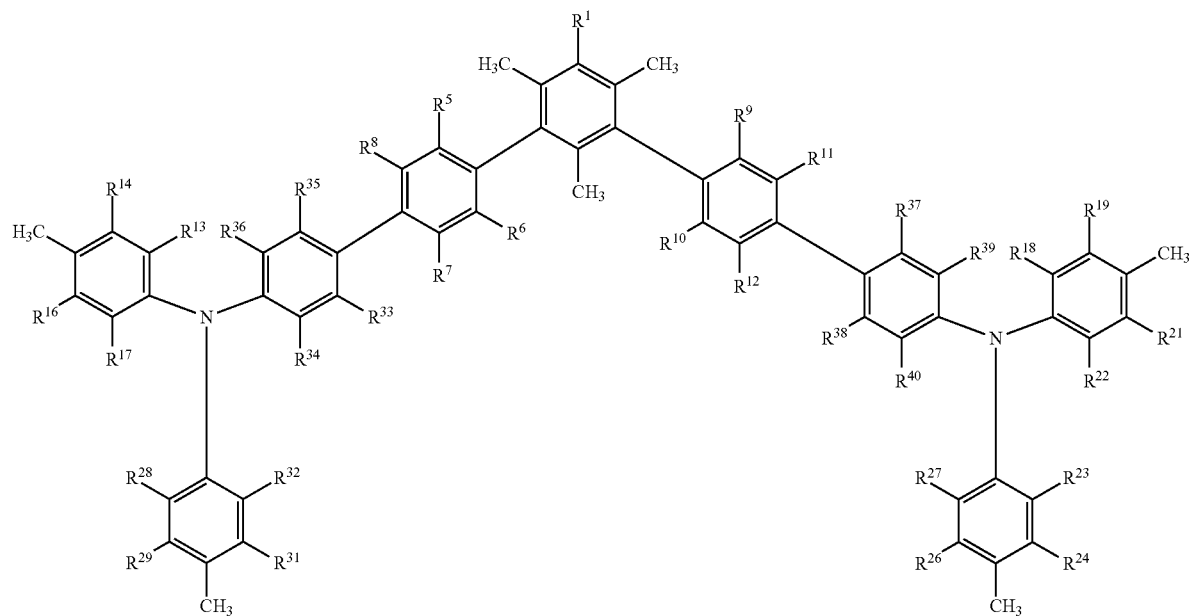
Formula 27
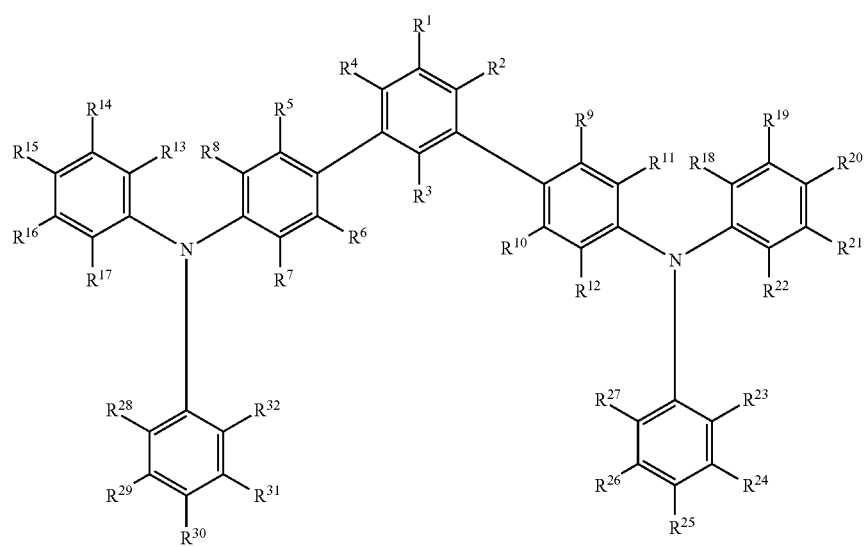

-continued
Formula 28
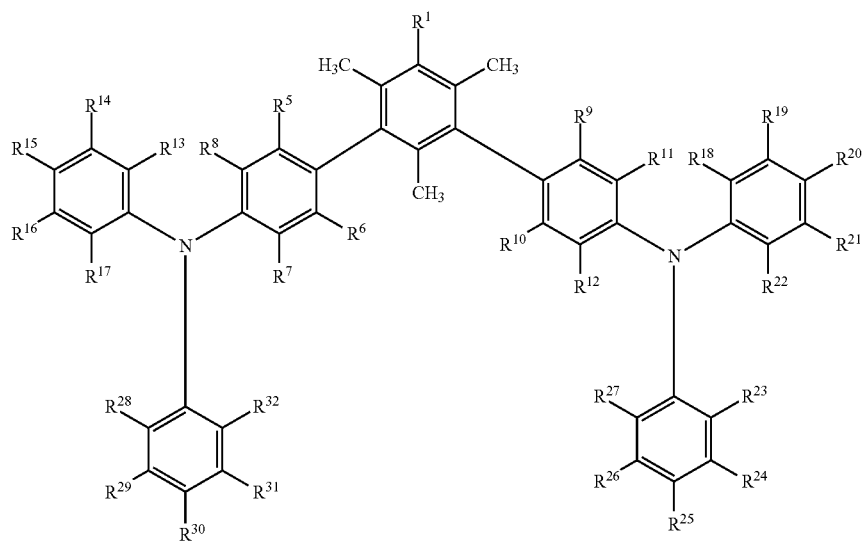
Formula 29
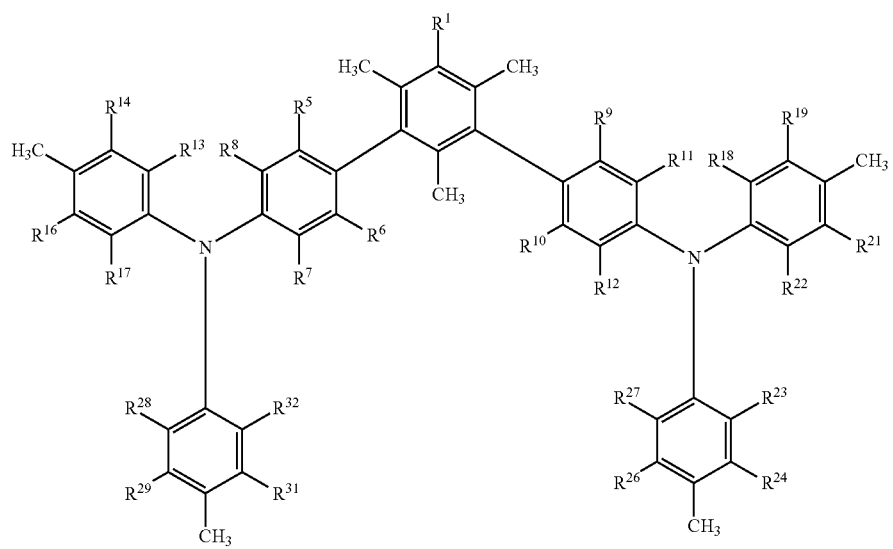

Formula 30
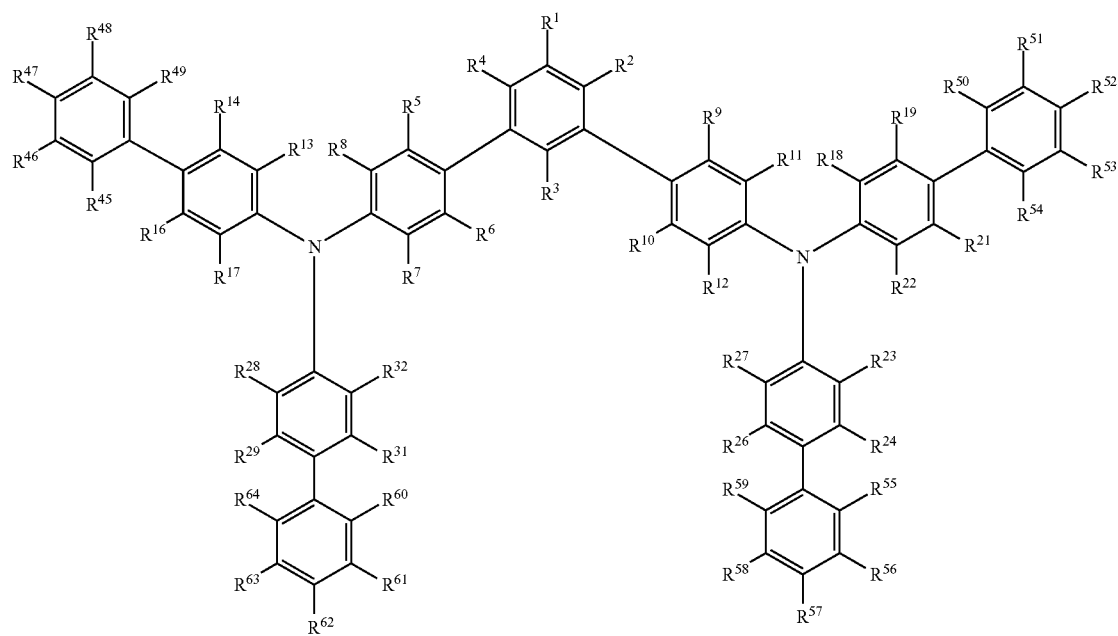
Formula 31
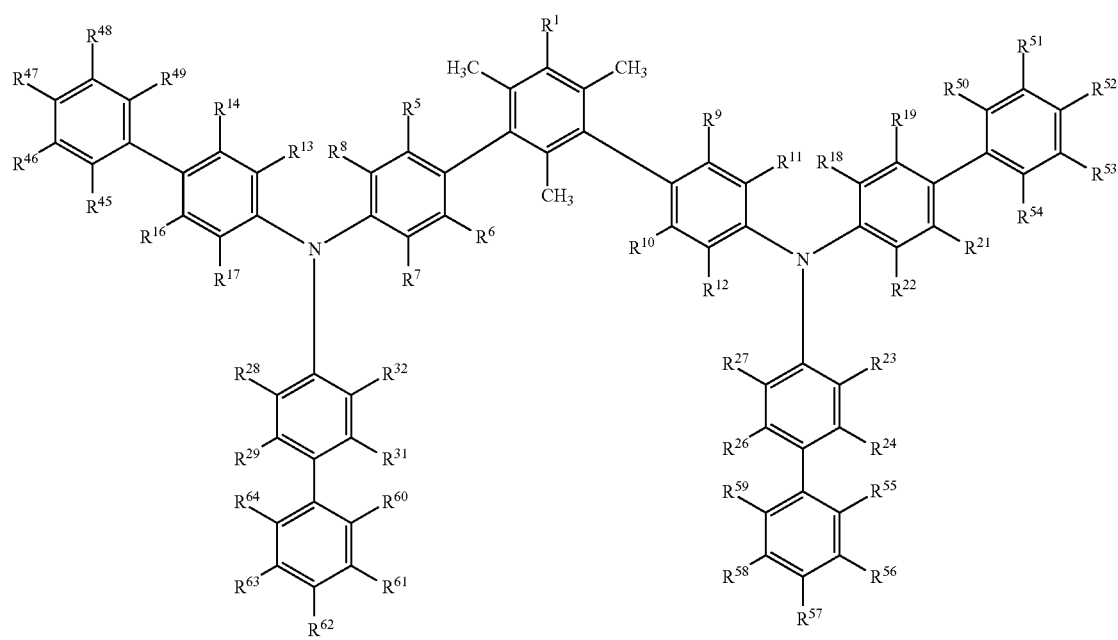

-continued

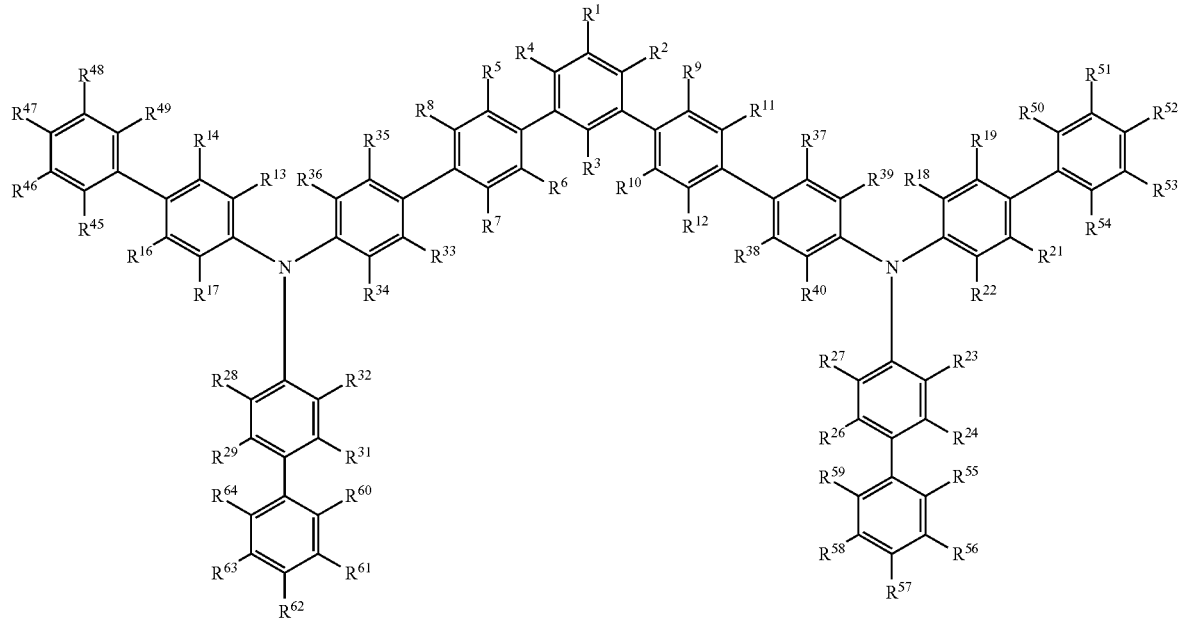

Formula 32

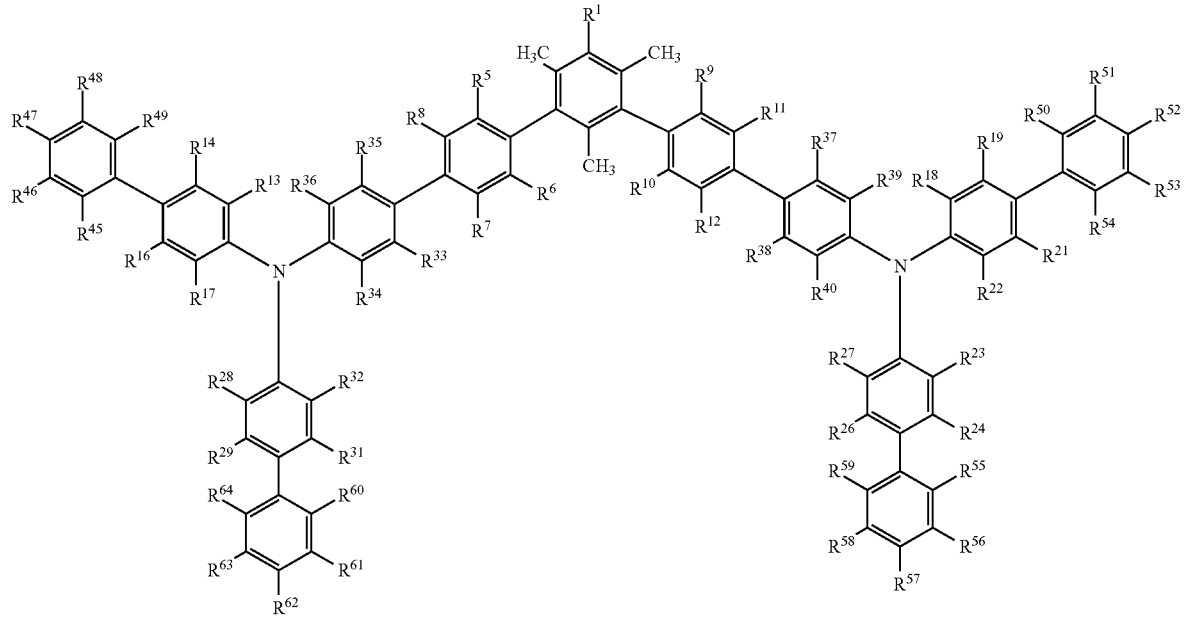

Formula 33

With respect to any relevant formula or structural depiction herein, such as Formulas 3, 10, 20, 22, 24, 27, 29, and 32, in some embodiments $R^2$, $R^3$, and $R^4$ are $C_{1-6}$ alkyl.

With respect to any relevant formula or structural depiction herein, such as Formulas 5, 20, 21, 22, 23, 24, 25, 26, 27, 28, 29, 30, 31, 32, and 33, in some embodiments $R^5$, $R^6$, $R^7$, and $R^8$ may be H or $C_{1-6}$ alkyl. In some embodiments, $R^5$, $R^6$, $R^7$, and $R^8$ are H.

With respect to any relevant formula or structural depiction herein, such as Formulas 4, 20, 21, 22, 23, 24, 25, 26, 27, 28, 29, 30, 31, 32, and 33, in some embodiments $R^9$, $R^{10}$, $R^{11}$, and $R^{12}$ may be H or $C_{1-6}$ alkyl. In some embodiments, $R^9$, $R^{10}$, $R^{11}$, and $R^{12}$ are H.

With respect to any relevant formula or structural depiction herein, such as Formulas 26, 29, 30, 31, 32, and 33, in some embodiments $R^{13}$, $R^{14}$, $R^{16}$, and $R^{17}$ may be H or $C_{1-6}$ alkyl. In some embodiments, $R^{13}$, $R^{14}$, $R^{16}$, and $R^{17}$ are H.

With respect to any relevant formula or structural depiction herein, such as Formulas 12, 20, 21, 22, 23, 24, 25, 27, and 28, in some embodiments $R^{13}$, $R^{14}$, $R^{15}$, $R^{16}$, and $R^{17}$ may be H or $C_{1-6}$ alkyl. In some embodiments, $R^{13}$, $R^{14}$, $R^{15}$, $R^{16}$, and $R^{17}$ are H.

With respect to any relevant formula or structural depiction herein, such as Formulas 26, 29, 30, 31, 32, and 33, in some embodiments $R^{18}$, $R^{19}$, $R^{21}$, $R^{22}$ may be H or $C_{1-6}$ alkyl. In some embodiments, $R^{18}$, $R^{19}$, $R^{21}$, $R^{22}$ are H.

With respect to any relevant formula or structural depiction herein, such as Formulas 13, 20, 21, 22, 23, 24, 25, 27, and 28 in some embodiments $R^{18}$, $R^{19}$, $R^{20}$, $R^{21}$, $R^{22}$ may be H or $C_{1-6}$ alkyl. In some embodiments, $R^{18}$, $R^{19}$, $R^{20}$, $R^{21}$, $R^{22}$ are H.

With respect to any relevant formula or structural depiction herein, such as Formulas 26, 29, 30, 31, 32, and 33, in some embodiments $R^{23}$, $R^{24}$, $R^{26}$, and $R^{27}$ may be H or $C_{1-6}$ alkyl. In some embodiments, $R^{23}$, $R^{24}$, $R^{26}$, and $R^{27}$ are H.

With respect to any relevant formula or structural depiction herein, such as Formulas 19, 24, 27, and 28 in some embodiments $R^{23}$, $R^{24}$, $R^{25}$, $R^{26}$, and $R^{27}$ may be H or $C_{1-6}$ alkyl. In some embodiments, $R^{23}$, $R^{24}$, $R^{25}$, $R^{26}$, and $R^{27}$ are H.

With respect to any relevant formula or structural depiction herein, such as Formulas 17, 18, 20, 21, 22, and 23, in some embodiments $R^{23}$, $R^{24}$, $R^{25}$, $R^{26}$, $R^{27}$, $R^{41}$, and $R^{42}$ may be H or $C_{1-6}$ alkyl. In some embodiments, $R^{23}$, $R^{24}$, $R^{25}$, $R^{26}$, $R^{27}$, $R^{41}$, and $R^{42}$ are H.

With respect to any relevant formula or structural depiction herein, such as Formulas 26, 29, 30, 31, 32, and 33, in some embodiments $R^{28}$, $R^{29}$, $R^{31}$, and $R^{32}$ may be H or $C_{1-6}$ alkyl. In some embodiments, $R^{28}$, $R^{29}$, $R^{31}$, and $R^{32}$ are H.

With respect to any relevant formula or structural depiction herein, such as Formulas 16, 24, 25, 27, and 28, in some embodiments $R^{28}$, $R^{29}$, $R^{30}$, $R^{31}$, and $R^{32}$ may be H or $C_{1-6}$ alkyl. In some embodiments, $R^{28}$, $R^{29}$, $R^{30}$, $R^{31}$, and $R^{32}$ are H.

With respect to any relevant formula or structural depiction herein, such as Formulas 14, 15, 20, 21, 22, and 23, in some embodiments $R^{28}$, $R^{29}$, $R^{30}$, $R^{31}$, $R^{32}$, $R^{43}$, and $R^{44}$ may be H or $C_{1-6}$ alkyl. In some embodiments, $R^{28}$, $R^{29}$, $R^{30}$, $R^{31}$, $R^{32}$, $R^{43}$, and $R^{44}$ are H.

With respect to any relevant formula or structural depiction herein, such as Formulas 11, 20, 21, 22, 23, 24, 25, 26, 32, and 33, in some embodiments $R^{33}$, $R^{34}$, $R^{35}$, and $R^{36}$ may be H or $C_{1-6}$ alkyl. In some embodiments, $R^{33}$, $R^{34}$, $R^{35}$, and $R^{36}$ are H.

With respect to any relevant formula or structural depiction herein, such as Formulas 7, 20, 21, 22, 23, 24, 25, 26, 32, and 33, in some embodiments $R^{37}$, $R^{38}$, $R^{39}$, and $R^{40}$ may be H or $C_{1-6}$ alkyl. In some embodiments, $R^{37}$, $R^{38}$, $R^{39}$, and $R^{40}$ are H.

With respect to any relevant formula or structural depiction herein, such as Formulas 30, 31, 32, and 33, in some embodiments $R^{45}$, $R^{46}$, $R^{47}$, $R^{48}$, and $R^{49}$ may be H or $C_{1-6}$ alkyl. In some embodiments, $R^{45}$, $R^{46}$, $R^{47}$, $R^{48}$, and $R^{49}$ are H.

With respect to any relevant formula or structural depiction herein, such as Formulas 30, 31, 32, and 33, in some embodiments $R^{50}$, $R^{51}$, $R^{52}$, $R^{53}$, and $R^{54}$ may be H or $C_{1-6}$ alkyl. In some embodiments, $R^{50}$, $R^{51}$, $R^{52}$, $R^{53}$, and $R^{54}$ are H.

With respect to any relevant formula or structural depiction herein, such as Formulas 30, 31, 32, and 33, in some embodiments $R^{55}$, $R^{56}$, $R^{57}$, $R^{58}$, and $R^{59}$ may be H or $C_{1-6}$ alkyl. In some embodiments, $R^{55}$, $R^{56}$, $R^{57}$, $R^{58}$, and $R^{59}$ are H.

With respect to any relevant formula or structural depiction herein, such as Formulas 30, 31, 32, and 33, in some embodiments $R^{60}$, $R^{61}$, $R^{62}$, $R^{63}$, and $R^{64}$ may be H or $C_{1-6}$ alkyl. In some embodiments, $R^{60}$, $R^{61}$, $R^{62}$, $R^{63}$, and $R^{64}$ are H.

With respect to any relevant formula or structural depiction herein, such as Formulas 20-33, in some embodiments, $R^5$ is the same as $R^9$, $R^6$ is the same as $R^{10}$, $R^7$ is the same as $R^{12}$, and/or $R^8$ is the same as $R^{11}$.

With respect to any relevant formula or structural depiction herein, such as Formulas 20-33, in some embodiments, $R^{13}$ is the same as $R^{18}$, $R^{14}$ is the same as $R^{19}$, $R^{15}$ is the same as $R^{20}$, $R^{16}$ is the same as $R^{21}$, and/or $R^{17}$ is the same as $R^{22}$.

With respect to any relevant formula or structural depiction herein, such as Formulas 20-33, in some embodiments, $R^{23}$ is the same as $R^{28}$, $R^{24}$ is the same as $R^{29}$, $R^{25}$ is the same as the same as $R^{31}$, $R^{27}$ is the same as $R^{32}$, $R^{41}$ is the same as $R^{43}$, and/or $R^{42}$ is the same as $R^{44}$.

With respect to any relevant formula or structural depiction herein, such as Formulas 20-23, in some embodiments, $R^{41}$ is the same as $R^{43}$, and/or $R^{42}$ is the same as $R^{44}$.

With respect to any relevant formula or structural depiction herein, such as Formulas 20-26, 32 and 33, in some embodiments, $R^{33}$ is the same as $R^{38}$, $R^{34}$ is the same as $R^{40}$, $R^{35}$ is the same as $R^{37}$, and/or $R^{36}$ is the same as $R^{39}$.

With respect to any relevant formula or structural depiction herein, such as Formulas 30-33, in some embodiments, $R^{45}$ is the same as $R^{54}$, $R^{46}$ is the same as $R^{53}$, $R^{47}$ is the same as $R^{52}$, $R^{48}$ is the same as $R^{51}$, and/or $R^{49}$ is the same as $R^{50}$.

With respect to any relevant formula or structural depiction herein, such as Formulas 30-33, in some embodiments, $R^{60}$ is the same as $R^{59}$, $R^{61}$ is the same as $R^{58}$, $R^{62}$ is the same as $R^{57}$, $R^{63}$ is the same as $R^{56}$, and/or $R^{64}$ is the same as $R^{55}$.

Some embodiments include a compound selected from:

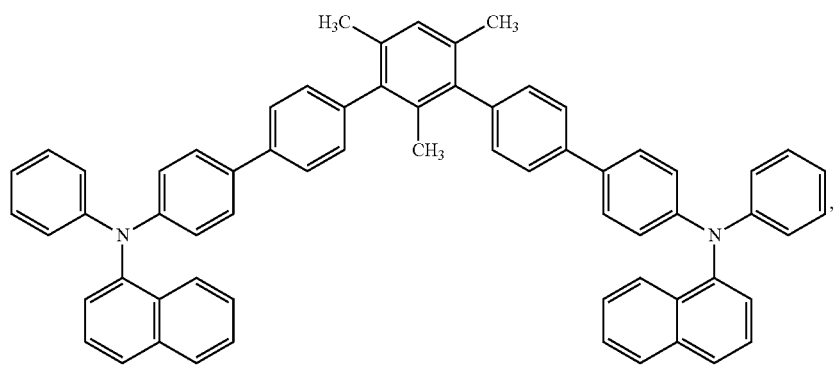

(HT-4)

-continued

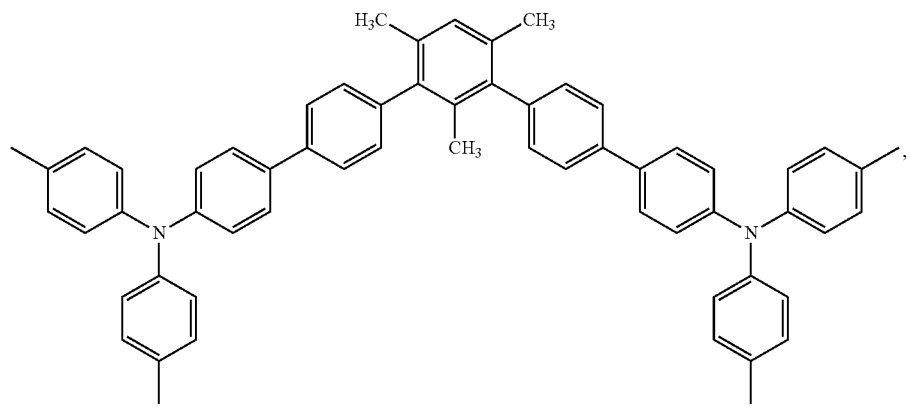
(HT-3)

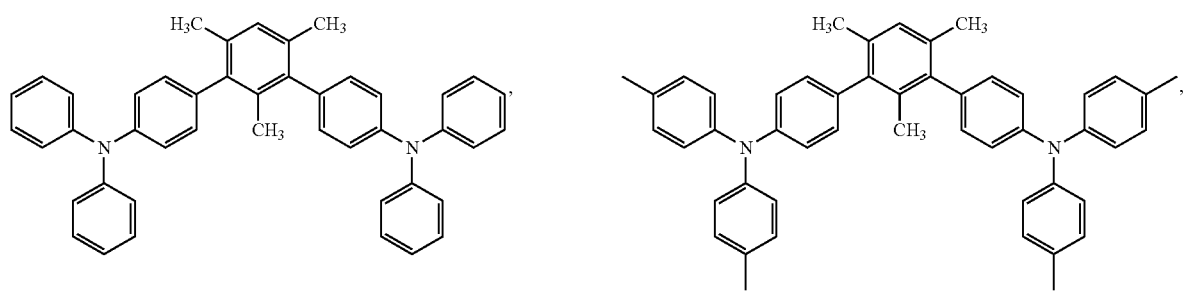
(HT-1)    (HT-2)

and

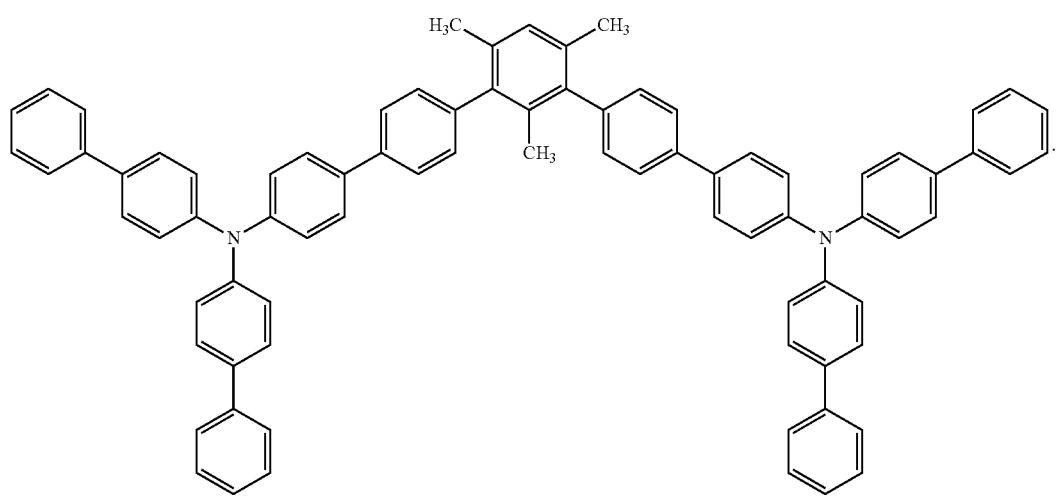
(HT-5)

Some embodiments include a composition comprising a compound of any of the formulas above (hereinafter referred to as "a subject compound"). A composition comprising a subject compound may be useful as a hole transfer material in devices such as organic light-emitting (OLED) devices. When used as a hole-transfer material, a subject compound may provide improved photostability, electrostability, and/or thermal stability. This may provide longer lifetimes for OLED devices.

Any subject compound may be a hole-transporting material. In some embodiments, a hole mobility of the compound is greater an electron mobility of the compound. In some embodiments the hole mobility may be in a range $10^{-6}$ to $10^{-3}$ cm$^2$V$^{-1}$S$^{-1}$.

While there are many methods known in the art for measuring electron and hole mobility for materials of an LED, one method that may be used is provided in Example 9.

In some embodiments, a subject compound may have a HOMO energy level of about −5.0 eV to about −5.5 eV.

In some embodiments, a subject compound may have a LUMO energy level of about −1.7 eV to about −2 eV.

| Compound | HOMO | LUMO | T1 (eV) | Tg (C) |
|---|---|---|---|---|
| HT-1 | −5.35 | −1.85 | 2.9 | 91 |
| HT-2 | −5.26 | −1.82 | 2.92 | 102 |

The HOMO and LUMO energy levels for organic materials to be used in OLEDs may be obtained by several conventional methods known in the art, e.g. solution electrochemistry, ultraviolet photoelectron spectroscopy (UPS), inverse photoemission spectroscopy, etc. In some embodiments, HOMO and LUMO energy levels for organic materials to be used in OLEDs may be obtained using a cyclic voltammetry (CV) instrument (model pAutolab type II) manufactured by Metrohm USA (Riverview, FLA, USA) in conjunction with GPES/FRA software (version 4.9).

In some embodiments, a subject compound may have a triplet energy in the range of about 2.4 eV to about 3.0 eV.

The subject compounds may also form amorphous solids, which may make the compounds easy to form into films. In some embodiments, a higher glass transition temperature may provide a more stable device. Some light-emitting devices may heat up during use. If a device heats during use and then cools when not in operation, amorphous films may change to crystalline layers. A higher glass transition temperature may reduce the tendency of the heating and cooling of a device to form crystalline layers from amorphous films. In some embodiments, the compounds may have a glass-transition temperature in a range of about 100° C. to about 200° C.

Some OLEDs comprising a subject compound may have a structure represented by FIG. 1. An emissive layer 20 may be disposed between an anode 5 and a cathode 35. A hole-transport layer 15 may be disposed between the anode 5 and the emissive layer 20. An optional electron-transport layer 30 may be disposed between the emissive layer 20 and the cathode 35. Other layers may be present in such a device as described below.

An anode, e.g. anode 5, may be a layer comprising a conventional material such as a metal, a mixed metal, an alloy, a metal oxide or a mixed-metal oxide, a conductive polymer, and/or an inorganic material such as a carbon nanotube (CNT). Examples of suitable metals include the Group 1 metals, the metals in Groups 4, 5, 6, and the Group 8-10 transition metals. If the anode layer is to be light-transmitting, metals in Group 10 and 11, such as Au, Pt, and Ag, or alloys thereof; or mixed-metal oxides of Group 12, 13, and 14 metals, such as indium-tin-oxide (ITO), indium-zinc-oxide (IZO), and the like, may be used. In some embodiments, the anode layer may be an organic material such as polyaniline. The use of polyaniline is described in "Flexible light-emitting diodes made from soluble conducting polymer," Nature, vol. 357, pp. 477-479 (11 Jun. 1992). In some embodiments, an anode layer can have a thickness in the range of about 1 nm to about 1000 nm.

A cathode, e.g. cathode 35, may be a layer including a material having a lower work function than the anode layer. Examples of suitable materials for the cathode layer include alkali metals of Group 1, Group 2 metals, Group 12 metals, including rare earth elements, lanthanides and actinides, materials such as aluminum, indium, calcium, barium, samarium and magnesium, and combinations thereof. Li-containing organometallic compounds, LiF, and $Li_2O$ may also be deposited between the organic layer and the cathode layer to lower the operating voltage. Suitable low work function metals include but are not limited to Al, Ag, Mg, Ca, Cu, Mg/Ag, LiF/Al, CsF, CsF/Al or alloys thereof. In some embodiments, a cathode layer can have a thickness in the range of about 1 nm to about 1000 nm.

In some embodiments, a light-emitting device may comprise at least one light-emitting layer or emissive layer, e.g. emissive layer 20, comprising a light-emitting component. The light-emitting layer may further comprise a host. Suitable host materials include, but are not limited to those described in co-pending patent applications, U.S. Patent Publication 2011/0140093 (Ser. No. 13/033,473, filed 23 Feb. 2011), U.S. Patent Publication 2012/0179089 (Ser. No. 13/232,837, filed 14 Sep. 2011); and/or U.S. Pat. No. 8,263,238, issued 11 Sep. 2011. In some embodiments, the host is selected from:

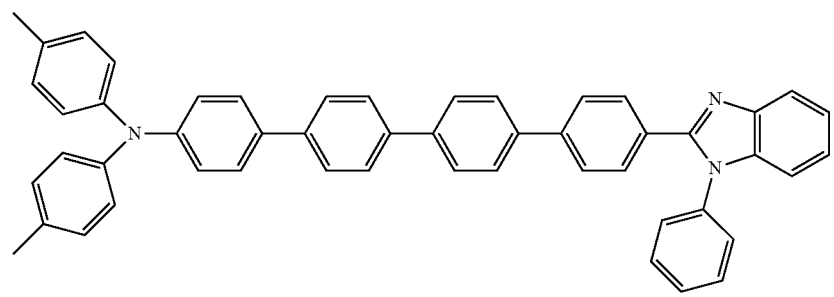

(Host-1)

4′′′-(1-phenyl-1H-benzo[d]imidazol-2-yl)-N,N-di-p-tolyl-[1,1′:4′,1′′:4′′,1′′′-quarterphenyl]-4-amine

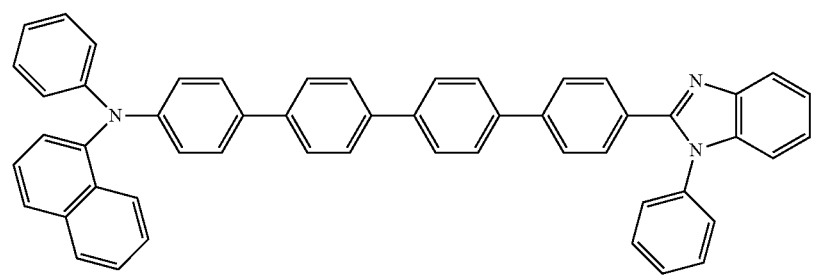

(Host-2)

9-(4′′′-(1-phenyl-1H-benzo[d]imidazol-2-yl)-[1,1′:4′,1′′:4′′,1′′′-quarterphenyl]-4-yl)9H-carbazole -continued

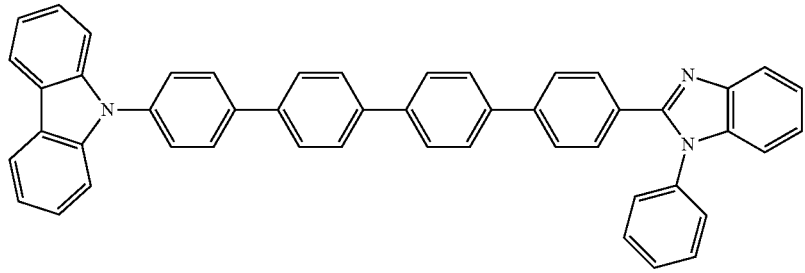

9-(4'''-(1-phenyl-1H-benzo[d]imidazol-2-yl)-[1,1':4',1":4",1"'-quarterphenyl]-4-yl)9H-carbazole (Host-3)

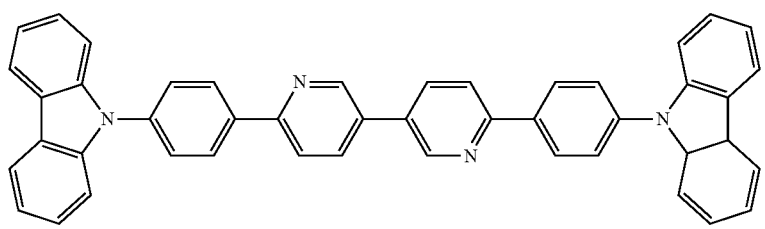

6,6'-bis(4-(9H-carbazol-9-yl)phenyl)-3,3'-bipyridine (Host-4)

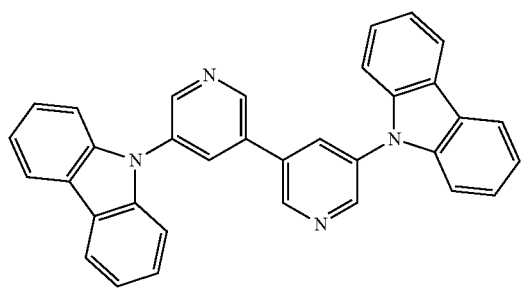

5,5'-di(9H-carbazol-9-yl)-3,3'-bipyridine (Host-5)

The amount of the host in a light-emitting layer may vary. In some embodiments, the amount of a host in a light-emitting layer is in the range of from about 70% to about 99.9% by weight of the light-emitting layer. In another embodiment, the amount of a host in a light-emitting layer is in the range of from about 90% to about 99% by weight of the light-emitting layer. In another embodiment, the amount of a host in a light-emitting layer is about 97% by weight of the light-emitting layer. In some embodiments, the mass of the light-emitting component is about 0.1% to about 10%, about 1% to about 5%, or about 3% of the mass of the light-emitting layer. The light-emitting component may be a fluorescent and/or a phosphorescent compound.

A light-emitting component may comprise an iridium coordination compound such as: bis-{2-[3,5-bis(trifluoromethyl)phenyl]pyridinato-N,C2'}iridium(III)-picolinate; bis (2-[4,6-difluorophenyl]pyridinato-N,C2')iridium (III) picolinate; bis(2-[4,6-difluorophenyl]pyridinato-N,C2')iridium (acetylacetonate); Iridium (III) bis(4,6-difluorophenylpyridinato)-3-(trifluoromethyl)-5-(pyridine-2-yl)-1,2,4-triazolate; Iridium (III) bis(4,6-difluorophenylpyridinato)-5-(pyridine-2-yl)-1H-tetrazolate; bis[2-(4,6-difluorophenyl)pyridinato-N,C2']iridium(III)tetra (1-pyrazolyl)borate; Bis[2-(2'-benzothienyl)-pyridinato-N,C3'] iridium (III)(acetylacetonate); Bis[(2-phenylquinolyl)-N,C2']iridium (III) (acetylacetonate); Bis[(1-phenylisoquinolinato-N,C2')]iridium (III) (acetylacetonate); Bis[(dibenzo[f, h]quinoxalino-N,C2')iridium (III)(acetylacetonate); Tris(2,5-bis-2'-(9',9'-dihexylfluorene)pyridine) iridium (III); Tris[1-phenylisoquinolinato-N,C2']iridium (III); Tris-[2-(2'-benzothienyl)-pyridinato-N,C3'] iridium (III); Tris[1-thiophen-2-ylisoquinolinato-N,C3']iridium (III); Tris[1-(9,9-dimethyl-9H-fluoren-2-yl)isoquinolinato-(N,C3')iridium (III)); Bis(2-phenylpyridinato-N,C2')iridium (III)(acetylacetonate) [Ir(ppy)₂(acac)]; Bis(2-(4-tolyl) pyridinato-N,C2')iridium(III)(acetylacetonate) [Ir(mppy)₂ (acac)]; Bis(2-(4-tert-butyl)pyridinato-N,C2')iridium (III) (acetylacetonate) [Ir(t-Buppy)₂(acac)]; Tris(2-phenylpyridinato-N,C2')iridium (III) [Ir(ppy)₃]; Bis(2-phenyloxazolinato-N,C2')iridium (III) (acetylacetonate) [Ir (op)₂(acac)]; Tris(2-(4-tolyl)pyridinato-N,C2')iridium(III) [Ir(mppy)₃]; Bis[2-phenylbenzothiazolato-N,C2'] iridium (III)(acetylacetonate); Bis[2-(4-tert-butylphenyl)benzothiazolato-N,C2']iridium(III)(acetylacetonate); Bis[(2-(2'-thienyl)pyridinato-N,C3')]iridium (III) (acetylacetonate); Tris [2-(9.9-dimethylfluoren-2-yl)pyridinato-(N,C3')] iridium (III); Tris[2-(9.9-dimethylfluoren-2-yl)pyridinato-(N,C3')] iridium (III); Bis[5-trifluoromethyl-2-[3-(N-phenylcarbzolyl)pyridinato-N,C2']iridium(III)(acetylacetonate); (2-Ph-PyCz)₂Ir(III)(acac); Bis[4-phenylthieno[3,2-c]pyridine] iridium(III)(acetylacetonate); etc.

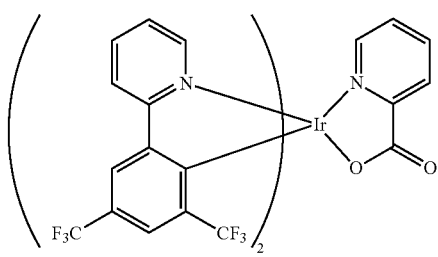

bis-{2-[3,5-bis(trifluoromethyl)phenyl]pyridinato-
N,C2'}iridium(III)-picolinate (Ir(CF₃ppy)₂(Pic)

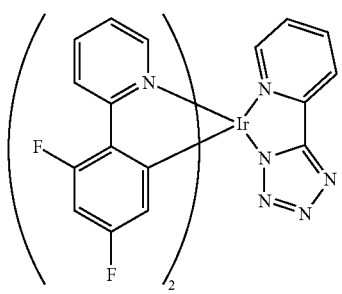

Irdium (III) bis(4,6-
difluorophenylpyridinato)-5-(pyridine-2-
yl)-1H-tetrazole (FIrN4)

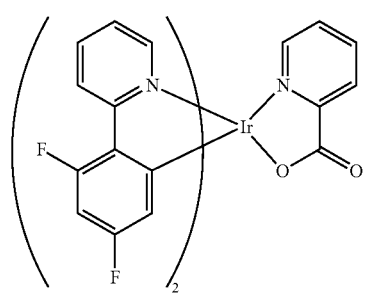

bis-(2-[4,6-difluorophenyl]pyridinato-
N,C2')iridium (III) picolinate [FIrPic]

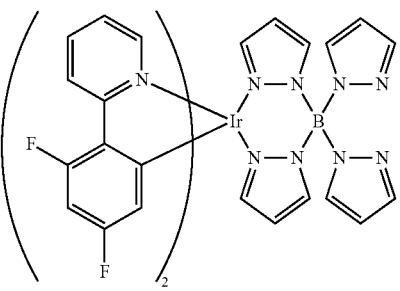

bis[2-(4,6-difluorophenyl)pyridinato-
N,C2']iridium(III)tetra(1-pyrazolyl)borate (Fir6)

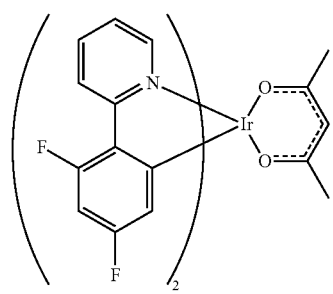

bis-(2-[4,6-difluorophenyl]pyridinato-
N,C2')iridium(acetylacetonate) [FIr(acac)]

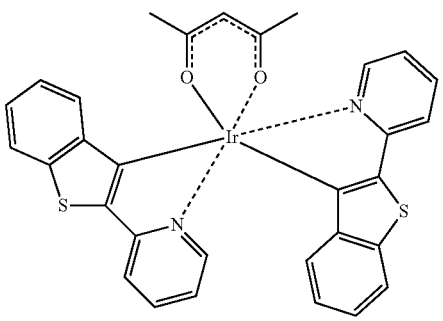

Ir(btp)₂(acac) 1

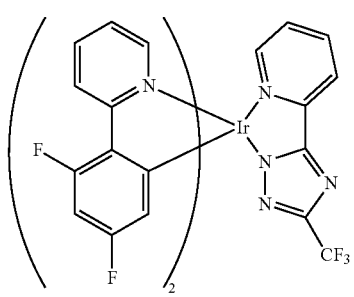

Irdium (III) bis(4,6-
difluorophenylpyridinato)-3-
(trifluoromethyl)-5-(pyridine-2-
yl)-1,2,4-triazolate (FIrtaz)

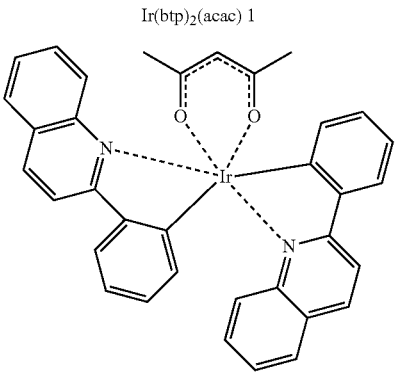

Ir(pq)₂(acac) 2

-continued

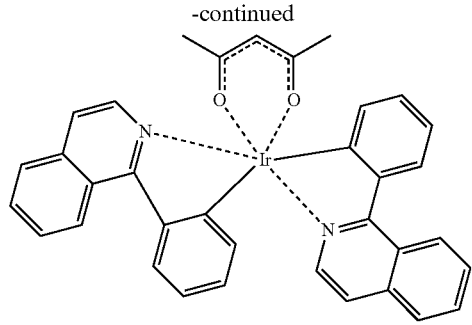

Ir(piq)₂(acac) 3

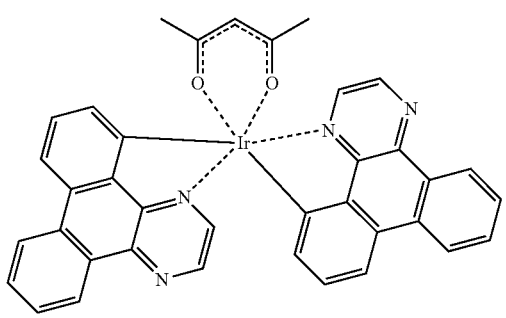

Ir(DBQ)₂(acac) 4

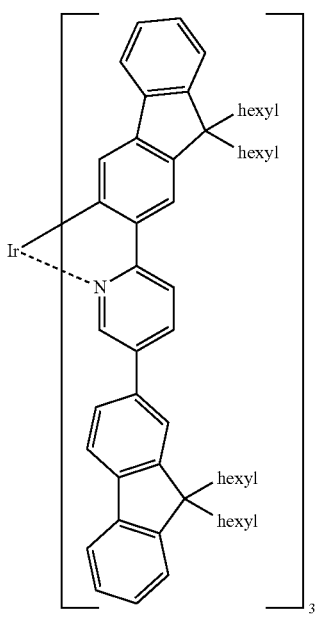

Ir(HFP)₃ 5

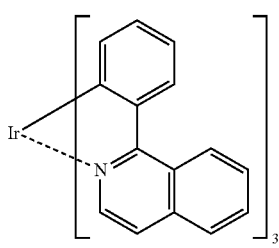

Ir(piq)₃ 6

-continued

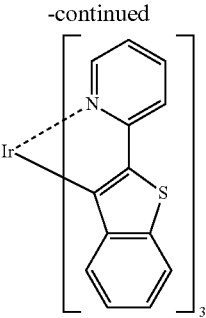

Ir(btp)₃ 7

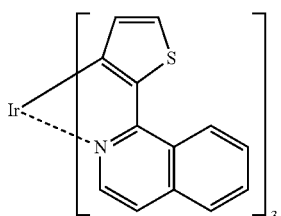

Ir(tiq)₃ 8

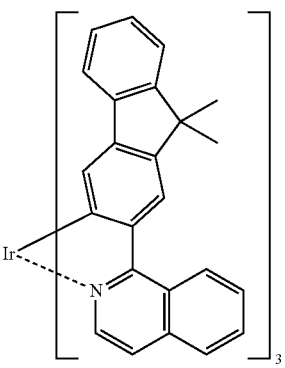

Ir(fli1)₃ 9

1. (Btp)₂Ir(III)(acac); Bis[2-(2'-benzothienyl)-pyridinato-N,C3'] iridium (III)(acetylacetonate)
2. (Pq)₂Ir(III)(acac); Bis[(2-phenylquinolyl)-N,C2']iridium (III) (acetylacetonate)
3. (Pq)₂Ir(III)(acac); Bis[(1-phenylisoquinolinato-N,C2')]iridium (III) (acetylacetonate)
4. (DBQ)₂Ir(acac); Bis[(dibenzo[f, h]quinoxalino-N,C2')iridium (III)(acetylacetonate)
5. [Ir(HFP)₃], Tris(2,5-bis-2'-(9',9'-dihexylfluorene)pyridine)iridium (III)
6. Ir(piq)₃; Tris[1-phenylisoquinolinato-N,C2']iridium (III)
7. Ir(btp)₃; Tris-[2-(2'-benzothienyl)-pyridinato-N,C3'] iridium (III)
8. Ir(tiq)₃, Tris[1-thiophen-2-ylisoquinolinato-N,C3']iridium (III)
9. Ir(fliq)₃; Tris[1-(9,9-dimethyl-9H-fluoren-2-yl)isoquinolinato-(N,C3')iridium (III))

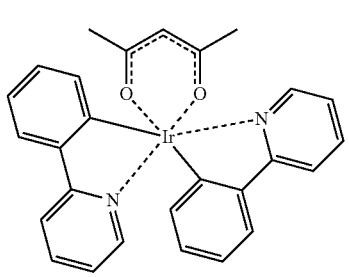

Ir(ppy)₂(acac)

-continued

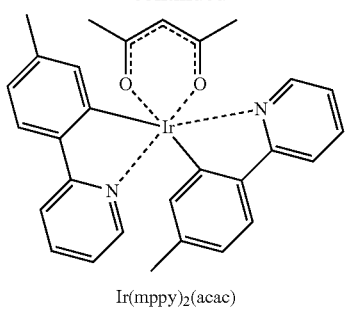

Ir(mppy)₂(acac)

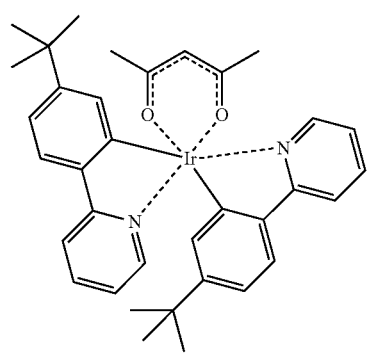

Ir(t-Buppy)₂(acac)

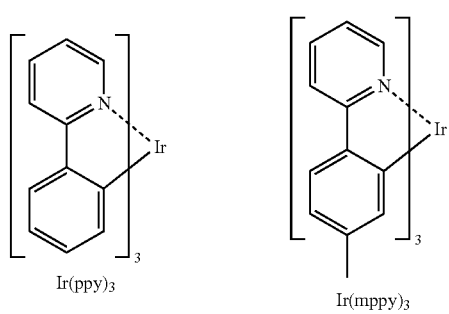

Ir(ppy)₃          Ir(mppy)₃

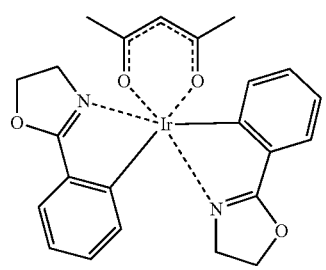

Ir(op)₂(acac)

-continued

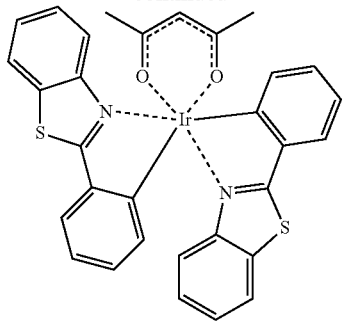

(bt)₂Ir(III)(acac)
Bis[2-
phenylbenzothiazolato-
N, C2′] iridium
(III)(acetylacetonate)

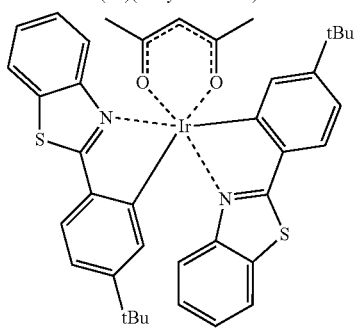

(t-bt)₂Ir(III)(acac)
Bis[2-4-tert-
butylphenyl)benzothiazolato-
N, C2′] iridium (III)(acetylacetonate)

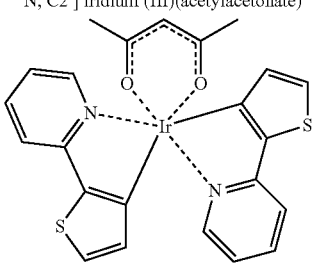

(thp)₂Ir(III)(acac)
Bis[(2-(2′-
thienyl)pyridinato-
N,C3′)]iridium (III)
(acetylacetonate)

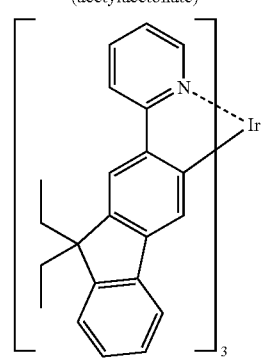

[Ir(Flpy)₃]
Tris[2-(9,9-dimethylfluoren-2-
yl)pyridinato-(N,C3′)]iridium (III)

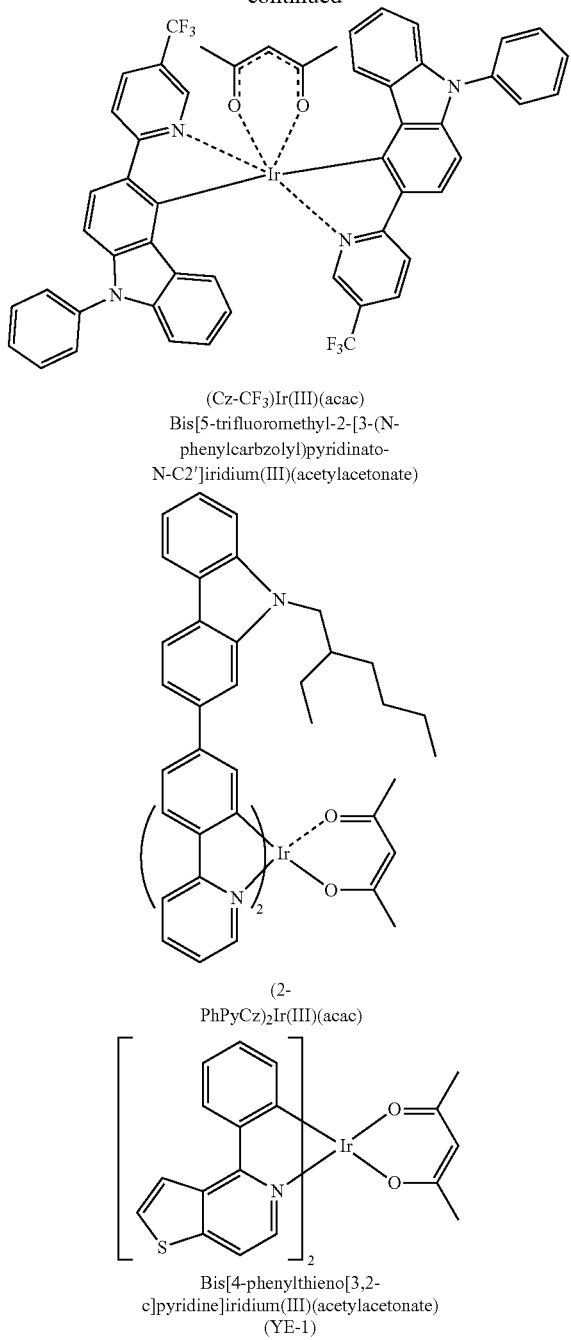

(Cz-CF₃)Ir(III)(acac)
Bis[5-trifluoromethyl-2-[3-(N-phenylcarbzolyl)pyridinato-N-C2']iridium(III)(acetylacetonate)

(2-PhPyCz)₂Ir(III)(acac)

Bis[4-phenylthieno[3,2-c]pyridine]iridium(III)(acetylacetonate)
(YE-1)

The thickness of a light-emitting layer may vary. In one embodiment, a light-emitting layer has a thickness in the range of from about 1 nm to about 150 nm or about 200 nm.

A light-emitting device comprises a hole-transport layer, e.g. hole transport layer 15, comprising a subject compound disposed between the anode and the light-emitting layer.

A device may also include other hole-transport materials and/or layers in addition to those comprising the subject compound. Some examples of additional hole-transport materials may include, but are not limited to, an aromatic-substituted amine, a carbazole, a polyvinylcarbazole (PVK), e.g. poly(9-vinylcarbazole); polyfluorene; a polyfluorene copolymer; poly(9,9-di-n-octylfluorene-alt-benzothiadiazole); poly(paraphenylene); poly[2-(5-cyano-5-methylhexyloxy)-1,4-phenylene]; a benzidine; a phenylenediamine; a phthalocyanine metal complex; a polyacetylene; a polythiophene; a triphenylamine; an oxadiazole; copper phthalocyanine; 1,1-Bis(4-bis(4-methylphenyl) aminophenyl) cyclohexane; 2,9-Dimethyl-4,7-diphenyl-1,10-phenanthroline; 3,5-Bis(4-tert-butyl-phenyl)-4-phenyl[1,2,4]triazole; 3,4,5-Triphenyl-1,2,3-triazole; 4,4',4'-tris(3-methylphenylphenylamino)triphenylamine (MTDATA); N,N'-bis(3-methylphenyl)N,N'-diphenyl-[1,1'-biphenyl]-4,4'-diamine (TPD); 4,4'-bis[N-(naphthyl)-N-phenylamino]biphenyl (α-NPD); 4,4',4"-tris(carbazol-9-yl)-triphenylamine (TCTA); 4,4'-bis[N,N'-(3-tolyl)amino]-3,3'-dimethylbiphenyl (HMTPD); 4,4'-N,N'-dicarbazole-biphenyl (CBP); 1,3-N,N-dicarbazole-benzene (mCP); Bis[4-(p,p'-ditolyl-amino)phenyl]diphenylsilane (DTASi); 2,2'-bis(4-carbazolylphenyl)-1,1'-biphenyl (4CzPBP); N,N'N"-1,3,5-tricarbazoloylbenzene (tCP); N,N'-bis(4-butylphenyl)-N,N'-bis(phenyl)benzidine; or the like.

In some embodiments, a light-emitting device may further comprise an electron-transport layer, e.g. electron-transport layer 30, disposed between the cathode and the light-emitting layer. Examples of electron-transport materials may include, but are not limited to, 2-(4-biphenylyl)-5-(4-tert-butylphenyl)-1,3,4-oxadiazole (PBD); 1,3-bis(N,N-t-butyl-phenyl)-1,3,4-oxadiazole (OXD-7), 1,3-bis[2-(2,2'-bipyridine-6-yl)-1,3,4-oxadiazo-5-yl]benzene; 3-phenyl-4-(1'-naphthyl)-5-phenyl-1,2,4-triazole (TAZ); 2,9-dimethyl-4,7-diphenyl-phenanthroline (bathocuproine or BCP); aluminum tris(8-hydroxyquinolate) (Alq3); and 1,3,5-tris(2-N-phenylbenzimidazolyl)benzene; 1,3-bis[2-(2,2'-bipyridine-6-yl)-1,3,4-oxadiazo-5-yl]benzene (BPY-OXD); 3-phenyl-4-(1'-naphthyl)-5-phenyl-1,2,4-triazole (TAZ), 2,9-dimethyl-4,7-diphenyl-phenanthroline (bathocuproine or BCP); and 1,3,5-tris[2-N-phenylbenzimidazol-z-yl]benzene (TPBI). In one embodiment, the electron transport layer is aluminum quinolate (Alq₃), 2-(4-biphenylyl)-5-(4-tert-butylphenyl)-1,3,4-oxadiazole (PBD), phenanthroline, quinoxaline, 1,3,5-tris[N-phenylbenzimidazol-z-yl] benzene (TPBI), or a derivative or a combination thereof.

If desired, additional layers may be included in the light-emitting device. These additional layers may include an electron injecting layer (EIL), a hole-blocking layer (HBL), an exciton-blocking layer (EBL), a hole-injecting layer (HIL), etc. In addition to separate layers, some of these materials may be combined into a single layer.

In some embodiments, the light-emitting device can include an electron-injecting layer between the cathode layer and the light-emitting layer. Examples of suitable material(s) that can be included in the electron injecting layer include but are not limited to, an optionally substituted compound selected from the following: aluminum quinolate (Alq₃), 2-(4-biphenylyl)-5-(4-tert-butylphenyl)-1,3,4-oxadiazole (PBD), phenanthroline, quinoxaline, 1,3,5-tris[N-phenyl-benzimidazol-z-yl]benzene (TPBI) a triazine, a metal chelate of 8-hydroxyquinoline such as tris(8-hydroxyquinoliate) aluminum, and a metal thioxinoid compound such as bis(8-quinolinethiolato) zinc. In one embodiment, the electron injecting layer is aluminum quinolate (Alq₃), 2-(4-biphenylyl)-5-(4-tert-butylphenyl)-1,3,4-oxadiazole (PBD), phenanthroline, quinoxaline, 1,3,5-tris[N-phenylbenzimidazol-z-yl] benzene (TPBI), or a derivative or a combination thereof.

In some embodiments, the device can include a hole-blocking layer, e.g., between a cathode and a light-emitting layer. Suitable hole-blocking material(s) include but are not limited to, an optionally substituted compound selected from the following: bathocuproine (BCP), 3,4,5-triphenyl-1,2,4-triazole, 3,5-bis(4-tert-butyl-phenyl)-4-phenyl-[1,2,4] triazole, 2,9-dimethyl-4,7-diphenyl-1,10-phenanthroline, and 1,1-bis(4-bis(4-methyl phenyl)aminophenyl)-cyclohexane.

In some embodiments, the light-emitting device can include an exciton-blocking layer, e.g., between a light-emitting layer and an anode. In an embodiment, the band gap of the material(s) that comprise exciton-blocking layer is large enough to substantially prevent the diffusion of excitons. Examples of material(s) that can compose an exciton-blocking layer include an optionally substituted compound selected from the following: aluminum quinolate ($Alq_3$), 4,4'-bis[N-(naphthyl)-N-phenylamino]biphenyl (α-NPD), 4,4'-N,N'-dicarbazole-biphenyl (CBP), and bathocuproine (BCP), and any other material(s) that have a large enough band gap to substantially prevent the diffusion of excitons.

In some embodiments, a light-emitting device can include a hole-injecting layer, e.g., between the light-emitting layer and the anode. Examples of suitable hole-injecting material(s) include, but are not limited to, an optionally substituted compound selected from the following: a polythiophene derivative such as poly(3,4-ethylenedioxythiophene (PEDOT)/polystyrene sulphonic acid (PSS), a benzidine derivative such as N, N, N', N'-tetraphenylbenzidine, poly(N,N'-bis(4-butylphenyl)-N,N'-bis(phenyl)benzidine), a triphenyl amine or phenylenediamine derivative such as N,N'-bis(4-methylphenyl)-N,N'-bis(phenyl)-1,4-phenylenediamine, 4,4',4"-tris(N-(naphthylen-2-yl)-N-phenylamino) triphenylamine, an oxadiazole derivative such as 1,3-bis(5-(4-diphenylamino)phenyl-1,3,4-oxadiazol-2-yl)benzene, a polyacetylene derivative such as poly(1,2-bis-benzylthioacetylene), and a phthalocyanine metal complex derivative such as phthalocyanine copper.

Light-emitting devices comprising a subject compound can be fabricated using techniques known in the art, as informed by the guidance provided herein. For example, a glass substrate can be coated with a high work functioning metal such as ITO which can act as an anode. After patterning the anode layer, a hole-injecting and/or hole-transport layer may be deposited on the anode in that order. A light-emitting layer that includes a light-emitting component, can be deposited on the anode, the hole-transport layer, or the hole-injecting layer. The light-emitting layer may contain a subject compound. An electron-transport layer and/or an electron-injecting layer may deposited in that order on the light-emitting component. The cathode layer, comprising a low work functioning metal (e.g., Mg:Ag), can then be deposited, e.g., by vapor deposition or sputtering. The device may also contain an exciton-blocking layer, an electron-blocking layer, a hole-blocking layer, a second light-emitting layer, or other layers that can be added to the device using suitable techniques.

The subject compounds may have high photostability and thermal stability in organic light-emitting devices. This may provide OLED devices with high efficiencies and/or long lifetimes. In some embodiments, a device having a structure: ITO/PEDOT(40 nm)/HTM(40 nm)/HOST-4:YE-1(565 nm) (6 wt %) (30 nm)/TPBI(30 nm)/LiF—Al(120 nm), wherein the subject compound is the hole-transport layer (HTM), has a lifetime of at least about 70 h at an initial brightness ($B_o$) of about 10000 nit (cd/m²).

The shorthand structure for an OLED: ITO/PEDOT(40 nm)/HTM(40 nm)/HOST-4:YE-1 (565 nm) (6 wt %) (30 nm)/TPBI(30 nm)/LiF-Al(120 nm) indicates that an ITO/PEDOT anode has a 40 mm thickness; a hole-transport layer (HTM) having a thickness of 40 nm is disposed on the anode; an emissive layer comprising a HOST-4 host and 6% YE-1 emissive dopant; and having a peak emission of 565 nm and a thickness of 30 nm is disposed on the hole-transport layer; a TPBI electron-transport layer has a thickness of 30 nm and is disposed on the emissive layer; and a Li—Fl cathode having a thickness of 120 nm is disposed on the electron-transport layer. Similar shorthand structures have similar meanings, where a "/" indicates a boundary between layers, and the materials, thicknesses, and other properties of the layers are indicated.

In some embodiments, a device having a structure: ITO/PEDOT(40 nm)/HTM(40 nm)/HOST-4:YE-1(565 nm) (6 wt %) (30 nm)/TPBI(30 nm)/LiF-A(120 nm), wherein the subject compound is the hole-transport layer, has a power efficiency (PE) of at least about 35 lm/W, at least about 40 lm/W, or at least about 50 lm/W at a brightness of about 1000 cd/m².

In some embodiments, a device having a structure: ITO/PEDOT(40 nm)/HTM(40 nm)/HOST-4:YE-1(565 nm) (6 wt %) (30 nm)/TPBI(30 nm)/LiF-A(120 nm), wherein the subject compound is the hole-transport layer, has a luminous efficiency (CE) of at least about 55 cd/A, at least about 60 cd/A, or at least about 70 cd/A at a brightness of about 1000 cd/m².

In some embodiments, a device having a structure: ITO/PEDOT(40 nm)/HTM(40 nm)/HOST-4:YE-1(565 nm) (6 wt %) (30 nm)/TPBI(30 nm)/LiF-A(120 nm), wherein the subject compound is the hole-transport layer, has an external quantum efficiency (EQE) of at least about 18%, at least about 19%, at least about 20%, or at a brightness of about 1000 cd/m².

In some embodiments, OLED device comprising a subject compound may have an efficiency greater than about 100 lm/w, a color rendering index (CRI) greater than about 80, and/or an operating time greater than about 10,000 hours at 1,000 cd/m².

The following non-limiting embodiments are contemplated:

Embodiment 1

A compound represented by a formula:

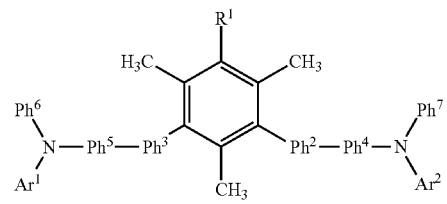

wherein $R^1$ is H, $C_{1-6}$ alkyl, or $C_{1-6}$ alkoxy;
$Ph^2$ and $Ph^3$ are independently p-phenylene optionally substituted with 1, 2, or 3 substituents;
$Ph^4$ and $Ph^5$ are independently a bond or p-phenylene optionally substituted with 1, 2, or 3 substituents;
$Ph^6$ and $Ph^7$ are independently phenyl optionally substituted with 1, 2, 3, or 4 substituents, or biphenyl optionally substituted with 1, 2, 3, 4, 5, or 6 substituents; and
$Ar^1$ and $Ar^2$ are independently phenyl optionally substituted with 1, 2, 3, or 4 substituents, biphenyl optionally substituted with 1, 2, 3, 4, 5, or 6 substituents, or naphthalenyl optionally substituted with 1, 2, 3, 4, or 5 substituents;
wherein the substituents of p-phenylene, phenyl, biphenyl, or naphthalenyl are independently selected from $C_{1-6}$ alkyl and $C_{1-6}$ alkoxy.

Embodiment 2

The compound of embodiment 1, wherein $R^1$ is H.

Embodiment 3

The compound of embodiment 1, wherein $Ph^2$ is unsubstituted.

Embodiment 4

The compound of embodiment 1, wherein $Ph^3$ is unsubstituted.

Embodiment 5

The compound of embodiment 1, wherein $Ph^4$ is unsubstituted p-phenylene.

Embodiment 6

The compound of embodiment 1, wherein $Ph^4$ is a bond.

Embodiment 7

The compound of embodiment 1, wherein $Ph^5$ is unsubstituted p-phenylene.

Embodiment 8

The compound of embodiment 1, wherein $Ph^5$ is a bond.

Embodiment 9

The compound of embodiment 1, wherein $Ph^6$ is:

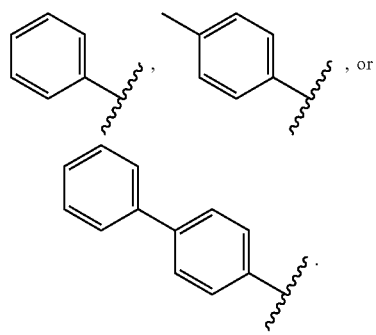

Embodiment 10

The compound of embodiment 1, wherein $Ph^7$ is:

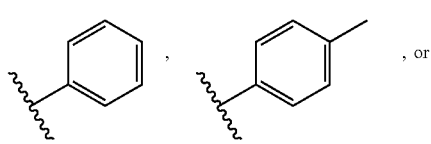

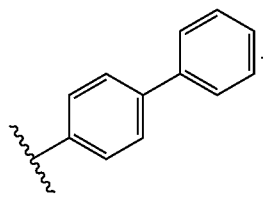

Embodiment 11

The compound of embodiment 1, wherein $Ar^1$ is:

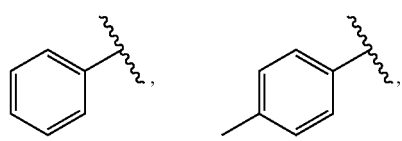

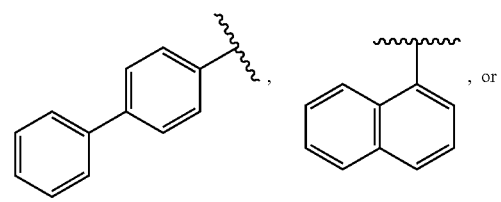

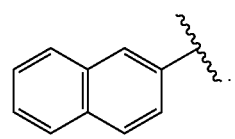

Embodiment 12

The compound of embodiment 1, wherein $Ar^2$ is:

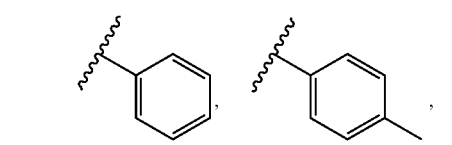

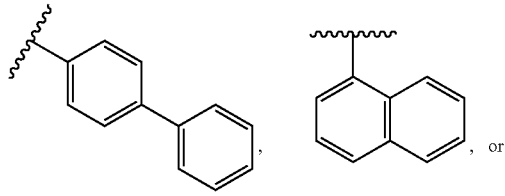

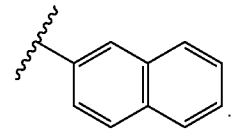

Embodiment 13
The compound of embodiment 1, selected from:
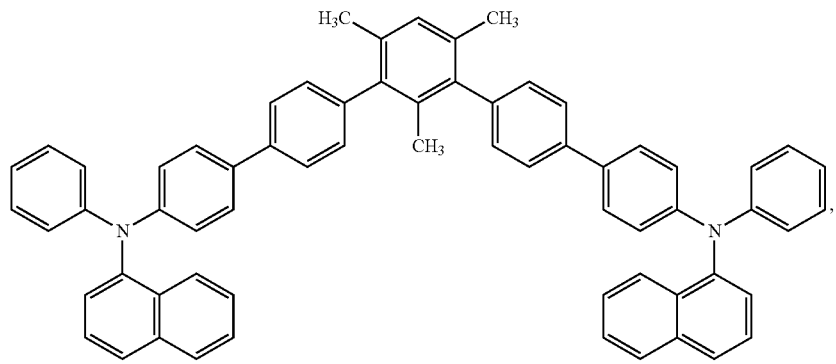
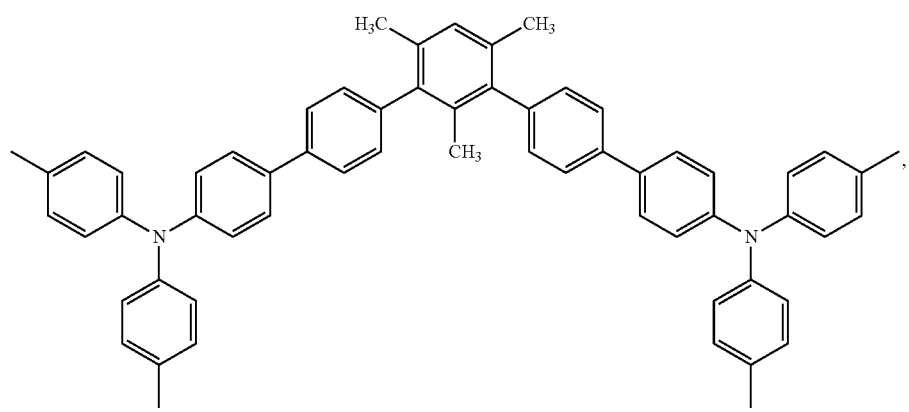
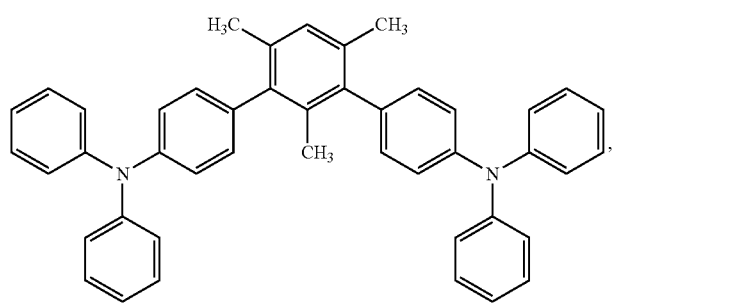
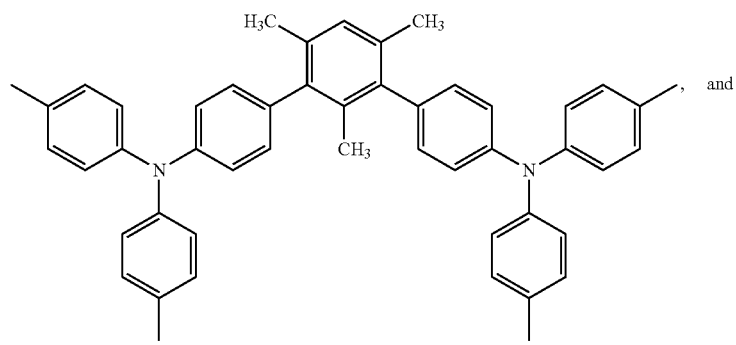

-continued

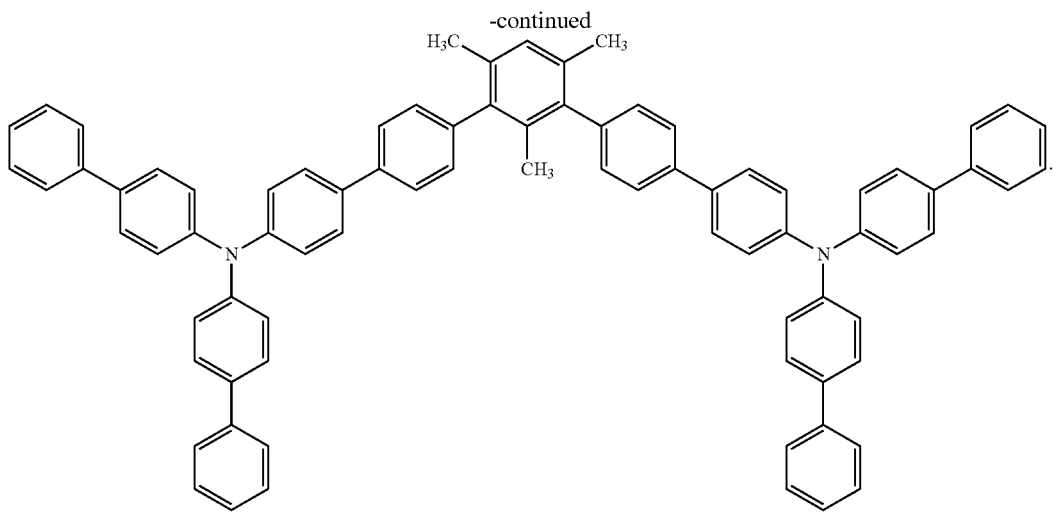

Embodiment 14

A compound represented by a formula:

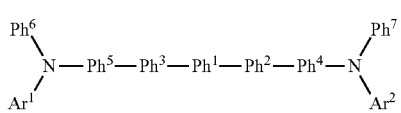

wherein $Ph^1$ is optionally substituted m-phenylene;
$Ph^2$ and $Ph^3$ are independently optionally substituted p-phenylene;
$Ph^4$ and $Ph^5$ are independently a bond or optionally substituted p-phenylene;
$Ph^6$ and $Ph^7$ are independently optionally substituted phenyl or optionally substituted biphenyl; and
$Ar^1$ and $Ar^2$ are independently optionally substituted phenyl, optionally substituted biphenyl, or optionally substituted naphthalenyl.

Embodiment 15

The compound of embodiment 14, wherein a hole mobility of the compound is greater an electron mobility of the compound.

Embodiment 16

The compound of embodiment 14 wherein $Ph^1$ is:

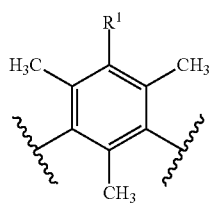

wherein $R^1$ is H, $C_{1-6}$ alkyl, or $C_{1-6}$ alkoxy.

Embodiment 17

The compound of embodiment 14, wherein $Ph^2$ is unsubstituted.

Embodiment 18

The compound of embodiment 14, wherein $Ph^3$ is unsubstituted.

Embodiment 19

The compound of embodiment 14, wherein $Ph^4$ is unsubstituted p-phenylene.

Embodiment 20

The compound of embodiment 14, wherein $Ph^4$ is a bond.

Embodiment 21

The compound of embodiment 14, wherein $Ph^5$ is unsubstituted p-phenylene.

Embodiment 22

The compound of embodiment 14, wherein $Ph^5$ is a bond.

Embodiment 23

A light-emitting device comprising a compound according to any one of embodiments 1-22.

Synthetic Procedures

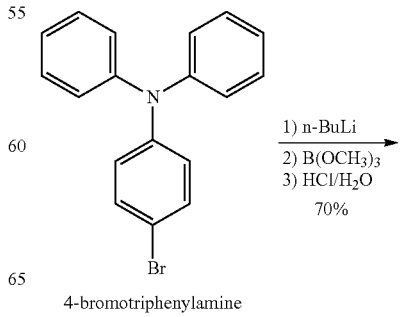

4-bromotriphenylamine

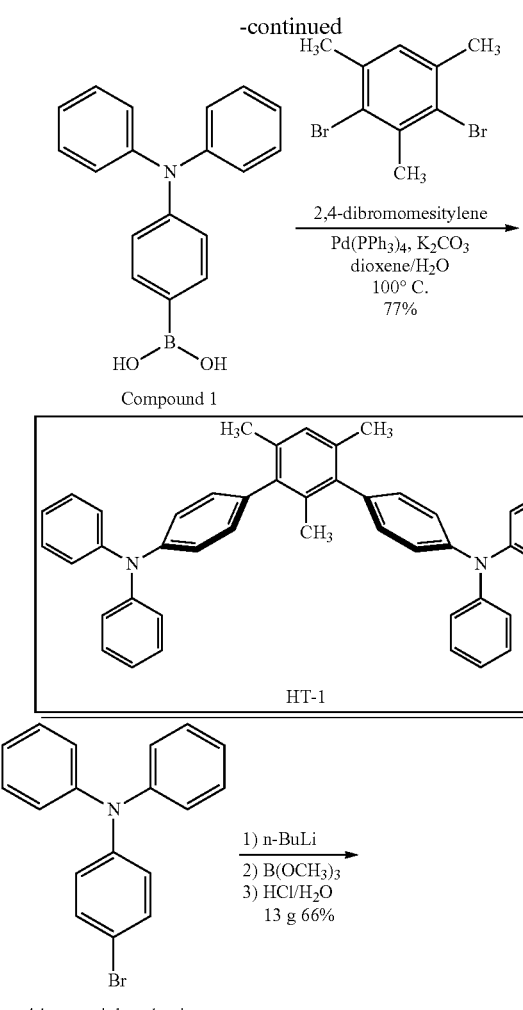

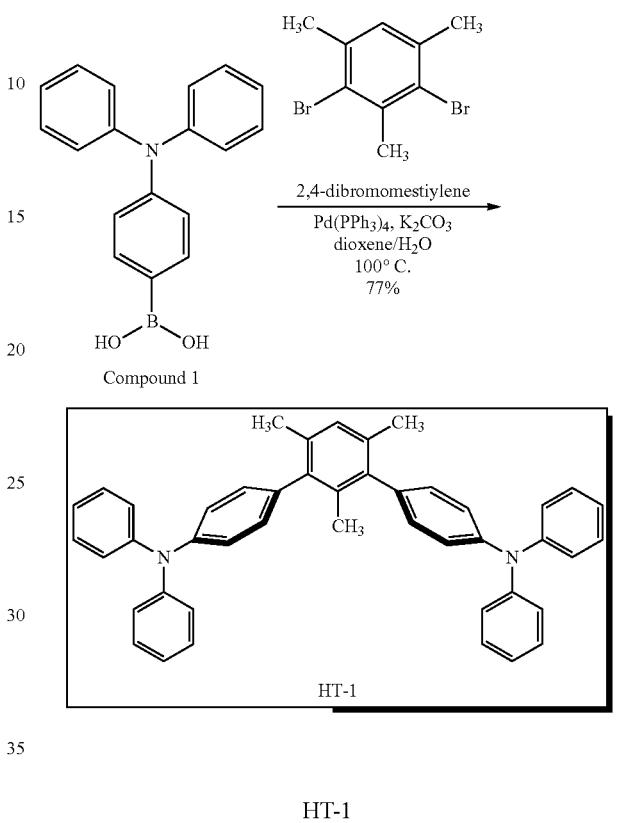

organic phase was dried over sodium sulphate. After removal of solvent, the remaining material was recrystallized in dichloromethane and hexanes to give a white solid (Compound 1) (13 g, 66% yield).

HT-1

A mixture of (4-(diphenylamino)phenyl)boronic acid (Compound 1) (2.88 g, 10 mmol), 2,4-dibromomesitylene (1.25 g, 4.5 mmol), Pd(PPh$_3$)$_4$ (0.46 g, 0.4 mmol) and K$_2$CO$_3$ (5.52 g, 40 mmol) in 1,4-dioxane/water (5 mL/1 mL) was degassed and heated at about 100° C. overnight. The mixture was worked up with ethyl acetate (100 mL) and brine (100 mL). The organic phase was then collected and dried over Na$_2$SO$_4$, then loaded on silica gel, then purified by flash column chromatography (hexanes/ethyl acetate 80:1 to 40:1) to give a white solid (HT-1) (2.10 g, 77% yield). LCMS (APCI): calcd for C$_{45}$H$_{39}$N$_2$(M+H)=607. found: 607.

(4-(diphenylamino)phenyl)boronic acid (Compound 1)

To a solution of 4-bromotriphenylamine (22.0 g, 68 mmol) in THF (170 mL) was added n-BuLi solution (2.5 M in hexanes, 30 mL, 75 mmol) at about −78° C. slowly. The whole was stirred at about −78° C. for about 5 hours. Then, a freshly distilled trimethylborate (8.8 mL, 80 mmol) was added. The mixture was stirred at room temperature for about 2 days. To the resulting solution, 150 mL 5% HCl solution was added and stirred overnight. After the organic phase was separated and collected, the aqueous phase was extracted with ethyl acetate (200 mL×2). The collected

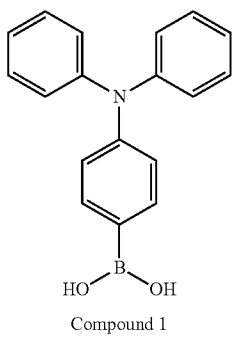

Compound 1

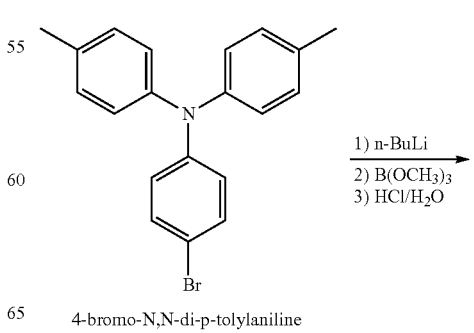

4-bromo-N,N-di-p-tolylaniline

-continued

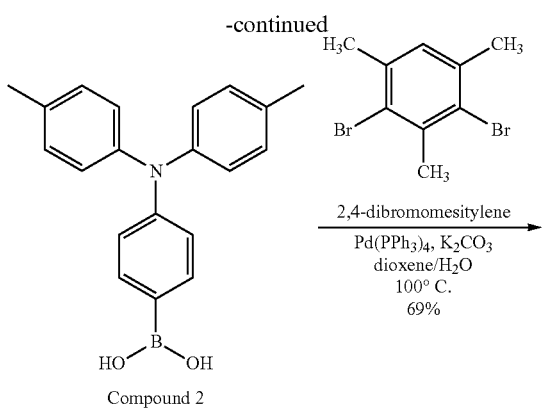

Compound 2

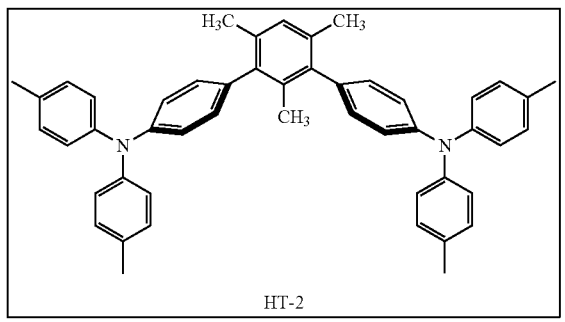

HT-2

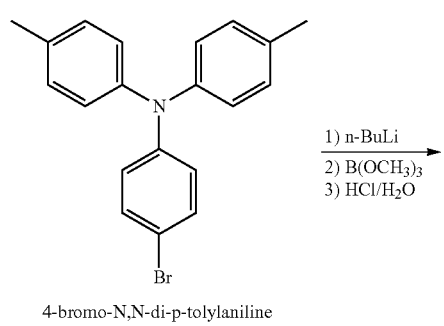

4-bromo-N,N-di-p-tolylaniline

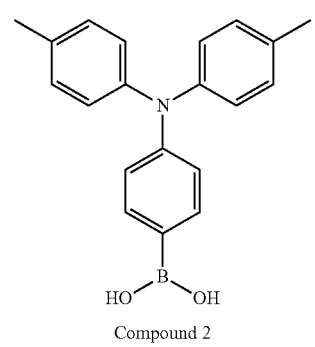

Compound 2

(4-(di-p-tolylamino)phenyl)boronic acid (Compound 2)

To a solution of 4-bromo-N,N-di-p-tolylaniline (6.63 g, 18.8 mmol) in THF (50 mL) was added n-BuLi solution (2.5 M, 8.9 mL, 22 mmol) at about −78° C. slowly. The mixture was kept at about −78° C. for about 5 hours and freshly distilled trimethylborate (3 mL) was added. The resulting mixture was stirred at room temperature for about 2 days, then 5% HCl solution (75 mL) was added and stirred for overnight. The solution was extracted with ethyl acetate (150 mL×2), and the organic phase was collected, dried over $Na_2SO_4$, and concentrated. The solid was washed with dichloromethane (100 mL), and filtered to give a yellow solid ((1.40 g) and the filtrate was purified by flash column (hexanes/ethyl acetate 9:1 to 3:1) to give a white solid (1.2 g). Total is 2.6 g, 44% yield).

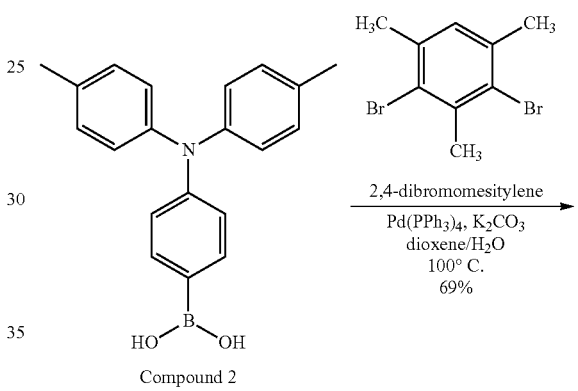

Compound 2

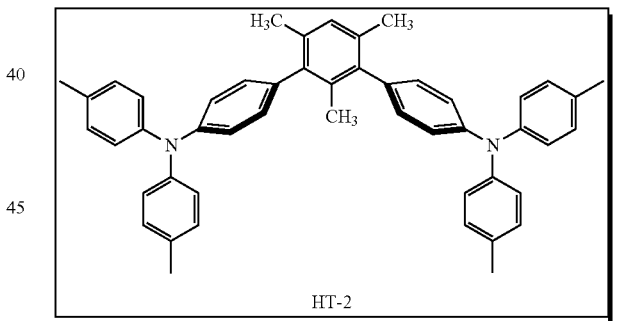

HT-2

A mixture of (4-(di-p-tolylamino)phenyl)boronic acid (Compound 2) (1.0 g, 3.15 mmol), 2,4-dibromomesitylene (0.43 g, 1.5 mmol), $Pd(PPh_3)_4$ (0.17 g, 0.15 mmol) and $K_2CO_3$ (2.0 g, 15 mmol) in 1,4-dioxane/water (6 mL/1 mL) was degassed and heated at about 100° C. for about 20 hours. The mixture was then worked up with water/dichloromethane. The organic phase was collected and dried over $Na_2SO_4$, purified by flash column (hexanes/ethyl acetate 80:1 to 40:1) to give a white solid (HT-2) (0.69 g, 69% yield). LCMS (APCI): calcd for $C_{49}H_{47}N_2(M+H)=663$. Found: 663.

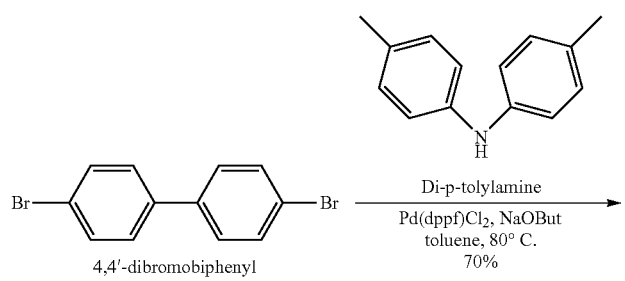
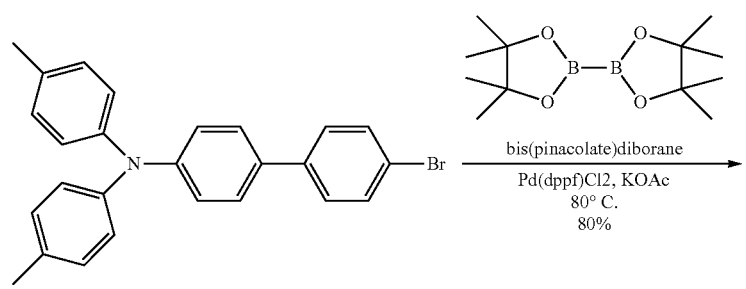
Compound 3
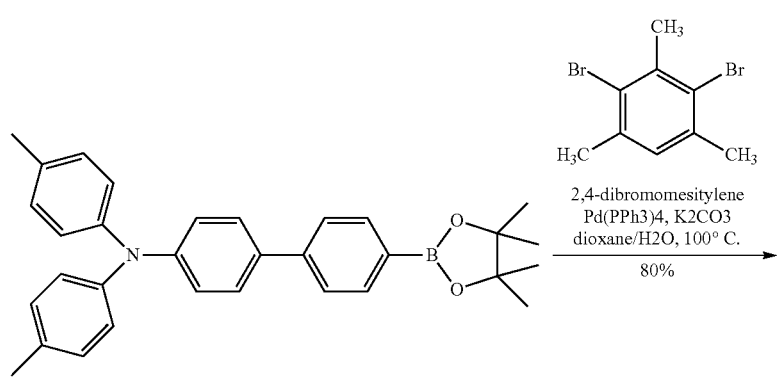
Compound 4
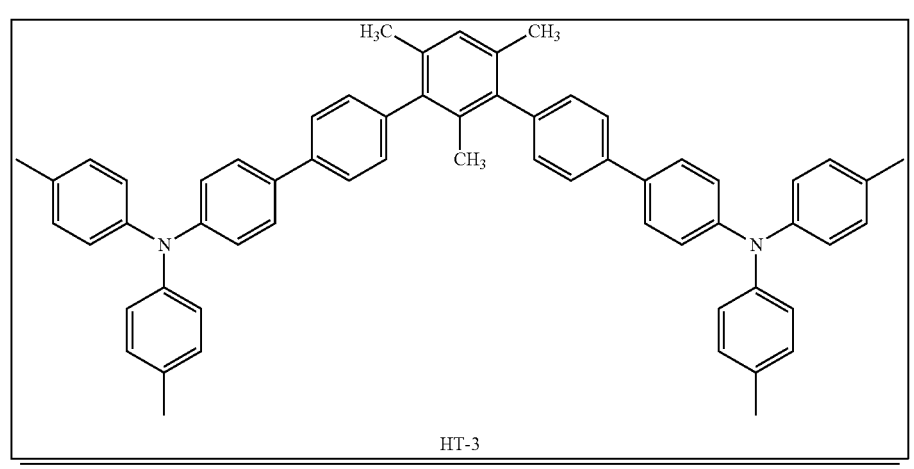
HT-3

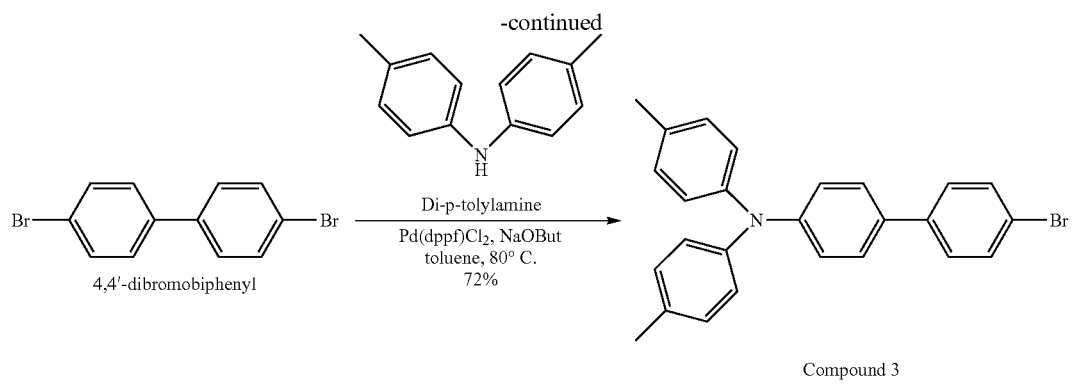

Compound 3

4'-bromo-N,N-di-p-tolylbiphenyl-4-amine (Compound 3)

Di-p-tolylamine (6.0 g, 30.4 mmol), 4,4'-dibromobiphenyl (23.7 g, 76.0 mmol), sodium tert-butoxide (7.26 g, 91.2 mmol), and [1,1-bis(diphenylphosphino)ferrocene]palladium(II)dichloride (Pd(dppf)Cl$_2$) (666 mg, 0.912 mmol, 3 mol %) were added to anhydrous toluene (about 250 ml) and degassed in argon for about 30 minutes. The resulting mixture was heated to about 80° C. for about 6 hours, after which a TLC analysis indicated that most of the di-p-tolylamine was consumed. After being cooled to RT, the mixture was poured into saturated aqueous sodium bicarbonate and extracted with 2 portions of ethyl acetate. The organic layers were pooled and washed with water and brine, then dried over MgSO$_4$. After filtration the extract was concentrated to dryness on a rotary evaporator, then loaded onto silica gel. A flash column (gradient of 100% hexane to 1% methylene chloride in hexane) resulted in 9.4 g (72%) of a white solid (Compound 3) confirmed by $^1$H NMR in CDCl$_3$.

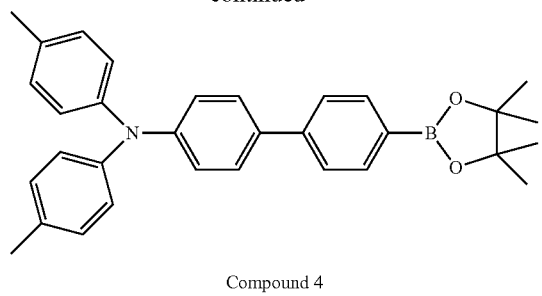

Compound 4

4'-(4,4,5,5-tetramethyl-1,3,2-dioxaborolan-2-yl)-N, N-di-p-tolyl-[1,1'-biphenyl]-4-amine (Compound 4)

A mixture of Compound 3 (2.0 g, 4.67 mmol), bis(pinacolate)diborane (1.27 g, 5 mmol), Pd(dppf)Cl$_2$ (0.18 g, 0.25 mmol) and potassium acetate (0.98 g, 10 mmol) in anhydrous dioxane (50 ml) was degassed and heated at 80° C. for 16 hours. After being cooled to RT, the whole was poured into ethyl acetate (100 ml) and filtered off solid. The organic solution was loaded on silica gel, and purified by flash column (hexanes/ethyl acetate 6:1) to give a white solid (Compound 3)(1.5 g, in 68% yield).

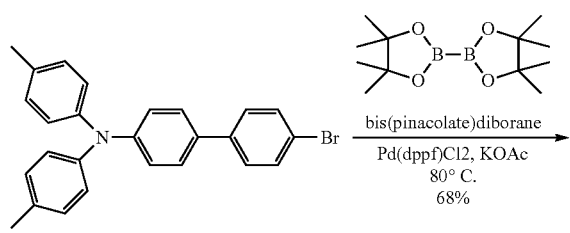

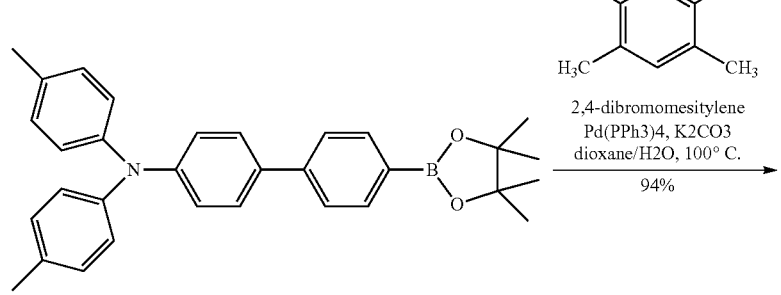

Compound 4

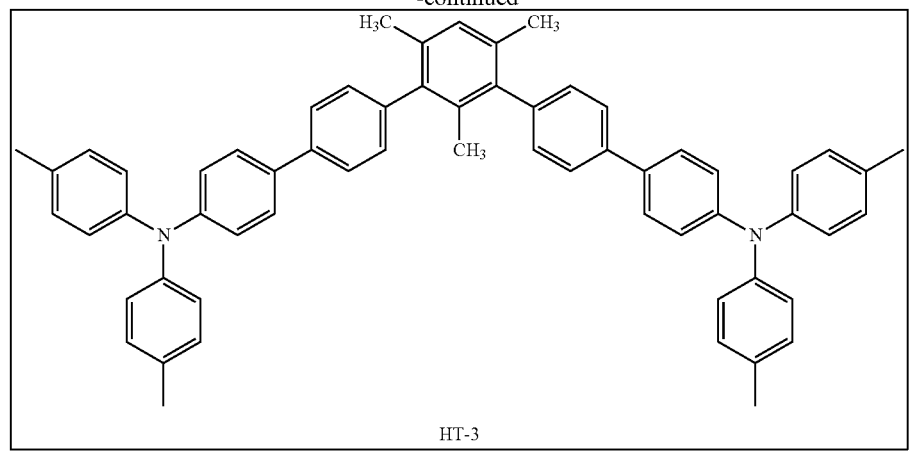

HT-3

HT-3

A mixture of 4'-(4,4,5,5-tetramethyl-1,3,2-dioxaborolan-2-yl)-N,N-di-p-tolyl-[1,1'-biphenyl]-4-amine (Compound 4) (2.0 g, 4.21 mmol), 2,4-dibromomesitylene (0.585 g, 2.1 mmol), Pd(PPh$_3$)$_4$ (0.115 g, 0.1 mmol) and K$_2$CO$_3$ (2.0 g, 14 mmol) in 1,4-dioxane/water (40 mL/10 mL) was degassed and heated at about 100° C. overnight. After cooling to room temperature, the mixture was poured into dichloromethane (150 mL) and then washed with water (150 mL). The organic fraction was collected, dried over Na$_2$SO$_4$, loaded on silica gel and purified by flash column (hexanes/ethyl acetate 40:1). The desired fraction was collected, concentrated and recrystallized in hexanes/ethyl acetate (−10° C.) to give a white solid (1.62 g, 94% yield). LCMS (APCI): calcd for C$_{61}$H$_{55}$N$_2$(M+H)=815. Found: 815.

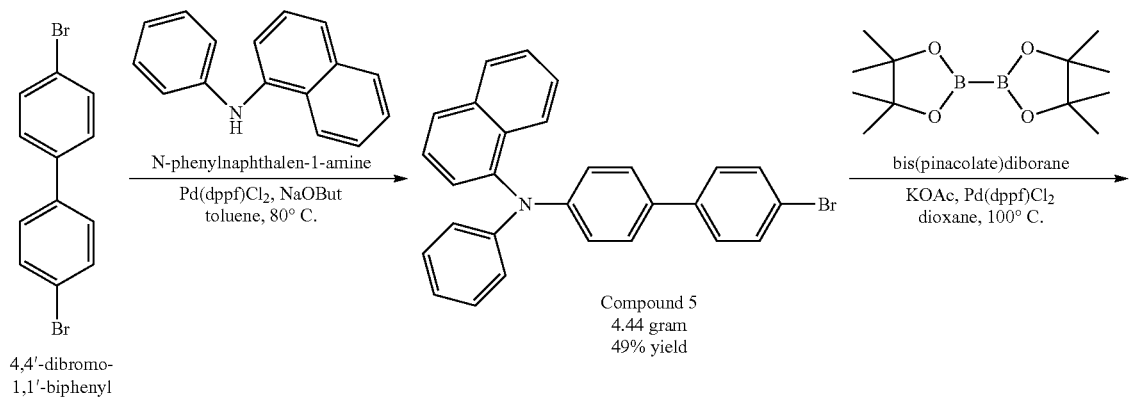

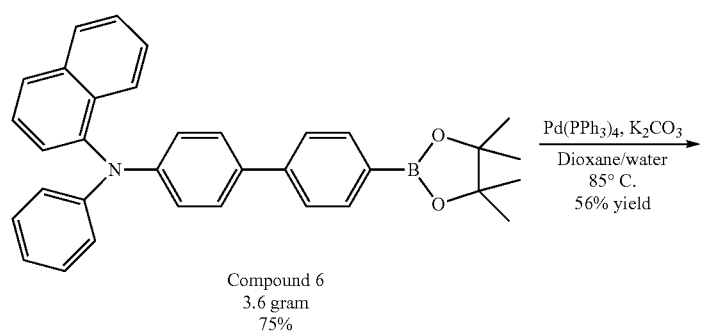

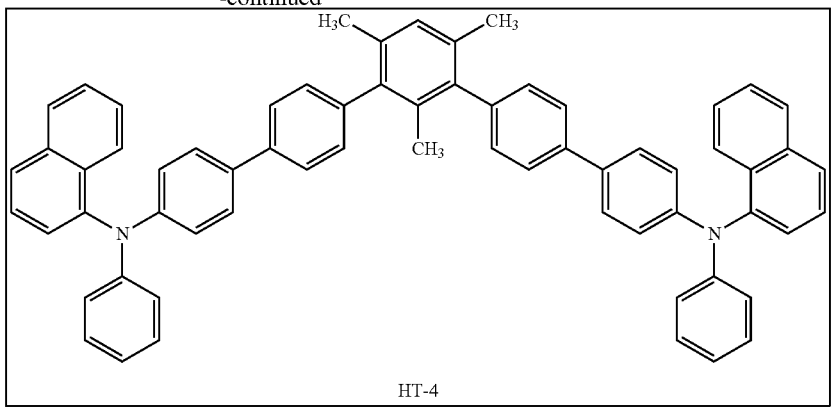

HT-4

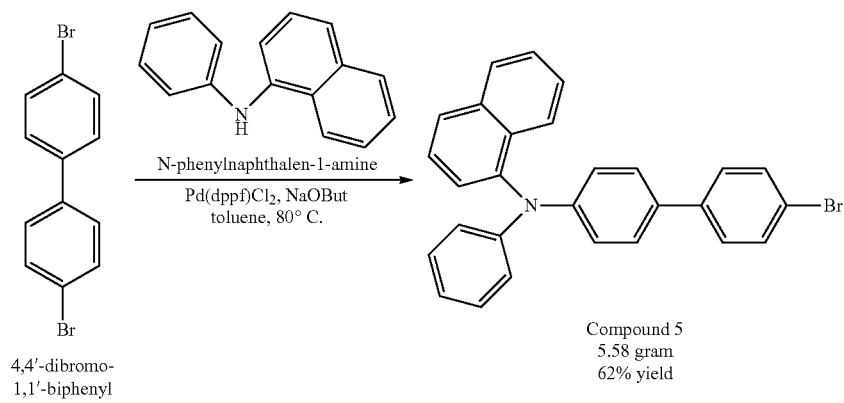

4,4'-dibromo-1,1'-biphenyl

Compound 5
5.58 gram
62% yield

N-(4'-bromo-[1,1'-biphenyl]-4-yl)-N-phenylnaphthalen-1-amine (Compound 5)

A mixture of N-phenylnaphthalen-1-amine (4.41 g, 20 mmol), 4,4'-dibromo-1,1'-biphenyl (15 g, 48 mmol), sodium tert-butoxide (4.8 g, 50 mmol) and Pd(dppf)C$_2$ (0.44 g, 0.6 mmol) in anhydrous toluene (100 ml) was degassed and heated at about 80° C. for about 10 hours. After cooling to RT, the mixture was poured into dichloromethane (400 ml) and stirred for about 30 min, then washed with brine (100 ml). The organic was collected and dried over Na$_2$SO$_4$, loaded on silica gel, and purified by flash column (hexanes to hexanes/ethyl acetate 90:1) to give a solid which was washed with methanol and dried under air to give a white solid (Compound 5) (5.58 g, in 62% yield).

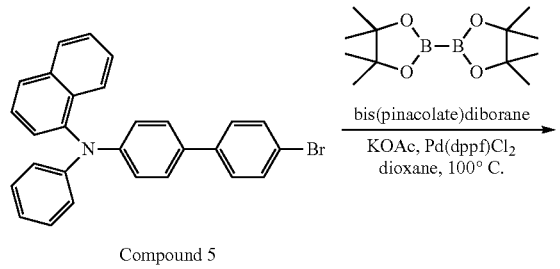

Compound 5

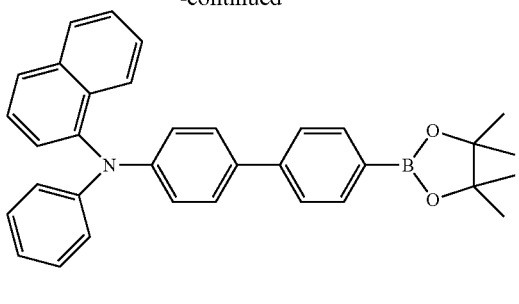

Compound 6
5.5 gram
90%

N-phenyl-N-(4'-(4,4,5,5-tetramethyl-1,3,2-dioxaborolan-2-yl)-[1,1'-biphenyl]-4-yl)naphthalen-1-amine (Compound 6)

A mixture of Compound 5 (5.5 g, 12.2 mmol), bis(pinacolate)diborane (3.10 g, 12.2 mmol), Pd(dppf)Cl$_2$ (0.446 mg, 0.6 mmol) and KOAc (5.5 g, 56 mmol) in anhydrous dioxane (60 ml) was degassed and heated at about 80° C. overnight. After being cooled to RT, the mixture was poured into ethyl acetate (200 ml) and washed with brine (150 ml). The organic solution was dried over Na$_2$SO$_4$, loaded on silica gel and purified by flash column (hexanes to hexanes/ethyl acetate 30:1) to collect the major fraction. After removal of solvent, the solid was washed with methanol, filtered and dried in air to give a white solid (5.50 g, in 90% yield).

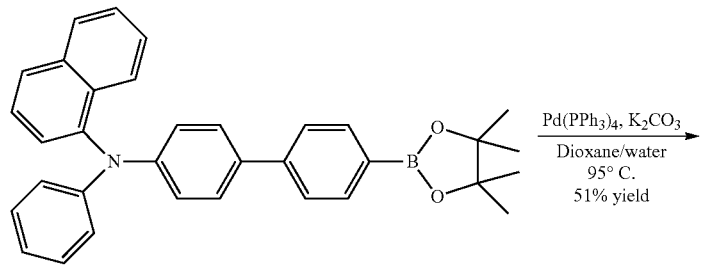

Compound 6

HT-4

A mixture of N-phenyl-N-(4'-(4,4,5,5-tetramethyl-1,3,2-dioxaborolan-2-yl)-[1,1'-biphenyl]-4-yl)naphthalen-1-amine (Compound 6) (4.97 g, 10 mmol), 2,4-dibromomesitylene (1.39 g, 5 mmol), Pd(PPh3)4 (0.578 g, 0.5 mmol) and K$_2$CO$_3$ (4.14 g, 30 mmol) in dioxane/water (100 mL/20 mL), was degassed and heated at about 95° C. for about 48 hours. The resulting mixture was poured in ethyl acetate (300 mL), washed with brine (150 mL), dried over Na$_2$SO$_4$, loaded on silica gel and then purified by flash column (hexanes to hexanes/ethyl acetate 40:1). The main fraction was collected and concentrated, recrystallized in dichloromethane/hexanes to give a white solid (2.2 g, 51% yield). LCMS (APCI): Calcd for C$_{65}$H$_{51}$N$_2$(M+H)=859. Found: 859.

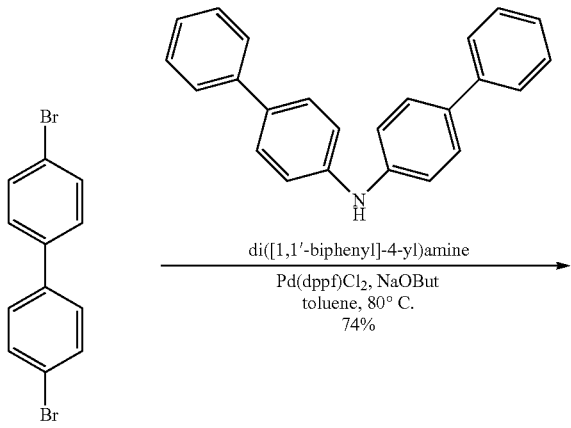

4,4'-dibromo-1,1'-biphenyl

-continued
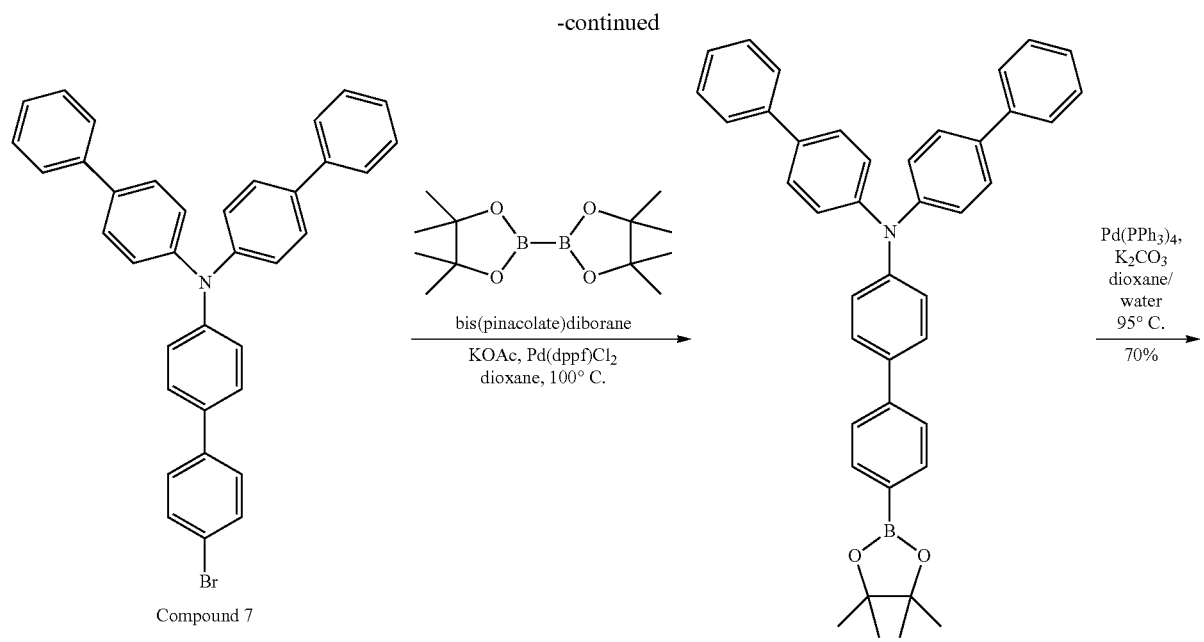
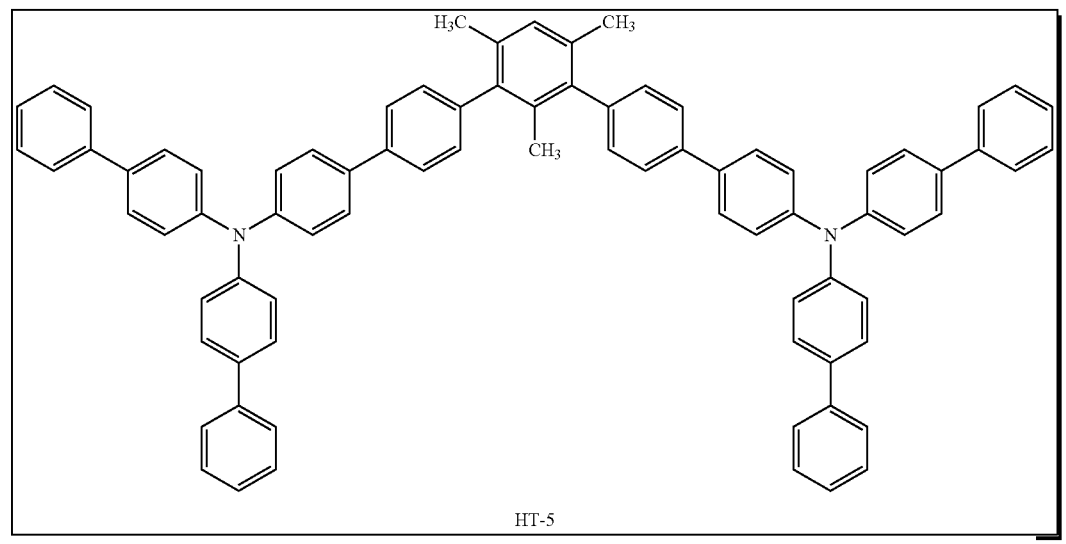
HT-5
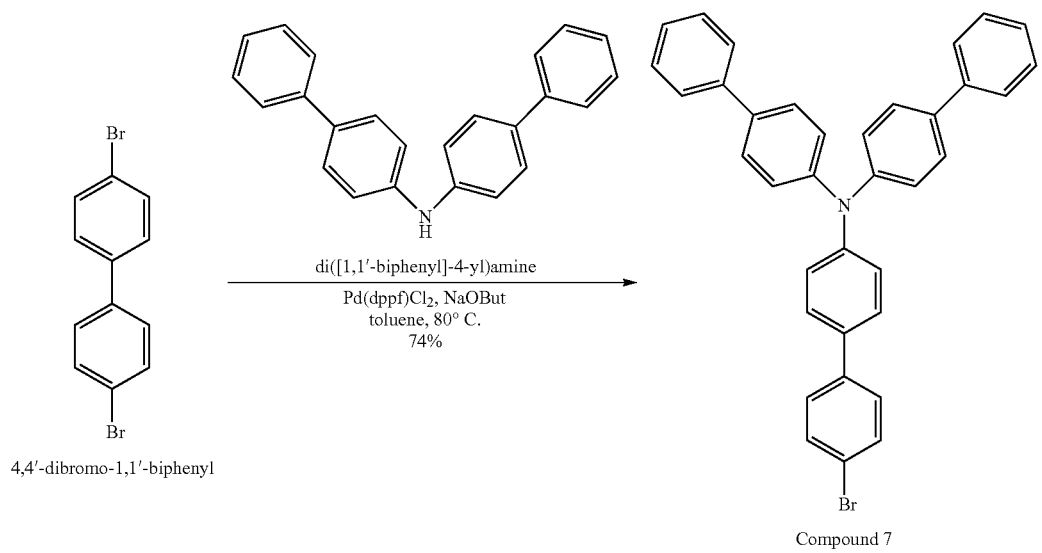

N,N-di([1,1'-biphenyl]-4-yl)-4'-bromo-[1,1'-biphenyl]-4-amine (Compound 7)

A mixture of 4,4'-dibromo-1,1'-biphenyl (9.67 g, 31 mmol), di([1,1'-biphenyl]-4-yl)amine (4.0 g, 12.4 mmol), sodium tert-butoxide (2.98 g, 31 mmol) and Pd(dppf)C$_2$ (0.272 g, 0.37 mmol) in anhydrous toluene (150 mL) was degassed and heated at 80° C. for 25 hours. After cooling to room temperature, the mixture was poured into dichloromethane (300 mL). The solid was filtered off, the filtrate was loaded on silica gel, and purified by flash column (hexanes to hexanes/ethyl acetate 40:1 to dichloromethane). The desired fraction was collected and concentrated, recrystallized in dichloromethane/hexanes to give a yellow solid (Compound 7) (5.07 g, 74% yield).

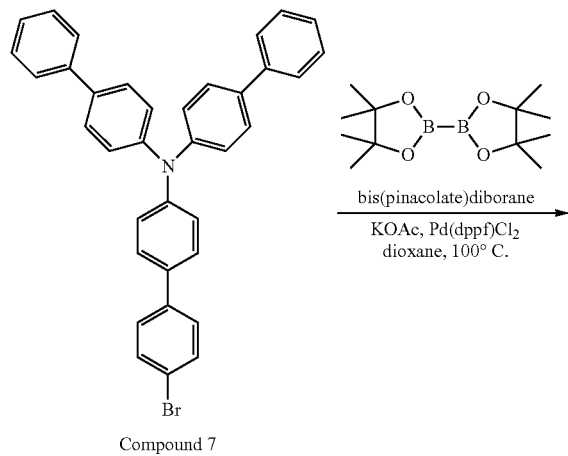

Compound 7

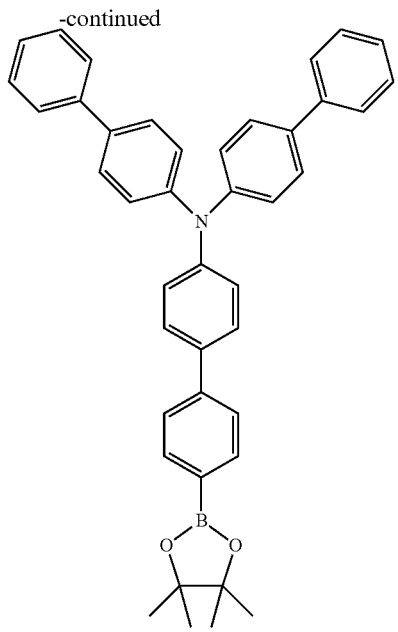

Compound 8

N,N-di([1,1'-biphenyl]-4-yl)-4'-(4,4,5,5-tetramethyl-1,3,2-dioxaborolan-2-yl)-[1,1'-biphenyl]-4-amine (Compound 8)

A mixture of N,N-di([1,1'-biphenyl]-4-yl)-4'-bromo-[1,1'-biphenyl]-4-amine (5.06 g, 9.2 mmol), bis(pinacolate)diborane (2.54 g, 10 mmol), KOAc (5.0 g, 51 mmol) and Pd(dppf)Cl$_2$ (0.366 g, 0.5 mmol) in anhydrous dioxane (110 mL) was degassed and heated at 80° C. overnight. After cooling to room temperature, the mixture was poured into dichloromethane (300 mL), then washed with brine (150 mL), then dried over Na$_2$SO$_4$, then loaded on silica gel and purified by flash column (hexanes to hexanes/ethyl acetate 50:1 to 9:1). The desired fraction was collected and concentrated, reprecipitated in dichloromethane/methanol to give white solid (Compound 8) (4.25 g, 77% yield).

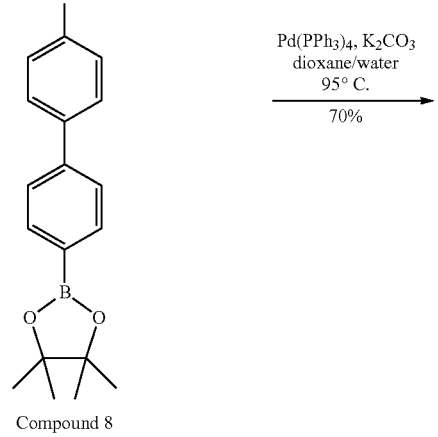

Compound 8

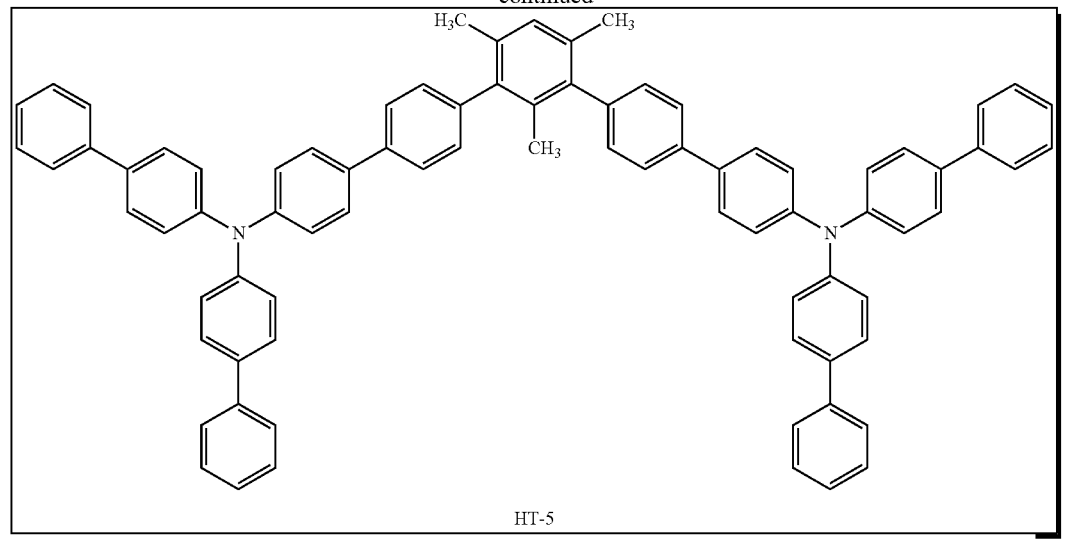

HT-5

A mixture of N,N-di([1,1'-biphenyl]-4-yl)-4'-(4,4,5,5-tetramethyl-1,3,2-dioxaborolan-2-yl)-[1,1'-biphenyl]-4-amine (Compound 8) (2.2 g, 3.67 mmol), 2,4-dibromomesitylene (0.50 g, 1.8 mmol), Pd(PPh$_3$)$_4$ (0.21 g, 0.18 mmol) and K$_2$CO$_3$ (2.0 g, 14.7 mmol) in dioxane/water (50 ml/10 mL) was degassed and heated at 95° C. for 3.5 days. The precipitate was filtered and washed with dioxane/water (25 mL/5 mL), then methanol, dried in air to give a white solid. It was dissolved in dichloromethane, loaded on silica gel and purified by flash column (hexanes to hexanes/dichloromethane 9:1 to 3:2). The main fraction was collected, concentrated, reprecipitated from dichloromethane/hexanes to give a white solid (HT-5) (1.34 g, 70% yield). LCMS (APCI): calcd for C$_{81}$H$_{63}$N$_2$(M+H)=1063. Found: 1063.

Example 1

Cyclic voltammetry (CV) experiments were performed with an μAuto-labII potentiostat (Eco Chemie [Metrohm Autolab B.V., Utrecht, the Netherlands]). All measurements were carried out at room temperature with a conventional three-electrode configuration, e.g., a glassy carbon working electrode, a platinum auxiliary electrode, and a nonaqueous Ag/AgCl reference electrode. A 15 ml 10$^{-4}$M HT-1 from 0.1 M tetrabutylammonium hexafluorophosphate, nBu$_4$PF$_6$ DMF sample solution was prepared at room temperature and prior to measurement, the solution was purged under argon for 5 minutes. Then anodic potential up to 1.6 V (enough potential to contain oxidation potential of HT-1) was applied to this test sample resulting in a test sample oxidation potential voltammogram. Scan rate used was 100 mV/s. About 1.0 mg of ferrocene/ferrocenium was then added to the test sample at the end of each measurement for calibration and the oxidation potential measured again. From these oxidation potential voltammograms, the E$_{1/2}$ values were determined as ½ (E$_p^a$+E$_p^c$), where E$_p^a$ and E$_p^c$ are the anodic and cathodic peak potentials, respectively. HOMO (Highest occupied molecular orbital) energy was calculated by adding the determined shifted E½ value with reference to ferrocene (4.8 eV).

A 10 ml 10$^{-6}$M analyte, e.g., HT-1, chloroform (CHCl$_3$) solution was analyzed with a Cary 50 spectrophotometer (Varian, Inc. [Agilent Technologies, Santa Clara, Calif., USA]). Analyzing an absorption as a function of wavelength plot provided an observed optical onset (eV), providing an estimated Optical band gap value, Eg (Opt). LUMO (lowest unoccupied molecular orbital) energy was determined from the relation, Eg (Opt)=HOMO-LUMO.

Subsequently, the values for HT-2, HT-3, HT-4 and HT-5 were determined in a similar manner to that described immediately above. The results are reported below in Table 1.

TABLE 1

| HTM | HOMO (eV) | LUMO (eV) | Eg (opt) |
|---|---|---|---|
| NPB | −5.2 | −2.2 | 3.02 |
| HT-1 | −5.35 | −1.85 | 3.5 |
| HT-2 | −5.26 | −1.82 | 3.44 |
| HT-3 | −5.23 | −2.03 | 3.2 |
| HT-4 | −5.36 | −2.21 | 3.15 |
| HT-5 | −5.3 | −2.14 | 3.16 |

Example 2

HT-1 (2 mg) was dissolved in 1 mL of 2-methyltetrahydrofuran (2-MeTHF) and then resulting solution was transferred into quartz tube. Then the quartz tube containing HT-1 was frozen (77K) by liquid nitrogen prior to measurement. Triplet (T$_1$) energy was determined from the identified first phosphorescent emission peak wavelength (nm) measured at 77K, using Fluoromax-3 spectrophotometer (Horiba Instruments, Irvine Calif., USA) and then converted into eV (eV=emission peak wavelength (λ)/1240). NPB, HT-2, HT-3, HT-4, HT-5 samples were tested in a similar manner, the results of which are provided below in Table 2.

TABLE 2

| HTM | $T_1$ (eV) |
|---|---|
| NPB | 2.36 |
| HT-1 | 2.9 |
| HT-2 | 2.92 |
| HT-3 | 2.52 |
| HT-4 | 2.38 |
| HT-5 | 2.51 |

Example 3

DSC (differential scanning calorimeter) measurements were carried out on a TA Instruments (New Castle, Del.) differential scanning calorimeter (Q-2000 model) at a heating rate of 10° C./min under a nitrogen atmosphere. An aluminum pan containing HT-1 was put within the DSC instrument for generation of a second cycle DSC curve (Heatflow [mW] vs. temperature [° C.], from which those skilled in the art will be able to determine the glass transition temperature (Tg). NPB, HT-2, HT-3, HT-4, HT-5 samples were tested in a similar manner, the results of which are provided below in Table 3.

TABLE 3

| HTM | Tg (° C.) |
|---|---|
| NPB | 101 |
| HT-1 | 90 |
| HT-2 | 102 |
| HT-3 | 132 |
| HT-4 | 141 |
| HT-5 | 172 |

Example 4

OLED Device Configuration and Performance

A device (Device A) was fabricated in a manner similar to the following. The ITO substrates having sheet resistance of about 14 ohm/sq were cleaned ultrasonically and sequentially in detergent, water, acetone, and then isopropyl alcohol (IPA); and then dried in an oven at 80° C. for about 30 min under an ambient environment. Substrates were then baked at about 200° C. for about 1 hour in an ambient environment, then under UV-ozone treatment for about 30 minutes. PEDOT:PSS (hole-injection material) was then spin-coated on the annealed substrate at about 4000 rpm for about 30 sec. The coated layer was then baked at about 100° C. for 30 min in an ambient environment, followed by baking at 200° C. for 30 min inside a glove box ($N_2$ environment). The baked coated layer/substrate was then transferred into a vacuum chamber, where HT-1 was vacuum deposited at a rate of about 0.1 nm/s rate under a base pressure of about $2 \times 10^{-7}$ torr. HOST-4/YE-1 (6 wt %) was co-deposited as an emissive layer at about 0.01 nm/s and about 0.10 nm/s, respectively, to make the appropriate thickness ratio.

1,3,5-Tris(1-phenyl-1H-benzimidazol-)2-yl)benzene (TPBI) was then deposited at about 0.1 nm/s rate on the emissive layer. A layer of lithium fluoride (LiF) (electron injection material) was deposited at about 0.005 nm/s rate followed by deposition of the cathode as Aluminium (Al) at about 0.3 nm/s rate. The representative device structure was: ITO/PEDOT(40 nm)/HTM(40 nm)/HOST-4:YE-1 (565 nm) (6 wt %) (30 nm)/TPBI(30 nm)/LiF-Al(120 nm). The device was then encapsulated with a getter attached glass cap to cover the emissive area of the OLED device in order to protect from moisture, oxidation or mechanical damage.

Each individual device had an area of about 12 $mm^2$.

A series of devices were prepared with the same structure as Device A except that instead of HT-1, HT-2 (Device B); HT-3 (Device C); HT-4 (Device D); or Comparative Compound NPB were used as the hole-transport material.

The device study with a representative structure as ITO/PEDOT(40 nm)/HTM(40 nm)/HOST-4:YE-1 (565 nm) (6 wt %) (30 nm)/TPBI(30 nm)/LiF-Al(120 nm). Our HTM, HT-3 and HT-4 shows comparable or better lifetime than one of the best commercial HT material, NPB.

Device Performance All spectra were measured with an PR670 spectroradiometer (Photo Research, Inc., Chatsworth, Calif., USA) and I-V-L characteristics were taken with a Keithley 2400 SourceMeter (Keithley Instruments, Inc., Cleveland, Ohio, USA). All device operation was performed inside a nitrogen-filled glove-box.

Devices A, B, C, D, and M, white light emitting devices comprising HT-1. HT-2, HT-3, and HT-4, and Comparative compound NBP, the devices fabricated in accordance with Example 4, were tested to determine the emissive qualities of the device by examining the current density and luminance as a function of the driving voltage. The turn-on voltage for the device was about 2.5 volts. The EQE (external quantum efficiency), luminous efficiency and power efficiency of the device at 1000 $cd/m^2$ is shown in Table 4.

TABLE 4

| HTM | Structure | EQE (%) | CE (cd/A) | PE (lm/W) |
|---|---|---|---|---|
| NPB | | 18.4 | 59.9 | 41.3 |

TABLE 4-continued

| HTM | Structure | EQE (%) | CE (cd/A) | PE (lm/W) |
|---|---|---|---|---|
| HT-3 | | 19.5 | 63.6 | 42.1 |
| HT-4 | | 19.8 | 64.7 | 41.1 |
| HT-1 | | 18 | 57 | 38 |
| HT-2 | | 22 | 71 | 51 |

Thus HT-1. HT-2, HT-3, and HT-4, have demonstrated their effectiveness as hole transporting materials in organic light emitting devices.

Example 5

Devices A, B, C, D and E, light emitting devices comprising hole transporting HT-1, HT-2, HT-3, HT-4 and NPB respectively, and fabricated in accordance with Example 4, were tested to determine the lifetime of the devices ($T_{50}$(h) at 10000 nit). All spectra were measured with an PR670 and I-V-L characteristics were taken with a Keithley 2400 SourceMeter (Keithley Instruments, Inc., Cleveland, Ohio, USA). All device operation was performed inside a nitrogen-filled glove-box without encapsulation.

Based upon about the results obtained for about 200 hours of testing, the projected lifetime of Device B is expected to be about 700 hours. Based upon the results obtained for about 100 hours of testing, the projected lifetime of Device C is expected to be about 1000 hours. Table 5 shows the device lifetime of devices fabricated in accordance with Example 4.

TABLE 5

| Device | T50(h) @ 10000 nit |
| --- | --- |
| Device A | 8 |
| Device B | 14 |
| Device C | 40 |
| Device D | 73 |
| Comparative Device M | 41 |

Thus at least HT-3 and HT-4 have demonstrated their effectiveness as a long lasting compound in light emitting organic light emitting devices.

Example 6

Measuring Charge Mobility

The carrier mobility of an organic thin film can be derived from the space charge limited current in the current-voltage (IV) measurement based on the Mott's steady state SCLC model $$J = \frac{9\varepsilon\varepsilon_0\mu V^2}{8L^3}$$

where $\varepsilon_0$ is the vacuum permittivity, $\varepsilon$ is the relative permittivity of the organic layer, $\mu$ is the carrier mobility of the organic layer, V is the voltage bias and L is the thickness of the organic layer.

To evaluate the electron and hole mobility of an organic layer, single-carrier devices (electron-only and hole-only devices) may be made. Electron-only devices may have Al/organic layer/LiF/Al structure with Al as the anode and LiF/Al as the cathode. The LiF/Al electrode has a low work function (~2.6 eV) which can facilitate the injection of electrons into the lower lying LUMO of the organic layer. By contrast, Al has a relatively lower work function (4.28 eV) than the HOMO (5~6 eV) of the organic layer being investigated, which prevents the hole injection from the anode. Thus, only electrons are injected into the organic layer and the electron mobility may be measured as the only charge carrier in the organic layer.

The hole-only devices may have the ITO/PEDOT/organic layer/Al with ITO as the anode and Al as the cathode. The high work function of PEDOT (5.2-5.4 eV) facilitates hole injection from the anode into the organic layer. By contrast, the work function (4.28 eV) of Al is higher than the LUMO of the organic layer (2~4 eV), which prevents electron injection from the cathode. Thus, only holes are injected into the organic layer, and the hole mobility may be measured as the only charge carrier in the organic layer.

The thickness of the organic layer is kept at 100 nm in both cases.

To measure the space charge limited current, one applies a large voltage scan (0-10 V) on the device to ensure that at a large current limit the device is under SCLC conditions. And then the IV curve is fitted by the SCLC model mentioned above. The carrier mobility can then be derived from the fitting parameters. Electron- and hole-mobility can be derived from the electron-only and hole-only devices for the same organic layer, respectively.

TABLE 6

| HTM | fit | calc |
| --- | --- | --- |
| NPB | $e^{-4}$ | |
| HT-1 | $1.7\ e^{-5}$ | $5.72\ e^{-6}$ |
| HT-2 | $8.0\ e^{-6}$ | $6.81\ e^{-6}$ |
| HT-4 | $1.02\ e^{-4}$ | $3.57\ e^{-5}$ |

Unless otherwise indicated, all numbers expressing quantities of ingredients, properties such as molecular weight, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

The terms "a," "an," "the" and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified thus fulfilling the written description of all Markush groups used in the appended claims.

Certain embodiments are described herein, including the best mode known to the inventors for carrying out the invention. Of course, variations on these described embodiments will become apparent to those of ordinary skill in the art upon reading the foregoing description. The inventor expects skilled artisans to employ such variations as appropriate, and the inventors intend for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A compound represented by a formula:

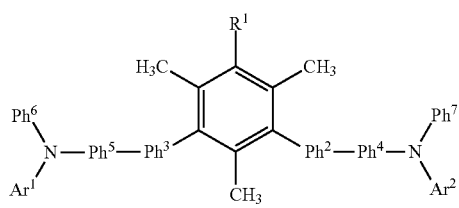

wherein $R^1$ is H, $C_{1-6}$ alkyl, or $Cl_{1-6}$ alkoxy;
Ph² and Ph³ are independently p-phenylene optionally substituted with 1, 2, or 3 substituents;
Ph⁴ and Ph⁵ are p-phenylene optionally substituted with 1, 2, or 3 substituents;
Ph⁶ and Ph⁷ are independently phenyl optionally substituted with 1, 2, 3, or 4 substituents, or biphenyl optionally substituted with 1, 2, 3, 4, 5, or 6 substituents; and
Ar¹ and Ar² are independently phenyl optionally substituted with 1, 2, 3, or 4 substituents, biphenyl optionally substituted with 1, 2, 3, 4, 5, or 6 substituents, or naphthalenyl optionally substituted with 1, 2, 3, 4, or 5 substituents;
wherein the substituents of p-phenylene, phenyl, biphenyl, or naphthalenyl are independently selected from $C_{1-6}$ alkyl and $C_{1-6}$ alkoxy.

2. The compound of claim 1, wherein $R^1$ is H.
3. The compound of claim 1, wherein Ph² is unsubstituted.
4. The compound of claim 1, wherein Ph³ is unsubstituted.

5. The compound of claim 1, wherein Ph⁶ is:

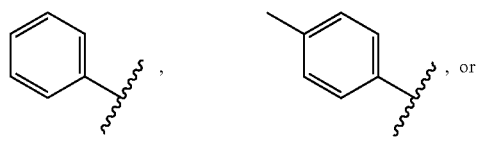

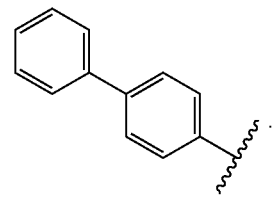

6. The compound of claim 1, wherein Ph⁷ is:

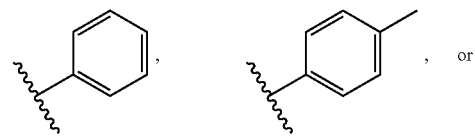

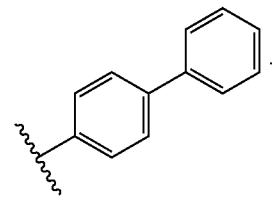

7. The compound of claim 1, wherein Ar² is:

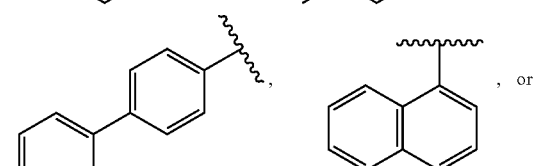

8. The compound of claim 1, wherein Ar² is:

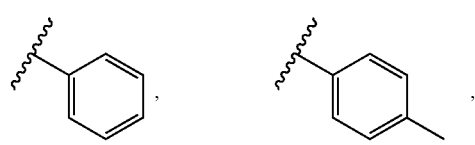

83
-continued

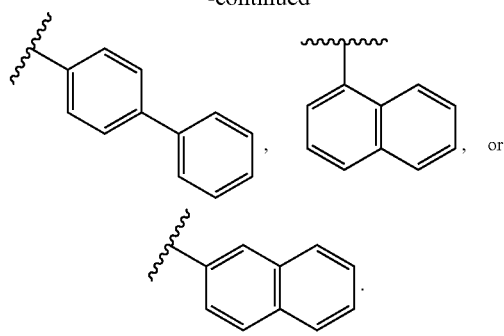
, or

9. The compound of claim 1, selected from:

10. A compound represented by a formula:

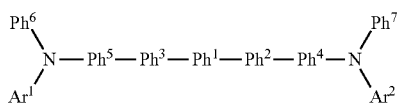

wherein Ph$^1$ is optionally substituted m-phenylene;
Ph$^2$ and Ph$^3$ are independently optionally substituted p-phenylene;
Ph$^4$ and Ph$^5$ are optionally substituted p-phenylene;
Ph$^6$ and Ph$^7$ are independently optionally substituted phenyl or optionally substituted biphenyl; and
Ar$^1$ and Ar$^2$ are independently optionally substituted phenyl, optionally substituted biphenyl, or optionally sub-

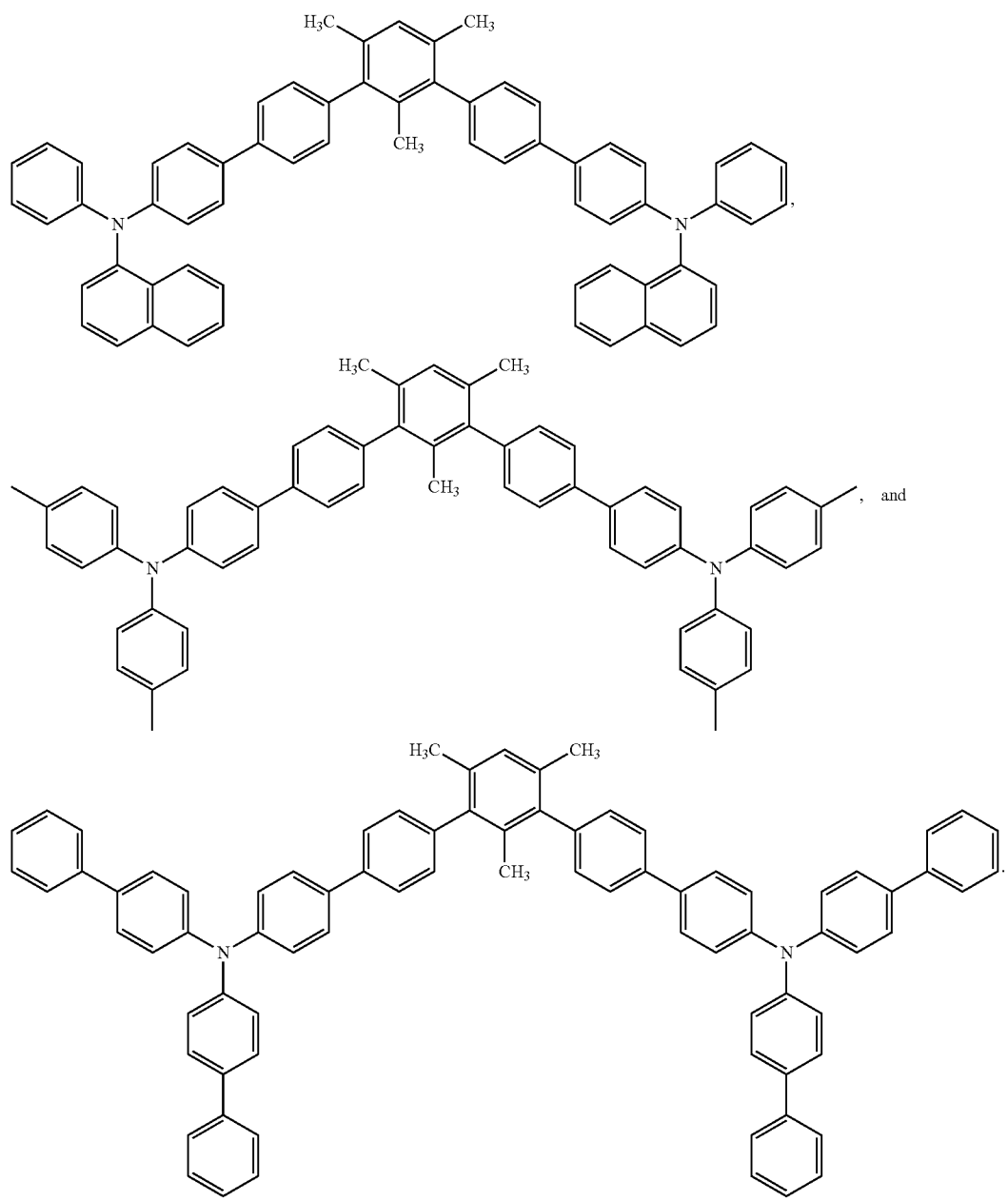

stituted naphthalenyl, wherein the substituents of phenyl, biphenyl, or naphthalenyl are independently selected from $C_{1-6}$ alkyl and $C_{1-6}$ alkoxy.

11. The compound of claim 10, wherein a hole mobility of the compound is greater than an electron mobility of the compound.

12. The compound of claim 10 wherein $Ph^1$ is:

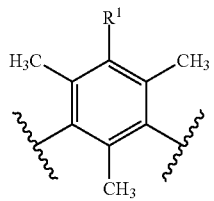

wherein $R^1$ is H, $C_{1-6}$ alkyl, or $C_{1-6}$ alkoxy.

13. The compound of claim 10, wherein $Ph^2$ is unsubstituted.

14. The compound of claim 10, wherein $Ph^3$ is unsubstituted.

15. A light-emitting device comprising a compound according to claim 1.

16. A light-emitting device comprising a compound according to claim 10.

17. A light-emitting device comprising a compound according to claim 2.

18. A light-emitting device comprising a compound according to claim 5.

19. A light-emitting device comprising a compound according to claim 6.

20. A light-emitting device comprising a compound according to claim 7.

21. A light-emitting device comprising a compound according to claim 8.

22. A light-emitting device comprising a compound according to claim 9.

23. A light-emitting device comprising a compound according to claim 11.

24. A light-emitting device comprising a compound according to claim 12.

* * * * *